US012567380B2

(12) United States Patent
Hashikaki

(10) Patent No.: US 12,567,380 B2
(45) Date of Patent: Mar. 3, 2026

(54) DISPLAY DRIVE CIRCUIT AND DISPLAY DEVICE

(71) Applicant: SONY SEMICONDUCTOR SOLUTIONS CORPORATION, Kanagawa (JP)

(72) Inventor: Kouichi Hashikaki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/846,562

(22) PCT Filed: Mar. 15, 2023

(86) PCT No.: PCT/JP2023/010070
§ 371 (c)(1),
(2) Date: Sep. 12, 2024

(87) PCT Pub. No.: WO2023/182100
PCT Pub. Date: Sep. 28, 2023

(65) Prior Publication Data
US 2025/0209995 A1      Jun. 26, 2025

(30) Foreign Application Priority Data

Mar. 24, 2022    (JP) ................................. 2022-049093

(51) Int. Cl.
*G09G 3/3275*        (2016.01)
*H03K 4/06*        (2006.01)
(Continued)

(52) U.S. Cl.
CPC ............. *G09G 3/3275* (2013.01); *H03K 4/06* (2013.01); *H03K 5/24* (2013.01); *G09G 3/3233* (2013.01);
(Continued)

(58) Field of Classification Search
None
See application file for complete search history.

(56) References Cited

U.S. PATENT DOCUMENTS

| | | | |
|---|---|---|---|
| 7,045,993 B1 | 5/2006 | Tomiyoshi | |
| 2022/0406262 A1* | 12/2022 | Toyomura | ............ G09G 3/3266 |
| 2023/0095998 A1* | 3/2023 | Hashikaki | ............ G09G 3/3258 |
| | | | 345/204 |

FOREIGN PATENT DOCUMENTS

| | | |
|---|---|---|
| CN | 102545855 A | 7/2012 |
| JP | 2003-526807 A | 9/2003 |

(Continued)

OTHER PUBLICATIONS

International Search Report and Written Opinion of PCT Application No. PCT/JP2023/010070, issued on May 9, 2023, 08 pages of ISRWO.

*Primary Examiner* — Christopher J Kohlman
(74) *Attorney, Agent, or Firm* — CHIP LAW GROUP

(57)        ABSTRACT

Provided are a display drive circuit and a display device capable of curbing fluctuation of a signal line voltage. A display drive circuit includes a ramp wave voltage generation circuit that generates a ramp wave voltage whose voltage level changes with time, and a signal line voltage generation circuit that holds the voltage level of the ramp wave voltage at a timing corresponding to a signal level of a pixel signal and generates a signal line voltage. The ramp wave voltage generation circuit includes an amplifier that outputs the ramp wave voltage, a load circuit arranged on a feedback path of the amplifier, and a current generation circuit that controls a current flowing through the load circuit such that the ramp wave voltage matches a reference voltage.

20 Claims, 66 Drawing Sheets

(51) Int. Cl.
    *H03K 5/24*           (2006.01)
    *G09G 3/3233*      (2016.01)
    *G09G 3/36*         (2006.01)

(52) U.S. Cl.
    CPC ... *G09G 3/3688* (2013.01); *G09G 2300/0819*
       (2013.01); *G09G 2300/0842* (2013.01); *G09G*
          *2300/0852* (2013.01); *G09G 2310/0291*
        (2013.01); *G09G 2310/0294* (2013.01); *G09G*
           *2310/08* (2013.01); *G09G 2320/0233*
                      (2013.01)

(56)               References Cited

FOREIGN PATENT DOCUMENTS

| | | | |
|---|---|---|---|
| JP | 2011-053644 | A | 3/2011 |
| JP | 2011-139626 | A | 7/2011 |
| JP | 2018-530795 | A | 10/2018 |

* cited by examiner

SYP340749US01

DISPLAY DRIVE CIRCUIT AND DISPLAY DEVICE

CROSS REFERENCE TO RELATED APPLICATIONS

This application is a U.S. National Phase of International Patent Application No. PCT/JP2023/010070 filed on Mar. 15, 2023, which claims priority benefit of Japanese Patent Application No. JP 2022-049093 filed in the Japan Patent Office on Mar. 24, 2022. Each of the above-referenced applications is hereby incorporated herein by reference in its entirety.

TECHNICAL FIELD

The present disclosure relates to a display drive circuit and a display device.

BACKGROUND ART

A driving method for driving a plurality of signal lines using a ramp wave voltage whose voltage level changes with time is known (see Patent Document 1).

In a case where a display panel having a high resolution and a high frame rate is driven, it is necessary to increase the frequency of the ramp wave voltage described above, and power consumption increases. Therefore, in Patent Document 1, a plurality of amplifiers for generating a ramp wave voltage is provided, and the ramp wave voltage is supplied from different amplifiers for an odd line and an even line or an upper half and a lower half of a display panel, thereby reducing the frequency of the ramp wave voltage and reducing power consumption.

CITATION LIST

Patent Document

Patent Document 1: Japanese Translation of PCT International Application Publication No. 2018-530795

SUMMARY OF THE INVENTION

Problems to be Solved by the Invention

When a large number of signal lines are connected to ramp wiring connected to an output node of one amplifier, the write voltage of the signal line may fluctuate due to parasitic capacitance between adjacent signal lines. In addition, in a case where the wiring length of the ramp wiring is long, voltage fluctuation due to wiring resistance occurs on the side close to the amplifier and the side far from the amplifier, and the write voltage of the signal line also fluctuates.

Therefore, the present disclosure provides a display drive circuit and a display device capable of curbing fluctuation of a signal line voltage.

Solutions to Problems

In order to solve the above problem, according to the present disclosure, there is provided a display drive circuit including a ramp wave voltage generation circuit that generates a ramp wave voltage whose voltage level changes with time, and a signal line voltage generation circuit that holds a voltage level of the ramp wave voltage at a timing corresponding to a signal level of a pixel signal and generates a signal line voltage.

The ramp wave voltage generation circuit includes:

an amplifier that outputs the ramp wave voltage;

a load circuit arranged on a feedback path of the amplifier; and a current generation circuit that controls a current flowing through the load circuit according to the ramp wave voltage and a reference voltage.

The display drive circuit may include a comparator that compares the ramp wave voltage with the reference voltage, and a holding unit that holds a comparison result signal of the comparator.

The current generation circuit may control a current flowing through the load circuit on the basis of the comparison result signal.

The display drive circuit may include a first switch that switches whether or not to input the ramp wave voltage to the comparator.

The ramp wave voltage generation circuit may repeatedly generate the ramp wave voltage every first period, the first switch may input the ramp wave voltage to the comparator only during a second period in the first period for every first period, and the holding unit may hold a comparison result signal of the comparator until the next second period is reached.

The display drive circuit may include a pulse generation circuit that generates a comparison pulse signal on the basis of a comparison result signal of the comparator, and a phase comparator that compares phases of the comparison pulse signal and a reference pulse signal to generate a phase comparison signal.

The holding unit may hold the phase comparison signal, and the current generation circuit may control a current flowing through the load circuit on the basis of the phase comparison signal.

The display drive circuit may include a pulse generation circuit that generates a comparison pulse signal on the basis of a comparison result signal of the comparator, and a counter that counts a pulse width of the comparison pulse signal with a reference clock of a predetermined frequency.

The holding unit holds a count value of the counter, and the current generation circuit controls a current flowing through the load circuit according to the number of the reference clocks held in the holding unit.

The display drive circuit may include a successive approximation AD converter that converts a comparison result signal of the comparator into a digital signal, and a DA converter that converts the digital signal into an analog signal for current control of the current generation circuit.

The current generation circuit may include a charge pump that performs stepwise switching control of a current flowing through the load circuit on the basis of a comparison result signal of the comparator.

The ramp wave voltage generation circuit may repeatedly generate the ramp wave voltage every first period, and a current from the current generation circuit may be supplied to the load circuit only in a part of the first period in every first period.

The display drive circuit may include a second switch that is arranged between an output node of the current generation circuit and the feedback path and switches whether or not a current from the current generation circuit flows to the load circuit.

The amplifier may include a differential amplifier including a first input node to which the reference voltage is input, a second input node to which a feedback voltage is input via the load circuit, and an output node that outputs the ramp wave voltage at a voltage level according to a voltage difference between the reference voltage and the feedback voltage, and the load circuit may be connected between the second input node and the output node.

The display drive circuit may include a third switch that is connected in parallel to the load circuit and switches whether to electrically short or shut off the second input node and the output node.

The ramp wave voltage generation circuit may generate, for every first period, the ramp wave voltage whose voltage level decreases with time, the ramp wave voltage whose voltage level increases with time, the ramp wave voltage whose voltage level increases with time and then decreases, or the ramp wave voltage whose voltage level decreases with time and then increases.

The current generation circuit may include a variable current source that controls a current flowing through the load circuit on the basis of a control signal.

The load circuit may include at least one of a resistive element, a capacitor, and a diode.

The ramp wave voltage generation circuit may generate the ramp wave voltage whose voltage level changes linearly or non-linearly with time.

The ramp wave voltage generation circuit may generate the ramp wave voltage for every one horizontal line period or for every plurality of consecutive horizontal line periods of a display unit.

The ramp wave voltage generation circuit may generate the ramp wave voltage after performing offset correction of the amplifier.

According to the present disclosure, there is provided a display device including a display unit having a plurality of pixels arranged in a first direction and a second direction, and a plurality of signal lines arranged at predetermined intervals in the first direction and configured to supply a signal line voltage to two or more pixels arranged in the second direction, and a signal line drive circuit that drives the plurality of signal lines, in which:

the signal line drive circuit includes a ramp wave voltage generation circuit that generates a ramp wave voltage whose voltage level changes with time, and a signal line voltage generation circuit that holds a voltage level of the ramp wave voltage at a timing corresponding to a signal level of a pixel signal and generates a signal line voltage; and the ramp wave voltage generation circuit includes an amplifier that outputs the ramp wave voltage, a load circuit arranged on a feedback path of the amplifier, and a current generation circuit that controls a current flowing through the load circuit according to the ramp wave voltage and a reference voltage.

The ramp wave voltage generation circuit and the signal line voltage generation circuit may be provided in units of two or more signal lines arranged in the first direction.

The display unit may include a liquid crystal display unit or an organic electro luminescence (EL).

BRIEF DESCRIPTION OF DRAWINGS

FIG. 1 is a block diagram illustrating an overall configuration of a display device according to the present disclosure.

FIG. 7 is a block diagram illustrating a configuration of a main part of a display drive circuit according to a first embodiment.

FIG. 12 is a block diagram illustrating a configuration of a main part of a display drive circuit according to a second embodiment.

FIG. 14 is a block diagram illustrating a configuration of a main part of a display drive circuit according to a fourth embodiment.

FIG. 20 is a block diagram illustrating a configuration of a main part of a display drive circuit according to a seventh embodiment.

FIG. 24 is a block diagram illustrating a configuration of a main part of a display drive circuit according to a ninth embodiment.

FIG. 28 is a block diagram illustrating a configuration of a main part of a display drive circuit according to an eleventh embodiment.

FIG. 32 is a block diagram illustrating a configuration of a main part of a display drive circuit according to a thirteenth embodiment.

FIG. 35 is a block diagram illustrating a configuration of a main part of a display drive circuit according to a first modification of FIG. 33.

FIG. 38 is an operation timing diagram of the display drive circuit of FIG. 37.

FIG. 41 is a block diagram illustrating a configuration of a main part of a display drive circuit according to a fourth modification of FIG. 33.

FIG. 42 is an operation timing diagram of the display drive circuit of FIG. 41.

FIG. 43 is a block diagram illustrating a configuration of a main part of a display drive circuit according to a fifth modification of FIG. 33.

FIG. 45 is a diagram illustrating a characteristic part of a display drive circuit according to a fifteenth embodiment.

FIG. 46 is a diagram illustrating a characteristic part of a display drive circuit according to a first modification of FIG. 45.

FIG. 47 is a diagram illustrating a characteristic part of a display drive circuit according to a second modification of FIG. 45.

FIG. 48 is a diagram illustrating a characteristic part of a display drive circuit according to a third modification of FIG. 45.

FIG. 50 is a diagram illustrating a characteristic part of a display drive circuit according to a fifth modification of FIG. 45.

FIG. 51 is a diagram illustrating a characteristic part of a display drive circuit according to a sixth modification of FIG. 45.

FIG. 52 is a block diagram illustrating a schematic configuration of a display device including a display drive circuit according to a sixteenth embodiment.

MODE FOR CARRYING OUT THE INVENTION

Figure 2:
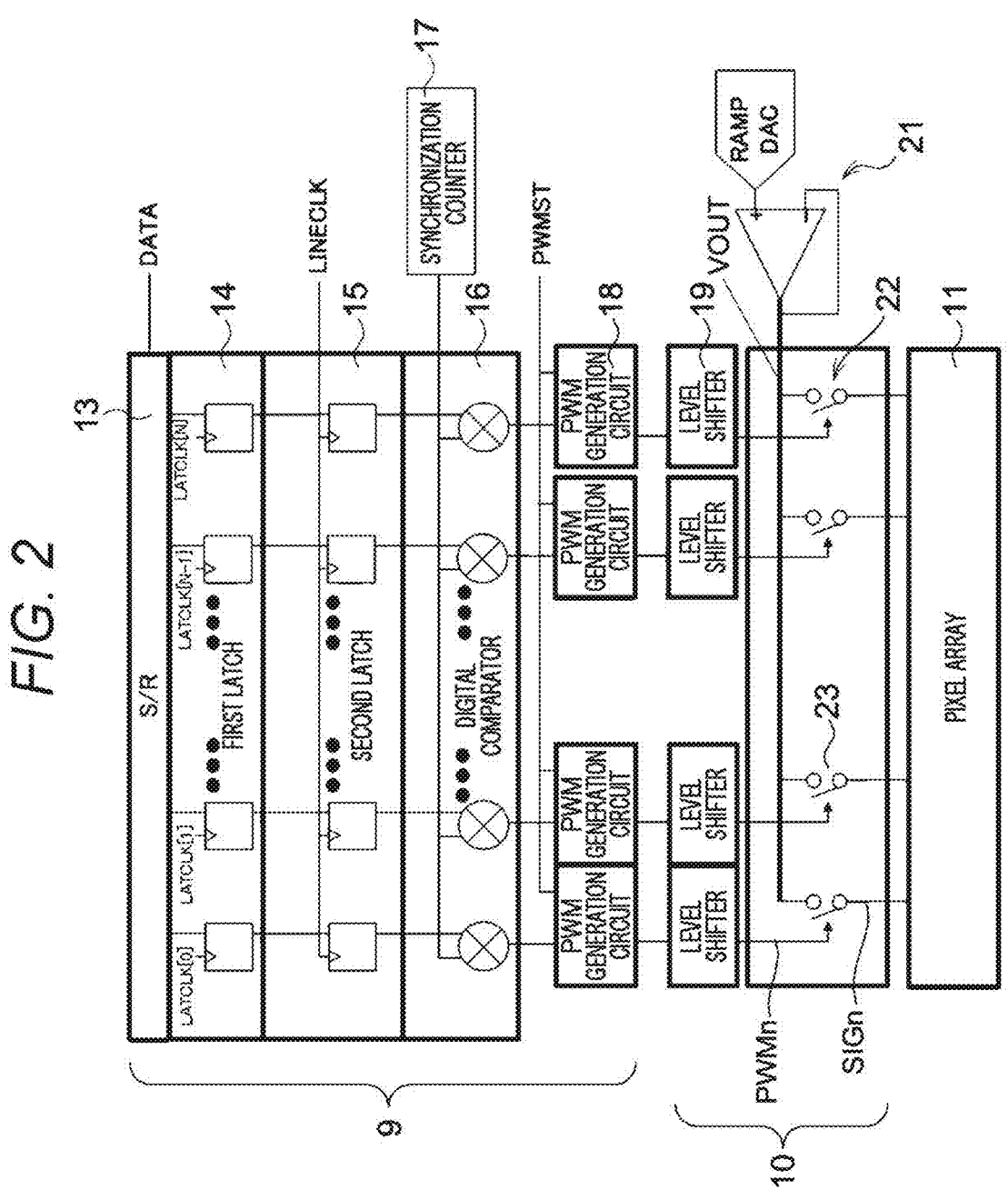
FIG. 2 is a block diagram illustrating an example of an internal configuration of a horizontal logic circuit and a horizontal analog circuit.

Hereinafter, embodiments of a display drive circuit and a display device will be described with reference to the drawings. Although main components of the display drive circuit and the display device will be mainly described below, the display drive circuit and the display device may have components and functions that are not illustrated or described. The following description does not exclude components and functions that are not illustrated or described.

Figure 1:
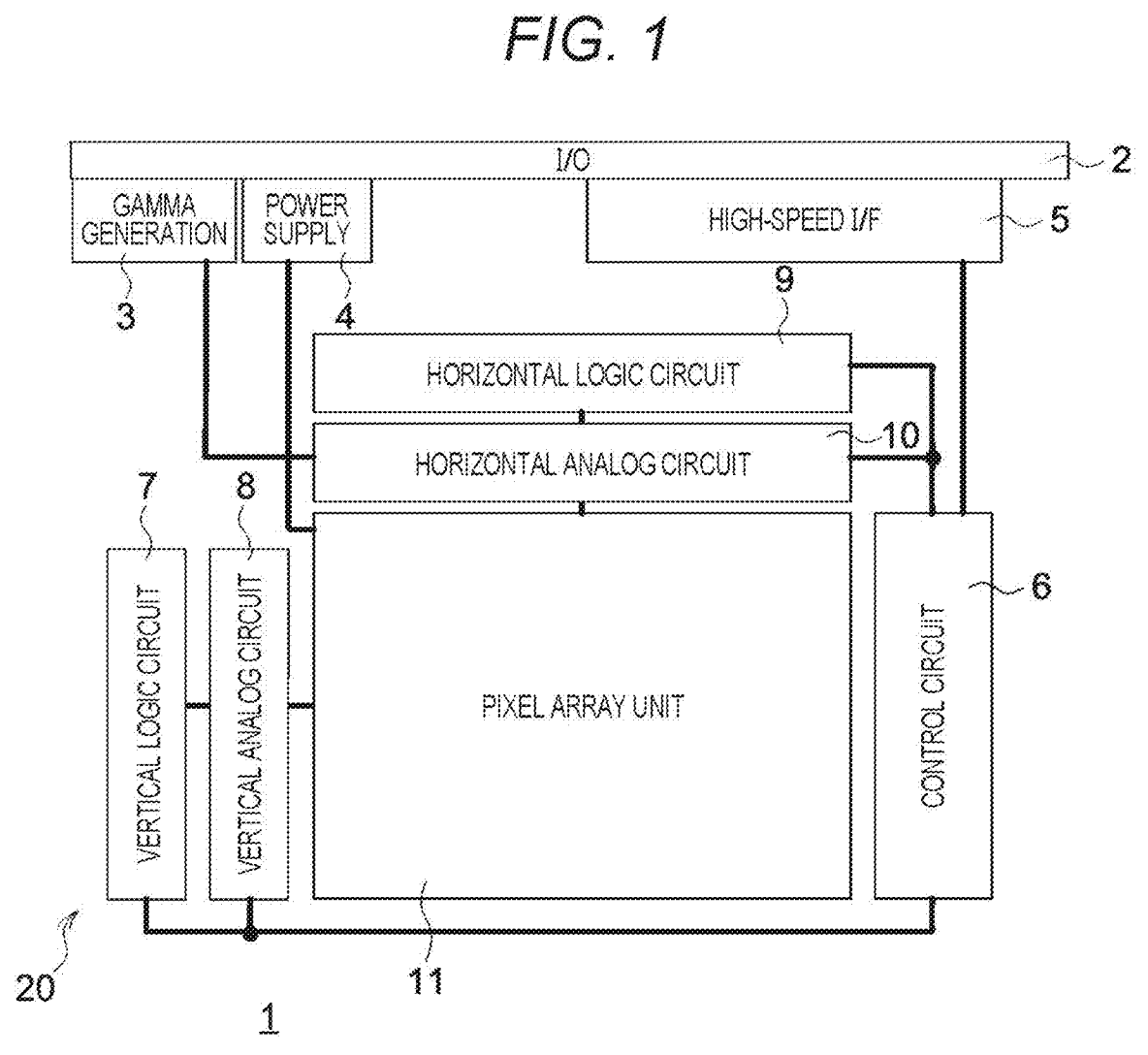

FIG. 1 is a block diagram illustrating an overall configuration of a display device 1 according to the present disclosure. The display device 1 of FIG. 1 illustrates an overall configuration of a micro organic light emitting display (OLED), for example. Note that as described later, the display device 1 according to the present disclosure is not necessarily limited to the micro OLED, and can be applied to various display devices 1 such as a liquid crystal display device.

The display device 1 of FIG. 1 includes an input/output interface unit (I/O) 2, a gamma generation circuit 3, a power supply circuit 4, a high-speed interface unit (high-speed I/F) 5, a control circuit 6, a vertical logic circuit 7, a vertical analog circuit 8, a horizontal logic circuit 9, a horizontal analog circuit 10, and a pixel array unit 11.

In the display device 1 of FIG. 1, at least the horizontal analog circuit 10 forms a display drive circuit 20. The display drive circuit 20 according to the present disclosure includes at least a part of a configuration including the horizontal analog circuit 10 other than the pixel array unit 11 in the display device 1 of FIG. 1.

The input/output interface unit 2 inputs and outputs pixel data, various control signals, and the like. The gamma generation circuit 3 generates a gamma voltage for correcting the signal line voltage in the pixel array unit 11. The gamma generation circuit 3 is not an essential component, and may be omitted.

The high-speed interface unit 5 inputs and outputs a control signal or the like that needs to be input and output at a high speed among signals input and output by the input/output interface unit 2.

The control circuit 6 generates various control signals for controlling each unit in the display device 1. Furthermore, the control circuit 6 controls the timing of driving each pixel in the pixel array unit 11.

The vertical logic circuit 7 performs control for driving a plurality of scanning lines arranged at regular intervals in the vertical direction (second direction) in the pixel array unit 11 on the basis of a control signal from the control circuit 6. The vertical logic circuit 7 includes a digital circuit such as a logic gate and a flip-flop.

The vertical analog circuit 8 drives the plurality of scanning lines in synchronization with the signal output from the vertical logic circuit 7. The vertical analog circuit 8 includes an analog circuit such as a transistor.

The horizontal logic circuit 9 performs control for driving a plurality of signal lines arranged at regular intervals in the horizontal direction (first direction) in the pixel array unit 11 on the basis of a control signal from the control circuit 6. The horizontal logic circuit 9 includes a digital circuit such as a logic gate and a flip-flop.

The horizontal analog circuit 10 drives the plurality of signal lines in synchronization with the signal output from the horizontal logic circuit 9. The horizontal analog circuit 10 includes an analog circuit such as a transistor.

The pixel array unit 11 includes a plurality of scanning lines arranged at regular intervals in the vertical direction, a plurality of signal lines arranged at regular intervals in the horizontal direction, and a plurality of pixels arranged at positions where the plurality of scanning lines and the plurality of signal lines intersect.

FIG. 2 is a block diagram illustrating an example of an internal configuration of the horizontal logic circuit 9 and the horizontal analog circuit 10. The horizontal logic circuit 9 includes a shift register (S/R) 13, a plurality of first latches (first latches) 14, a plurality of second latches (second latches) 15, a plurality of digital comparators 16, and a plurality of PWM generation circuits 18. The first latch 14, the second latch 15, the digital comparator 16, and the PWM generation circuit 18 are provided for each signal line.

The shift register 13 sequentially shifts the video data input from the outside for each pixel and outputs the shifted video data. The plurality of first latches 14 sequentially holds the pixel data output from the shift register 13. The plurality of second latches 15 simultaneously holds the pixel data at the timing when the plurality of first latches 14 holds the corresponding pixel data.

The plurality of digital comparators 16 compares whether or not the data held by the plurality of second latches 15 matches the count value of a synchronization counter 17, and outputs a signal indicating the comparison result.

The plurality of PWM generation circuits 18 starts to generate a pulse signal with the PWMST signal and generates a PWM signal having a pulse width until a match is detected by the corresponding digital comparator 16.

The horizontal analog circuit 10 includes a plurality of level shifters 19, a ramp drive circuit 21, and a signal line voltage generation circuit 22.

The plurality of level shifters 19 converts voltage levels of the plurality of PWM signals.

The ramp drive circuit 21 generates a ramp wave voltage whose voltage level changes with time. The ramp drive circuit 21 is a characteristic part of the display device 1 according to the present disclosure, and will be described in detail later.

The signal line voltage generation circuit 22 holds the voltage level of the ramp wave voltage at timing corresponding to the signal level of the pixel signal to generate a signal line voltage. More specifically, the signal line voltage generation circuit 22 holds the voltage level of the ramp wave voltage at the falling timing of the PWM signal.

The signal line voltage generation circuit 22 includes a plurality of PWM switches 23 connected to a plurality of signal lines. One end of each PWM switch 23 is connected to a corresponding signal line, and a ramp wave voltage is input to the other end of each PWM switch 23. Each PWM switch 23 is turned on when the corresponding PWM signal is at the high level, and is turned off when the corresponding PWM signal is at the low level.

Figure 3:
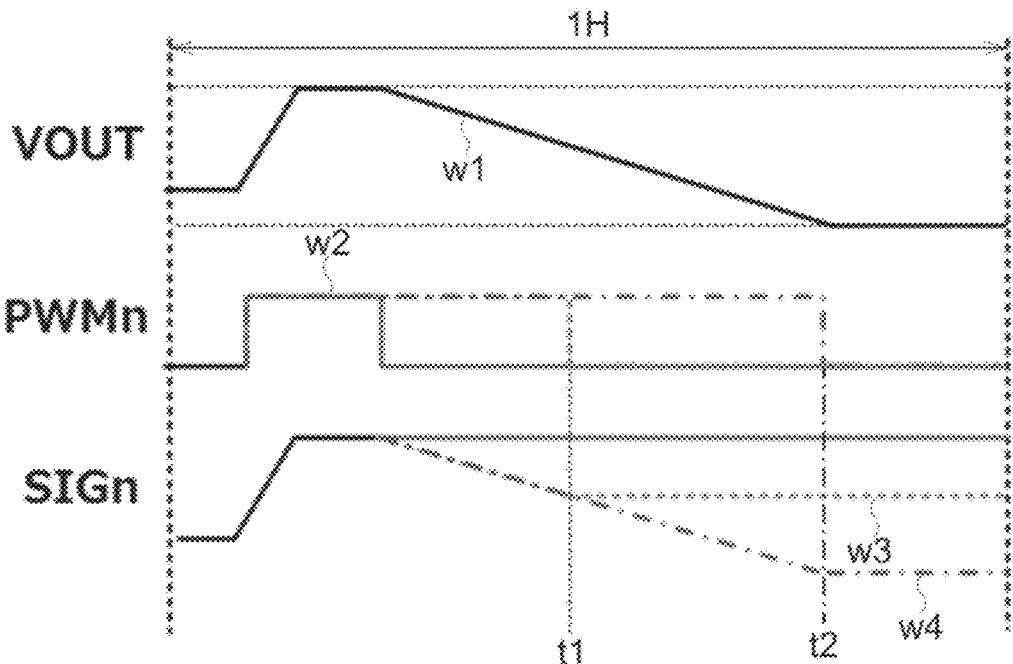
FIG. 3 is a voltage waveform diagram of a ramp wave voltage, a PWM signal, and a signal line voltage.

FIG. 3 is a voltage waveform diagram of a ramp wave voltage, a PWM signal, and a signal line voltage. As illustrated in FIG. 3, a ramp wave voltage w1 is a voltage signal whose voltage level changes linearly for each horizontal (1H) line. In the ramp wave voltage w1 of FIG. 3, the voltage level linearly decreases for each horizontal line. However, as described later, a ramp wave voltage in which the voltage level linearly increases, a ramp wave voltage having a triangular wave shape, a ramp wave voltage in which the voltage level changes non-linearly, and the like are also applicable.

Each PWM switch 23 in the signal line voltage generation circuit 22 is turned on while the corresponding PWM signal is at the high level, and supplies the ramp wave voltage to the corresponding signal line. Each PWM switch 23 is turned off at timing t1 or t2 when the PWM signal transitions to a low level, and the corresponding signal line holds the voltage level of the ramp wave voltage at that timing, which becomes the signal line voltage w3 or w4.

Figure 4:
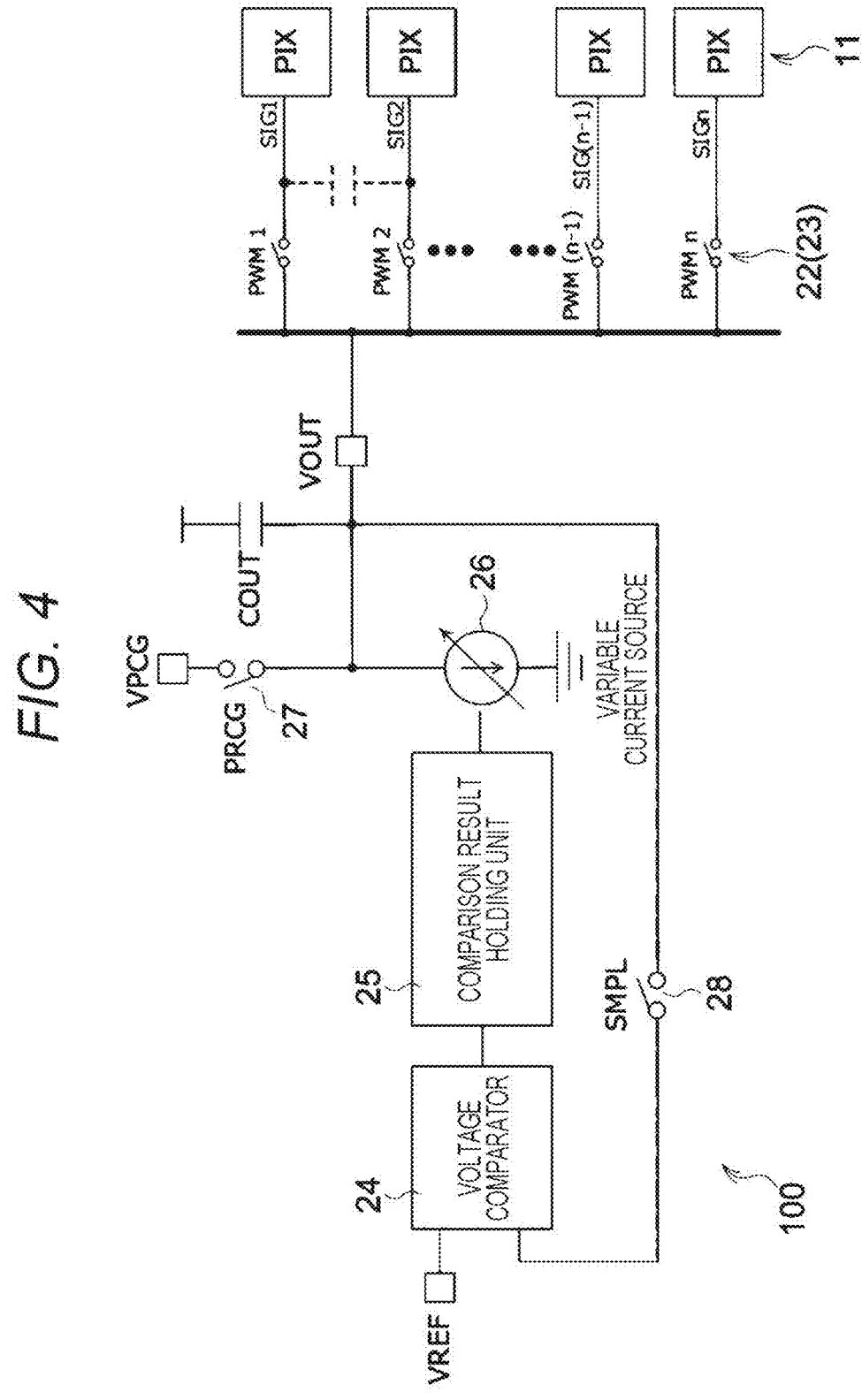
FIG. 4 is a block diagram of a ramp drive circuit according to a comparative example.

FIG. 4 is a block diagram of a ramp drive circuit 100 according to a comparative example. The ramp drive circuit 100 of FIG. 4 includes a voltage comparator 24, a comparison result holding unit 25, a variable current source 26, a precharge (PRCG) switch 27, and a sample (SMPL) switch 28. An output capacitance COUT is connected to an output node of the ramp drive circuit 100.

The precharge switch 27 is turned on for a predetermined period in accordance with the start timing of one horizontal line, and the output node of the ramp drive circuit 100 is initially set to the precharge voltage.

The voltage comparator 24 compares the reference voltage with the ramp wave voltage, and outputs a comparison result signal corresponding to the voltage difference. The comparison result holding unit 25 holds the comparison result signal output from the voltage comparator 24. The variable current source 26 controls the current flowing from the ramp drive circuit 100 to the signal line voltage generation circuit 22 according to the comparison result signal held in the comparison result holding unit 25.

The coupling capacitance between adjacent signal lines changes depending on the write voltage of the signal lines or the like. Since the output impedance of the variable current source 26 in the ramp drive circuit 100 of FIG. 4 is high, the write voltage of the signal line cannot be corrected even if the coupling capacitance of the adjacent signal line changes. Therefore, the signal line voltage does not necessarily reach a desired voltage level, and the display quality may deteriorate.

In addition, in the ramp drive circuit 100 of FIG. 4, when the number of signal lines for supplying the ramp wave voltage increases or the wiring length for transmitting the ramp wave voltage increases, the signal line voltage may be different between the signal line on the side near the ramp drive circuit 100 and the signal line on the side far from the ramp drive circuit 100 due to the wiring resistance.

Figure 5:
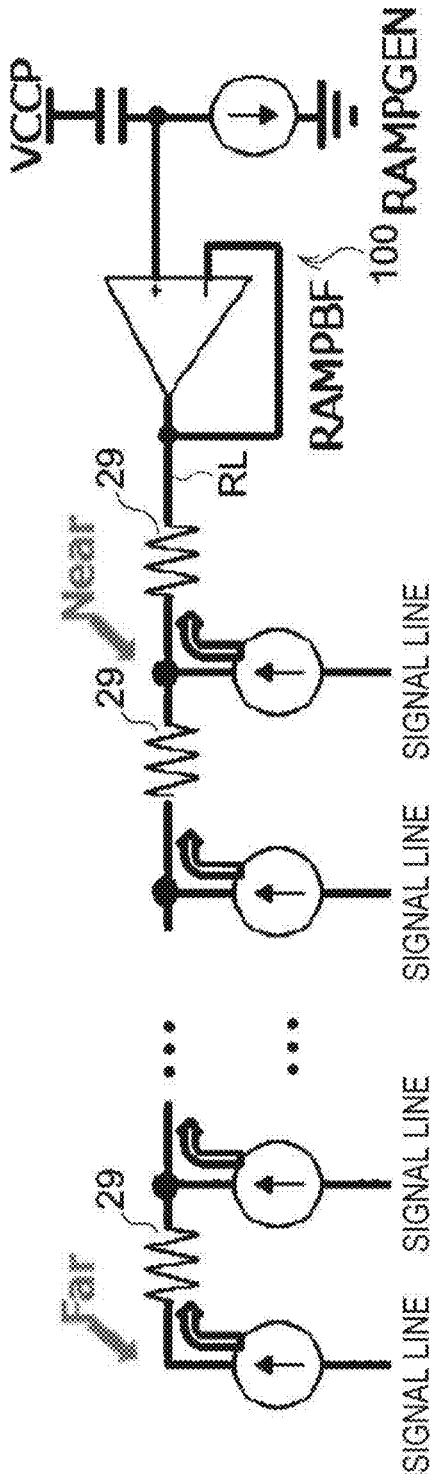
FIG. 5 is a diagram schematically illustrating a wiring resistance of wiring connected to an output node of a ramp drive circuit.

FIG. 5 is a diagram schematically illustrating a wiring resistance 29 of wiring (hereinafter referred to as ramp wiring RL) connected to an output node of the ramp drive circuit 100. As illustrated in the drawing, the wiring resistance 29 exists between two connection nodes of two adjacent signal lines and the ramp wiring RL. Therefore, the plurality of wiring resistances 29 is connected in series on the ramp wiring RL, and a voltage drop occurs due to these wiring resistances 29, so that the signal line voltage on the side far from the ramp drive circuit 100 is lower than the signal line voltage on the side near the ramp drive circuit 100.

Figure 6:
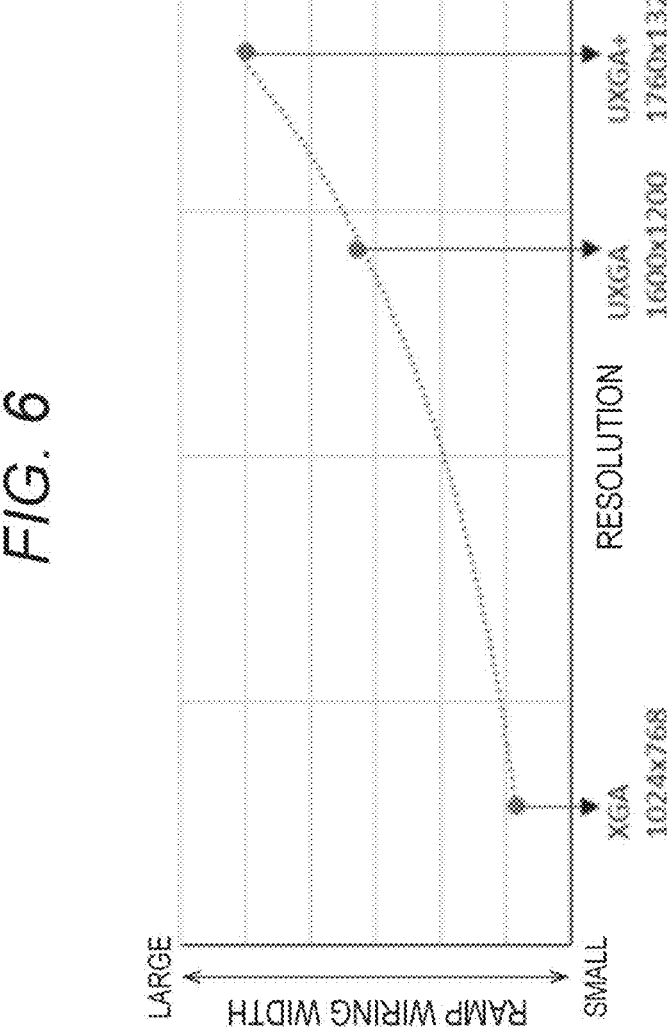
FIG. 6 is a diagram illustrating a relationship between the number of signal lines of a pixel array unit, that is, the display resolution, and the width of ramp wiring.

In order to reduce the wiring resistance 29 on the ramp wiring RL, it is conceivable to thicken the ramp wiring RL. FIG. 6 is a diagram illustrating a relationship between the number of signal lines of the pixel array unit 11, that is, the display resolution, and the width of the ramp wiring RL. As illustrated in the drawing, it is necessary to increase the width of the ramp wiring RL as the display resolution increases. When the width of the ramp wiring RL is increased, the peripheral circuit region increases.

An object of the display drive circuit 20 according to the present disclosure is to solve the problem described above.

First Embodiment

Figure 7:
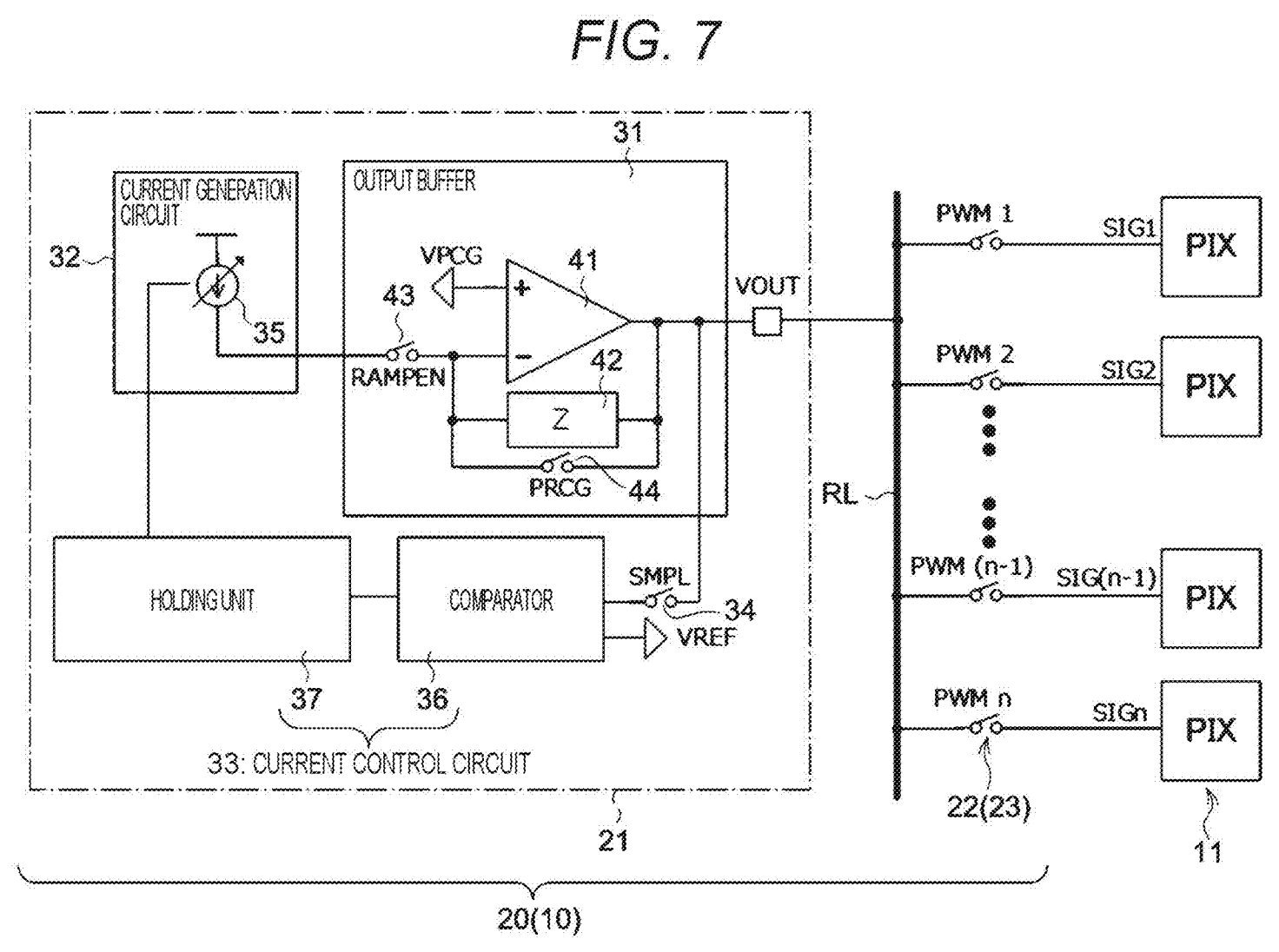

FIG. 7 is a block diagram illustrating a configuration of a main part of a display drive circuit 20 according to a first embodiment. The display drive circuit 20 of FIG. 7 includes at least the horizontal analog circuit 10 of FIG. 1. More specifically, the horizontal analog circuit 10 of FIG. 7 includes a ramp drive circuit 21 and a signal line voltage generation circuit 22.

The ramp drive circuit 21 includes an output buffer 31, a current generation circuit 32, a current control circuit 33, and an SMPL switch 34.

The output buffer 31 generates and outputs a ramp wave voltage. Ramp wiring RL is connected to an output node of the output buffer 31, and the PWM switch 23 forming the signal line voltage generation circuit 22 is connected to the ramp wiring RL.

The output buffer 31 includes an amplifier 41, a load circuit 42, a RAMPEN switch 43, and a PRCG switch 44.

The amplifier 41 compares the ramp wave voltage with a precharge voltage (reference voltage) VPCG, and outputs a ramp wave voltage that is a comparison result signal. The amplifier 41 includes a differential amplifier having a first input node to which the precharge voltage VPCG is supplied, a second input node to which a feedback voltage (ramp wave voltage) is supplied via the load circuit 42, and an output node that outputs a ramp wave voltage at a voltage level corresponding to the voltage difference between the reference voltage and the feedback voltage (ramp wave voltage).

The load circuit 42 is arranged on a feedback path of the amplifier 41. More specifically, the load circuit 42 is connected between the second input node and the output node. As described later, the load circuit 42 includes at least one of a resistive element, a capacitor, and a diode.

The RAMPEN switch 43 is turned on and off on the basis of the logic of the RAMPEN signal. The RAMPEN switch 43 is connected between the output node of the current generation circuit 32 and the second input node of the amplifier 41. When the RAMPEN switch 43 is turned on, the current output from the current generation circuit 32 flows to the load circuit 42, and the voltage level of the ramp voltage decreases. When the RAMPEN switch 43 is turned off, current does not flow from the current generation circuit 32 to the load circuit 42, and the voltage level of the ramp wave voltage is maintained.

The current generation circuit 32 includes, for example, a variable current source 35. The variable current source 35 controls the current flowing to the load circuit 42 on the basis of the comparison result signal output from the current control circuit 33. One end of the variable current source 35 is connected to the power supply voltage node, and the other end is connected to one end of the RAMPEN switch 43 in the output buffer 31. When the RAMPEN switch 43 is turned on, the current from the variable current source 35 flows to the load circuit 42 via the RAMPEN switch 43, and the ramp wave voltage that is the output voltage of the output buffer 31 decreases with time.

The PRCG switch 44 is turned on and off on the basis of the logic of the precharge (PRCG) signal. The PRCG switch 44 is connected in parallel to the load circuit 42. The PRCG switch 44 is turned on in a predetermined period immediately after the start of one horizontal line period, and short-circuits both ends of the load circuit 42, that is, the second node and the output node of the amplifier 41.

The current control circuit 33 controls the current generated by the current generation circuit 32 on the basis of the voltage difference between the ramp wave voltage and a reference voltage VREF. The current control circuit 33 includes a comparator 36 and a holding unit 37. The comparator 36 compares the ramp wave voltage with the reference voltage VREF and outputs a comparison result signal. The holding unit 37 holds the comparison result signal output from the comparator 36. As described above, the current generation circuit 32 controls the current flowing through load circuit 42 according to the ramp wave voltage and the reference voltage.

The SMPL switch 34 is connected between the output buffer 31 and the comparator 36. The SMPL switch 34 is turned on and off on the basis of the logic of the SMPL signal. The SMPL switch 34 is turned on for a predetermined period after the PWM signal transitions from the high level to the low level within one horizontal line period. When the SMPL switch 34 is turned on, the ramp wave voltage output from the output buffer 31 is input to the comparator 36 via the SMPL switch 34. The comparator 36 compares the ramp wave voltage with the reference voltage VREF only during a period in which the SMPL switch 34 is on, and outputs a comparison result signal. While the SMPL switch 34 is off, the holding unit 37 keeps holding the comparison result signal output from the comparator 36 when the SMPL switch 34 is turned on immediately before.

The current generation circuit 32 controls the current flowing to the load circuit 42 in the output buffer 31 on the basis of the comparison result signal held by the holding unit 37. As described above, the current generated by the current generation circuit 32 is supplied to load circuit 42 only while the RAMPEN switch 43 is on.

Figure 8:
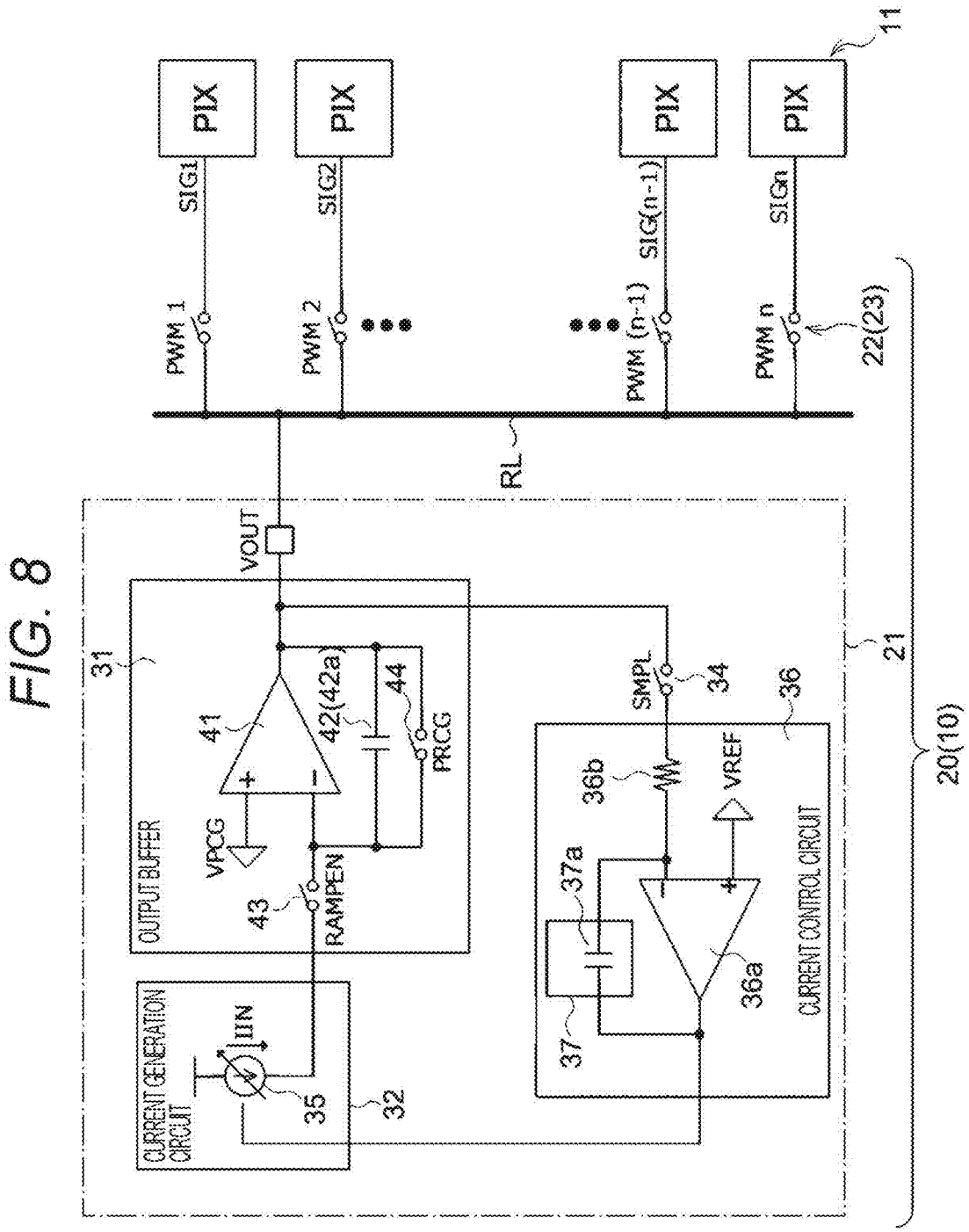
FIG. 8 is a block diagram illustrating a more specific internal configuration of the display drive circuit of FIG. 7.

FIG. 8 is a block diagram illustrating a more specific internal configuration of the display drive circuit 20 of FIG. 7. The display drive circuit 20 of FIG. 8 is a more specific internal configuration of the current control circuit 33 including the comparator 36 and the holding unit 37 of FIG. 7. In addition, in the display drive circuit 20 of FIG. 8, an example is illustrated in which the load circuit 42 in the output buffer 31 includes a capacitor 42a.

The comparator 36 of FIG. 8 includes a differential amplifier 36a and a resistive element 36b. The differential amplifier 36a includes a first input node to which a ramp wave voltage is input via the SMPL switch 34 and the resistive element 36b, a second input node to which the reference voltage VREF is input, and an output node that outputs a comparison result signal.

A capacitor 37a functioning as the holding unit 37 is connected between the first input node and the output node of the differential amplifier 36a of FIG. 8. The differential amplifier 36a outputs a comparison result signal corresponding to the voltage difference between the ramp wave voltage and the reference voltage VREF from the output node when the SMPL switch 34 is on. The holding unit 37 holds the comparison result signal in the capacitor during a period in which the SMPL switch 34 is off.

Figure 9:
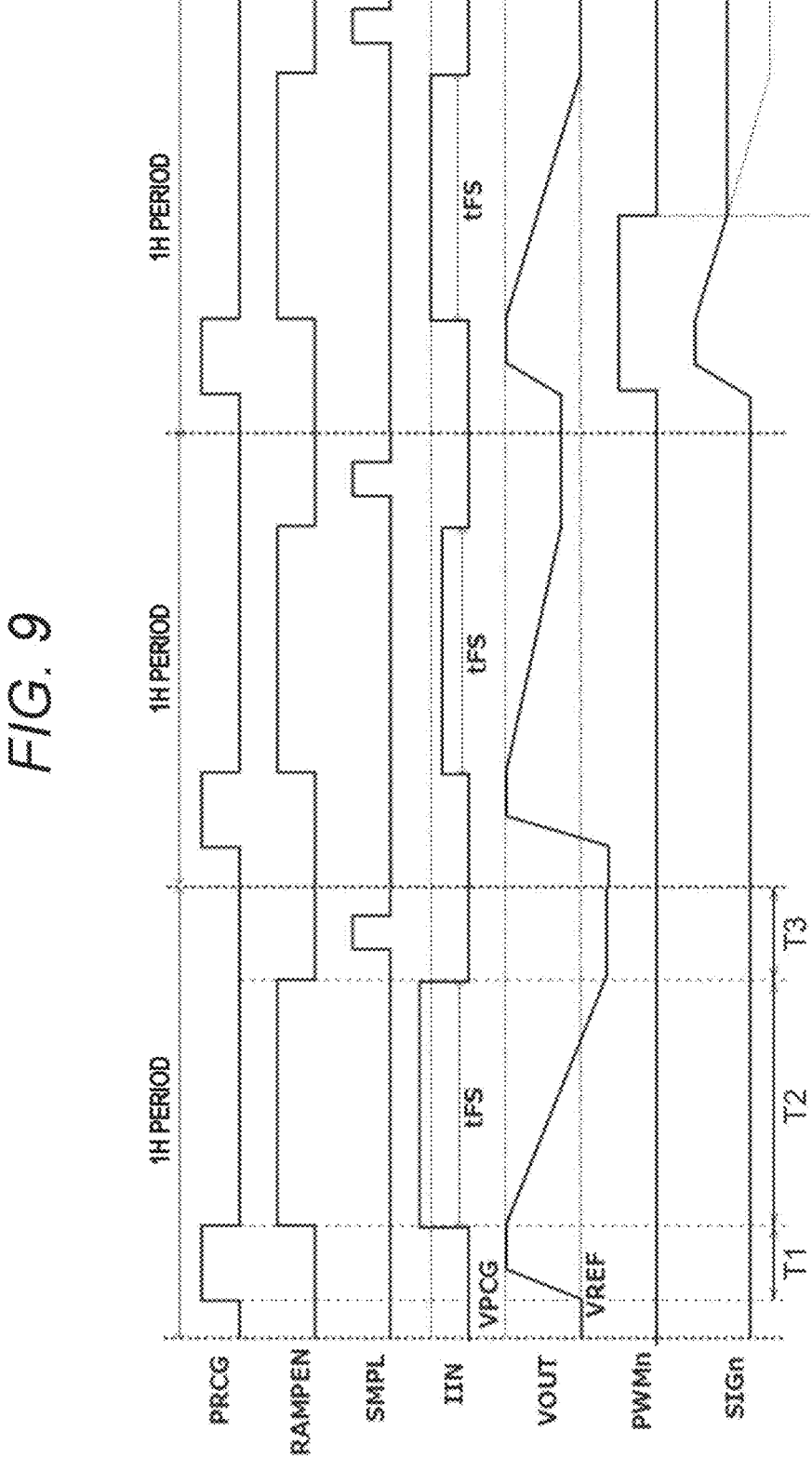
FIG. 9 is an operation timing diagram of a display drive circuit of FIG. 8.

FIG. 9 is an operation timing diagram of the display drive circuit 20 of FIG. 8. As illustrated in FIG. 9, one horizontal line period includes periods T1 to T3. When one horizontal line period is started, as shown in period T1, the PRCG signal goes to the high level and the PRCG switch 44 is turned on. As a result, the second input node and the output node of the amplifier 41 in the output buffer 31 are short-circuited, and the ramp wave voltage rises to the precharge voltage VPCG.

Thereafter, in period T2, the RAMPEN signal goes to the high level, and the RAMPEN switch 43 is turned on. As a result, the current from the variable current source 35 flows to the load circuit 42 via the RAMPEN switch 43, and the voltage level of the ramp wave voltage output from the amplifier 41 decreases with time. While the RAMPEN switch 43 is on, the voltage level of the ramp wave voltage changes with time.

Thereafter, when the RAMPEN signal transitions from the high level to the low level, period T2 ends and period T3 starts. At this time, the RAMPEN switch 43 is turned off, the current from the variable current source 35 does not flow to the load circuit 42, and the voltage level of the ramp wave voltage becomes constant.

During period T3, the SMPL signal temporarily transitions to the high level. As a result, the ramp wave voltage is supplied to the first input node of the differential amplifier 36a in the comparator 36 via the SMPL switch 34. The differential amplifier 36a outputs a comparison result signal corresponding to the voltage difference between the ramp wave voltage and the reference voltage, and holds the comparison result signal in the capacitor 42a. The comparison result signal held in the capacitor 42a during period T3 is used to define the current flowing from the variable current source 35 in the next one horizontal line period. The operations in periods T1 to T3 are similarly repeated in the next horizontal line period.

As described above, in the first embodiment, the load circuit 42 is arranged on the feedback path of the amplifier 41 that outputs the ramp wave voltage, and the current flowing through the load circuit 42 is variably controlled by the voltage difference between the ramp wave voltage and the reference voltage VREF. As a result, even if the coupling capacitance between the adjacent signal lines fluctuates, the current flowing through the load circuit 42 can be adjusted in accordance with the fluctuation of the ramp wave voltage due to the coupling capacitance, so that the fluctuation of the ramp wave voltage can be curbed. Therefore, according to the present embodiment, variations in luminance and the like in the display area can be curbed, and the display quality can be improved.

Second Embodiment

A display drive circuit 20 according to a second embodiment generates a ramp wave voltage whose voltage level increases with time.

Figure 10:
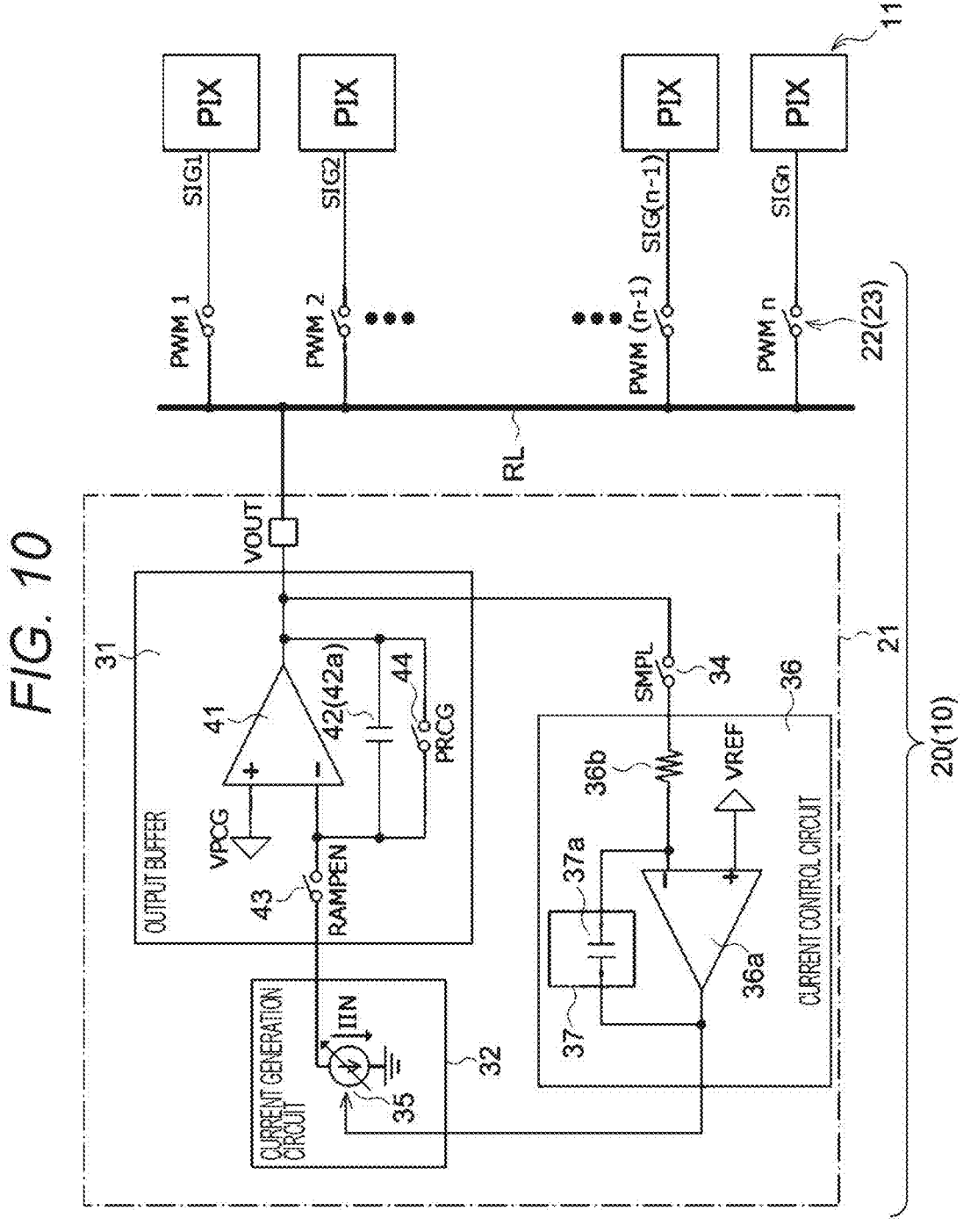
FIG. 10 is a block diagram illustrating a configuration of a main part of a display drive circuit according to a second embodiment.
Figure 11:
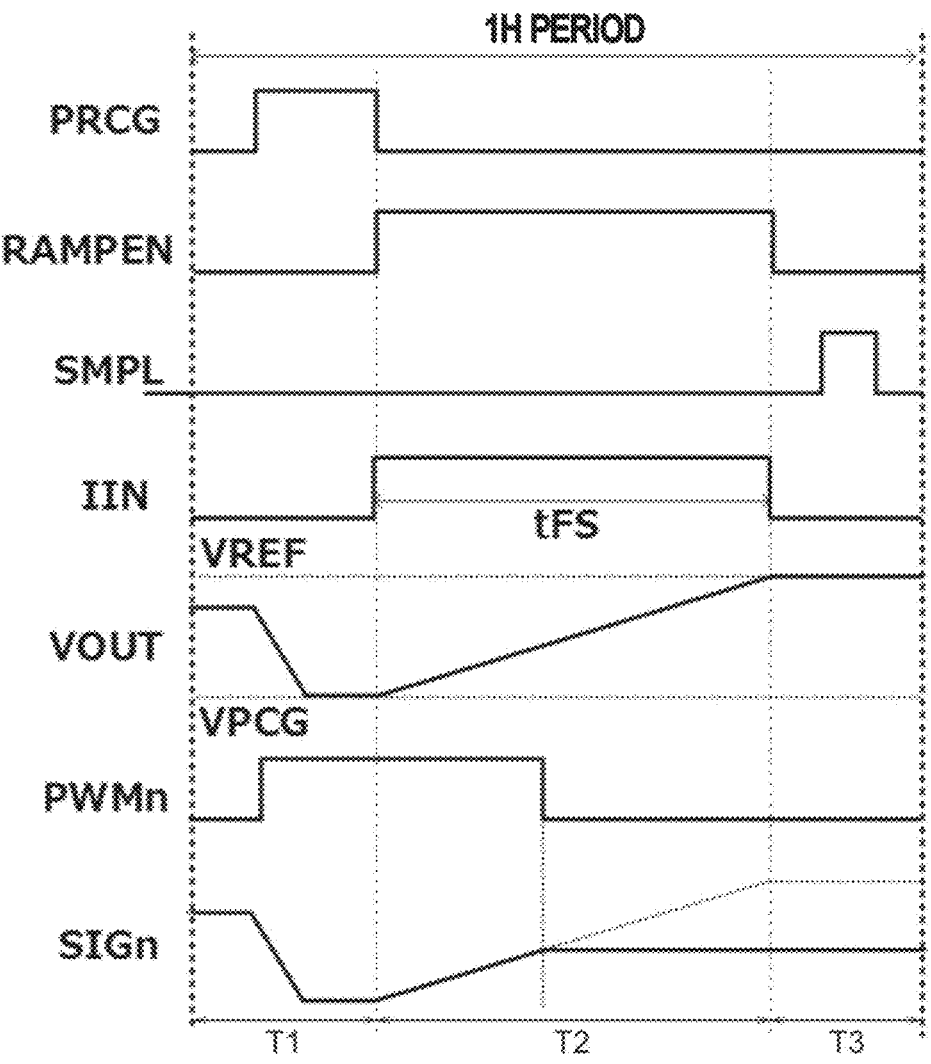
FIG. 11 is an operation timing diagram of the display drive circuit of FIG. 10.

FIG. 10 is a block diagram illustrating a configuration of a main part of the display drive circuit 20 according to the second embodiment, and FIG. 11 is an operation timing diagram of the display drive circuit 20 of FIG. 10. In the display drive circuit 20 of FIG. 10, components common to those of FIG. 8 are denoted by the same reference numerals, and differences will be mainly described below.

The display drive circuit 20 of FIG. 10 differs from the display drive circuit 20 of FIG. 8 in the connection form of a variable current source 35 in a current generation circuit 32. One end of the variable current source 35 in the current generation circuit 32 of FIG. 10 is connected to the ground node, and the other end is connected to one end of a RAMPEN switch 43 in an output buffer 31.

As illustrated in FIG. 11, one horizontal line period includes periods T1 to T3. In period T1, the PRCG signal goes to the high level and a PRCG switch 44 is turned on. As a result, the second input node and the output node of an amplifier 41 in the output buffer 31 are short-circuited, and the ramp wave voltage decreases to a precharge voltage VPCG. The precharge voltage VPCG of FIG. 10 is, for example, a ground voltage. On the other hand, the precharge voltage VPCG of FIG. 8 is, for example, a power supply voltage.

Thereafter, in period T2, the RAMPEN signal goes to the high level, and the RAMPEN switch 43 is turned on. As a result, a current flows from a load circuit 42 to the variable current source 35 via the RAMPEN switch 43, and reaches the ground node. Therefore, the ramp wave voltage, which is the output voltage of the output buffer 31, increases with time. The voltage level of the ramp wave voltage continues to decrease while the RAMP switch is on.

Thereafter, when the RAMPEN signal transitions from the high level to the low level, period T2 ends and period T3 starts. At this time, the RAMPEN switch 43 is turned off, the current does not flow from the load circuit 42 to the variable current source 35, and the voltage level of the ramp wave voltage becomes constant.

During period T3, the SMPL signal temporarily transitions to the high level. As a result, the ramp wave voltage is supplied to the first input node of the differential amplifier 36a in the comparator 36 via the SMPL switch 34. The differential amplifier 36a outputs a comparison result signal corresponding to the voltage difference between the ramp wave voltage and the reference voltage, and holds the comparison result signal in the capacitor 42a. The comparison result signal held in the capacitor 42a during period T3 is used to define the current flowing from the variable current source 35 in the next one horizontal line period. The operations in periods T1 to T3 are similarly repeated in the next horizontal line period.

As described above, in the second embodiment, while the RAMPEN switch 43 is on, the current corresponding to the voltage level of the ramp wave voltage flows from the load circuit 42 to the current generation circuit 32, so that fluctuation of the voltage level of the ramp wave voltage can be curbed.

Third Embodiment

A display drive circuit 20 according to a third embodiment generates a ramp wave voltage having a triangular wave shape.

Figure 12:
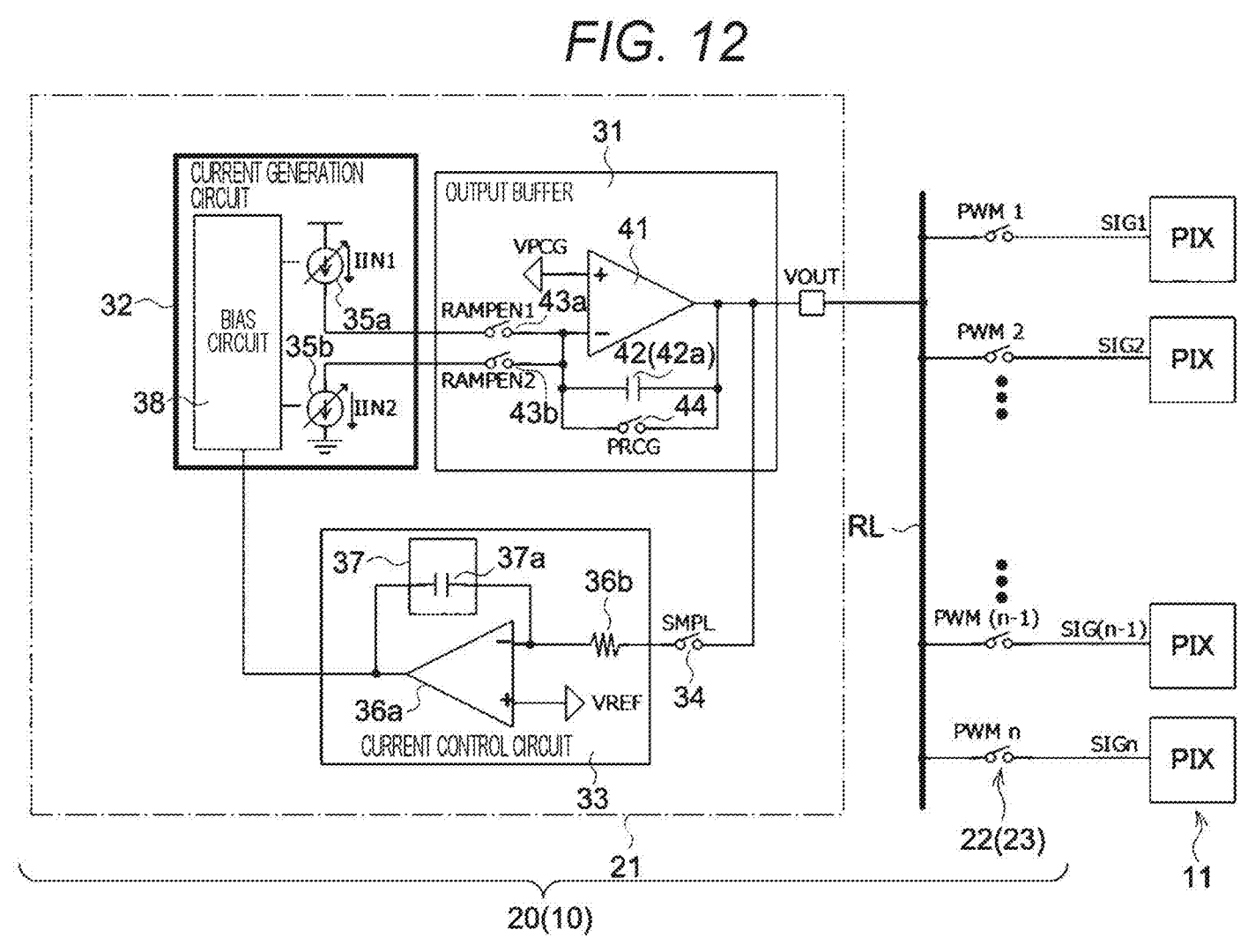
Figure 13:
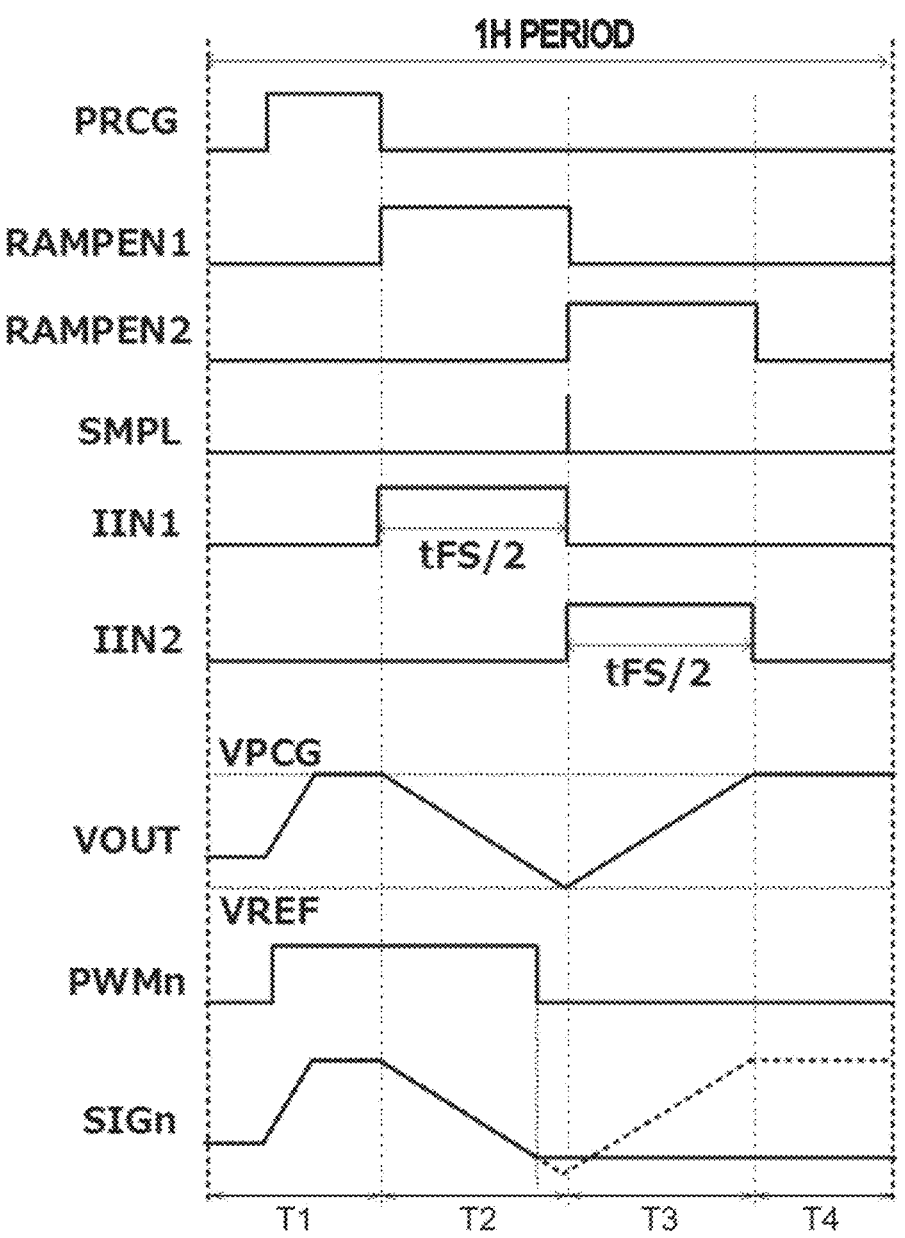
FIG. 13 is an operation timing diagram of the display drive circuit of FIG. 10.

FIG. 12 is a block diagram illustrating a configuration of a main part of the display drive circuit 20 according to the second embodiment, and FIG. 13 is an operation timing diagram of the display drive circuit 20 of FIG. 10. In the display drive circuit 20 of FIG. 12, components common to those of FIG. 8 are denoted by the same reference numerals, and differences will be mainly described below.

The display drive circuit 20 of FIG. 12 is different from the display drive circuit 20 of FIGS. 8 and 10 in the internal configurations of an output buffer 31 and a current generation circuit 32. The output buffer 31 of FIG. 12 includes a first RAMPEN switch 43a and a second RAMPEN switch 43b instead of the RAMPEN switch 43 of FIG. 10.

The current generation circuit 32 of FIG. 12 includes a first variable current source 35a, a second variable current source 35b, and a bias circuit 38. One end of the first variable current source 35a is connected to the power supply voltage node, and the other end is connected to one end of the first RAMPEN switch 43a. One end of the second variable current source 35b is connected to the ground node, and the other end is connected to one end of the second RAMPEN switch 43b. The other end of the first RAMPEN switch 43a and the other end of the second RAMPEN switch 43b are connected to a load circuit 42 and to the second input node of an amplifier 41. The bias circuit 38 controls the current flowing through the first variable current source 35a and the second variable current source 35b on the basis of a comparison result signal of a comparator 36 held in a holding unit 37.

As illustrated in FIG. 13, one horizontal line period includes periods T1 to T4. In period T1, both the first RAMPEN switch 43a and the second RAMPEN switch 43b are turned off, the PRCG signal goes to the high level, and a PRCG switch 44 is turned on. As a result, the second input node and the output node of an amplifier 41 in the output buffer 31 are short-circuited, and the ramp wave voltage rises to the precharge voltage.

Thereafter, in period T2, the first RAMPEN signal goes to the high level, and the first RAMPEN switch 43a is turned on. As a result, a current flows from the first variable current source 35a to the load circuit 42 via the first RAMPEN switch 43a, and the ramp wave voltage, which is the output voltage of the output buffer 31, decreases with time.

Thereafter, when transition is made from period T2 to period T3, the SMPL switch 34 is temporarily turned on, the comparator 36 outputs a comparison result signal between the ramp wave voltage at that time and the reference voltage, and the holding unit 37 holds the comparison result signal.

In period T3, the first RAMPEN switch 43a is turned off, the second RAMPEN signal goes to the high level, and the second RAMPEN switch 43b is turned on. As a result, a current flows from the load circuit 42 to the second variable current source 35b via the second RAMPEN switch 43b, and the ramp wave voltage, which is the output voltage of the output buffer 31, increases.

Thereafter, in period T4, both the first RAMPEN switch 43a and the second RAMPEN switch 43b are turned off, and the ramp wave voltage, which is the output voltage of the output buffer 31, maintains a precharge voltage VPCG.

As described above, even in the case of generating a ramp wave voltage of a triangular wave shape in which the direction in which the voltage level changes is switched during one horizontal line period, the voltage level of ramp wiring RL is not affected by the parasitic capacitance between signal lines by controlling the current flowing through the load circuit 42 according to the voltage level of the ramp wave voltage.

Fourth Embodiment

A fourth embodiment is different from the first to third embodiments in the internal configuration of a current control circuit 33.

Figure 14:
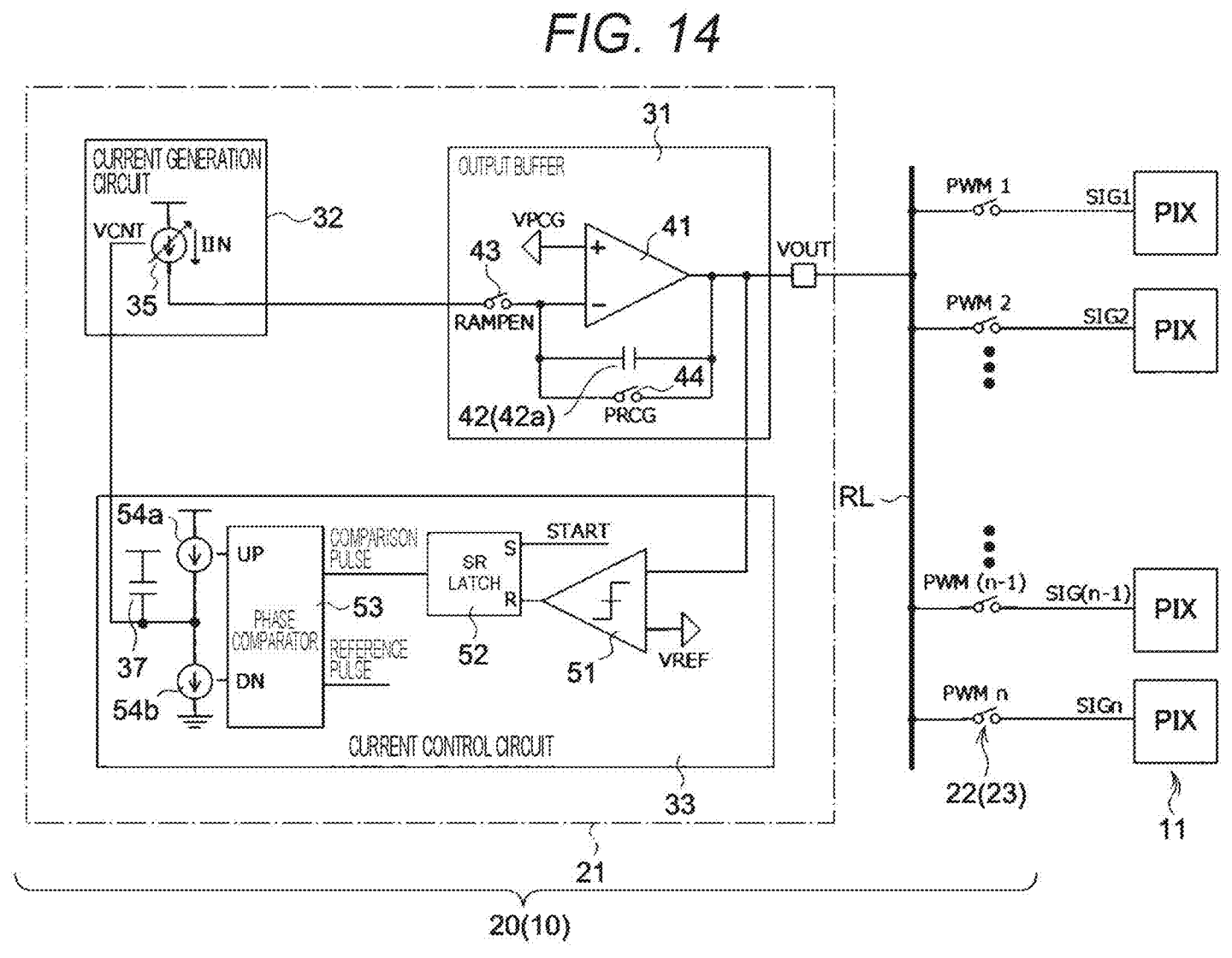
Figure 15:
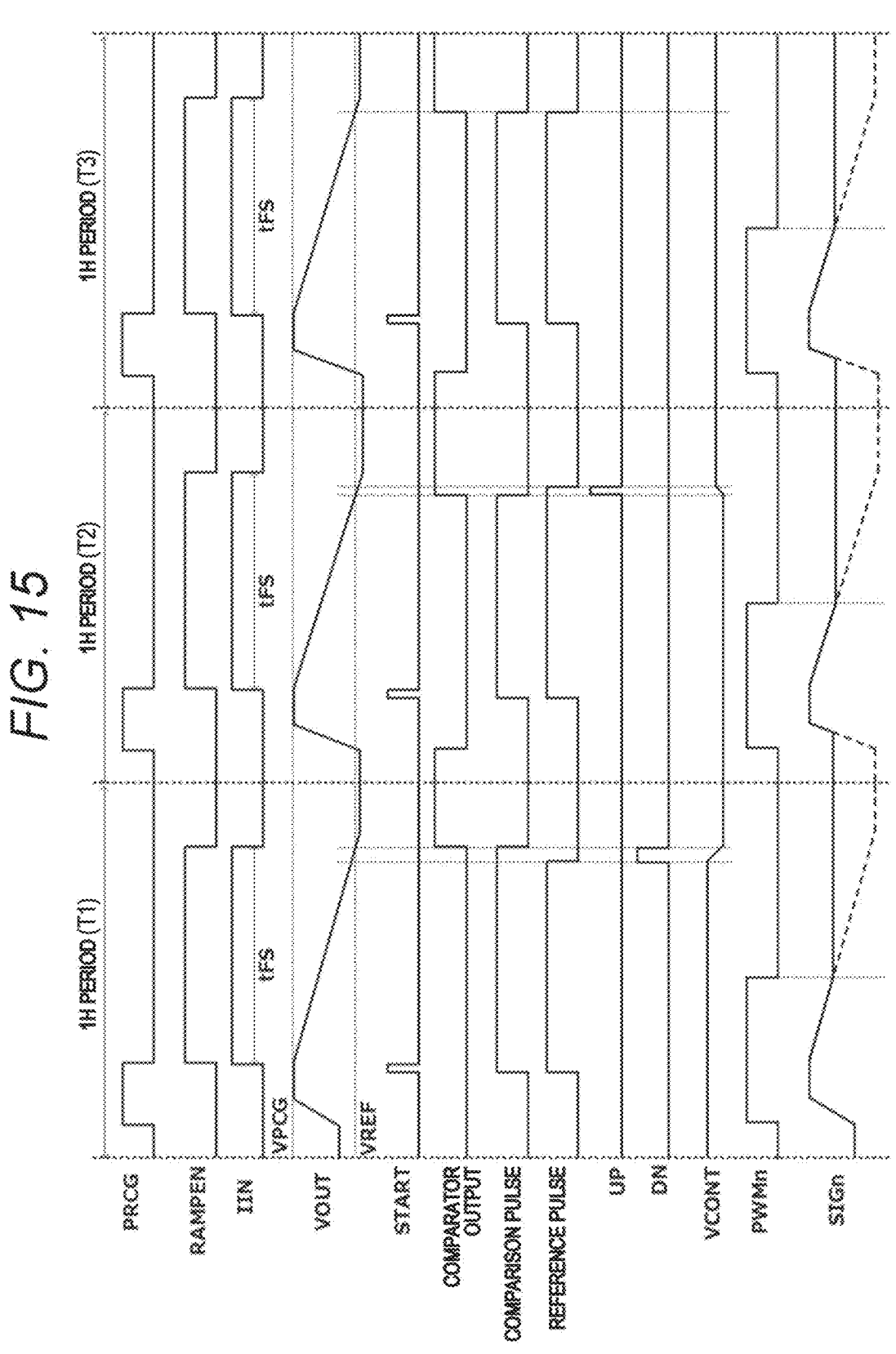
FIG. 15 is an operation timing diagram of the display drive circuit of FIG. 14.

FIG. 14 is a block diagram illustrating a configuration of a main part of a display drive circuit 20 according to the fourth embodiment, and FIG. 15 is an operation timing diagram of the display drive circuit 20 of FIG. 14.

The display drive circuit 20 of FIG. 14 includes an output buffer 31 and a current generation circuit 32 having configurations similar to those of FIG. 8. The current control circuit 33 in the display drive circuit 20 of FIG. 14 includes a digital comparator 51, an SR latch 52, a phase comparator 53, a first current source 54a, a second current source 54b, and a holding unit 37.

The digital comparator 51 compares the ramp wave voltage, which is the output voltage of the output buffer 31, with the reference voltage and outputs a binary signal, which is a comparison result signal. For example, the digital comparator 51 outputs a high-level comparison result signal when the ramp wave voltage becomes lower than the reference voltage. When the START signal goes to the high level, the SR latch 52 is set and the output goes to the high level, and when the comparison result signal of the digital comparator 51 goes to the high level, the SR latch is reset and the output goes to the low level. Hereinafter, the output signal of the SR latch 52 is referred to as a comparison pulse signal.

The phase comparator 53 outputs an UP signal or a DOWN signal according to the phase difference between the comparison pulse signal output from the SR latch 52 and the reference pulse signal. The first current source 54a causes a current to flow in a period during which the UP signal is at the high level, and charges the capacitor of the holding unit 37. The second current source 54b discharges the capacitor during a period in which the DOWN signal is at the high level to cause a discharge current to flow to the ground node.

One horizontal line period T1 in FIG. 15 illustrates an example in which the comparison pulse signal output from the SR latch 52 falls behind the reference pulse signal. In this case, since the ramp wave voltage is too high, the phase comparator 53 sets the DOWN signal to the high level. Therefore, the variable current source 35 performs control so that more current flows through the load circuit 42, and lowers the voltage level of the ramp wave voltage even more.

The next one horizontal line period T2 illustrates an example in which the comparison pulse signal falls earlier than the reference pulse signal. In this case, since the ramp wave voltage is too low, the phase comparator 53 sets the UP signal to the high level. Therefore, the variable current source 35 performs control so that a smaller current flows through the load circuit 42, and the voltage level of the ramp wave voltage increases even more.

The next one horizontal line period T3 illustrates a case where the phases of the comparison pulse signal and the reference pulse signal coincide with each other. In this case, the phase comparator 53 sets both the UP signal and the DOWN signal to the low level. Therefore, the variable current source 35 causes a current corresponding to the comparison result signal held in the holding unit 37 to flow to the load circuit 42.

Since the current control circuit 33 of FIG. 14 mostly includes digital circuits such as a logic gate or a flip-flop, the circuit area can be reduced and power consumption can be reduced. In particular, when the generation of semiconductor processes advances, further reduction in area and reduction in power consumption can be expected.

As described above, in the fourth embodiment, since the current control circuit 33 that controls the current of the variable current source 35 can be formed using the phase comparator 53, integration is facilitated, and a small area and low power consumption can be achieved.

Fifth Embodiment

A fifth embodiment is different from the first to fourth embodiments in the internal configuration of a current control circuit 33.

Figure 16:
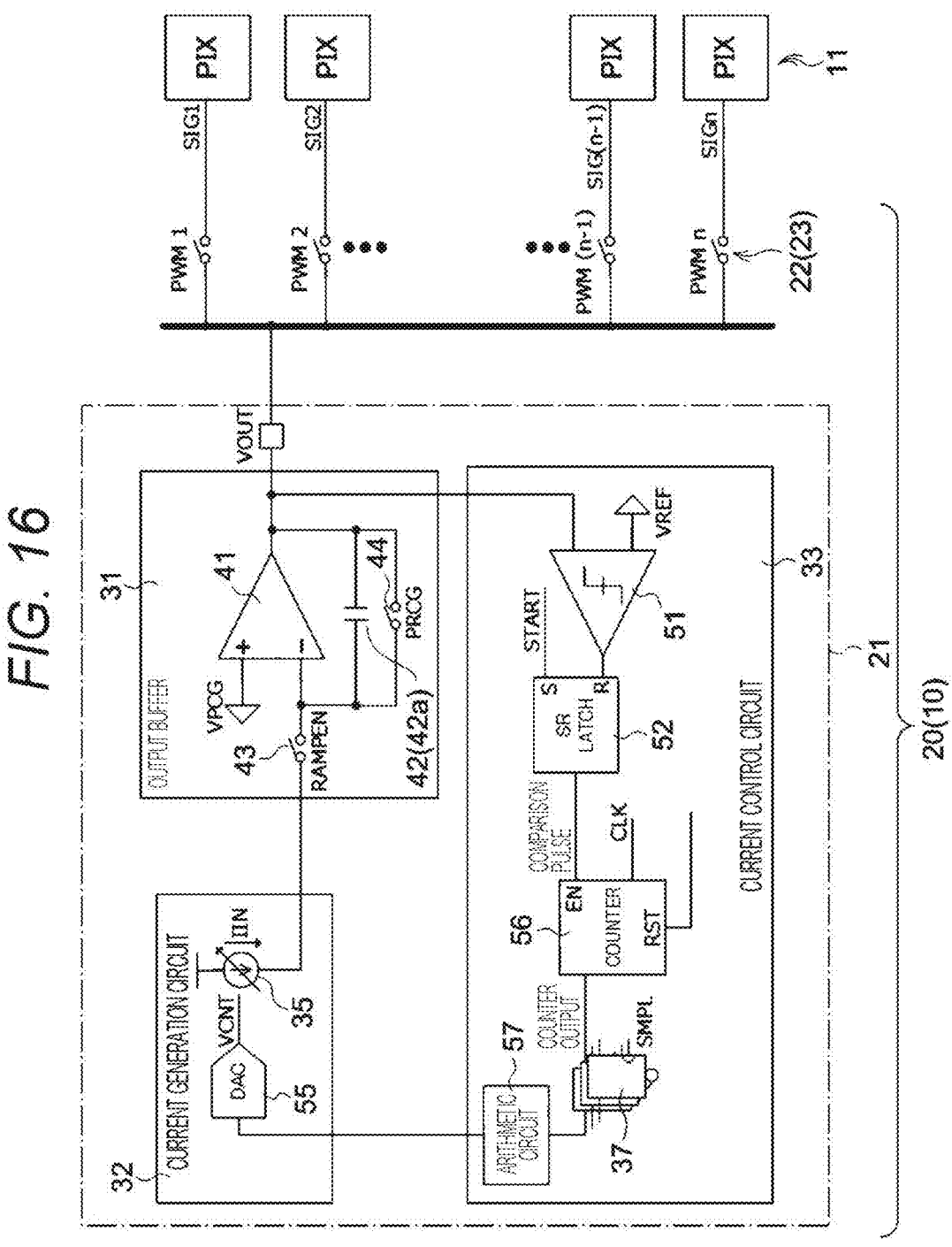
FIG. 16 is a block diagram illustrating a configuration of a main part of a display drive circuit according to a fifth embodiment.
Figure 17:
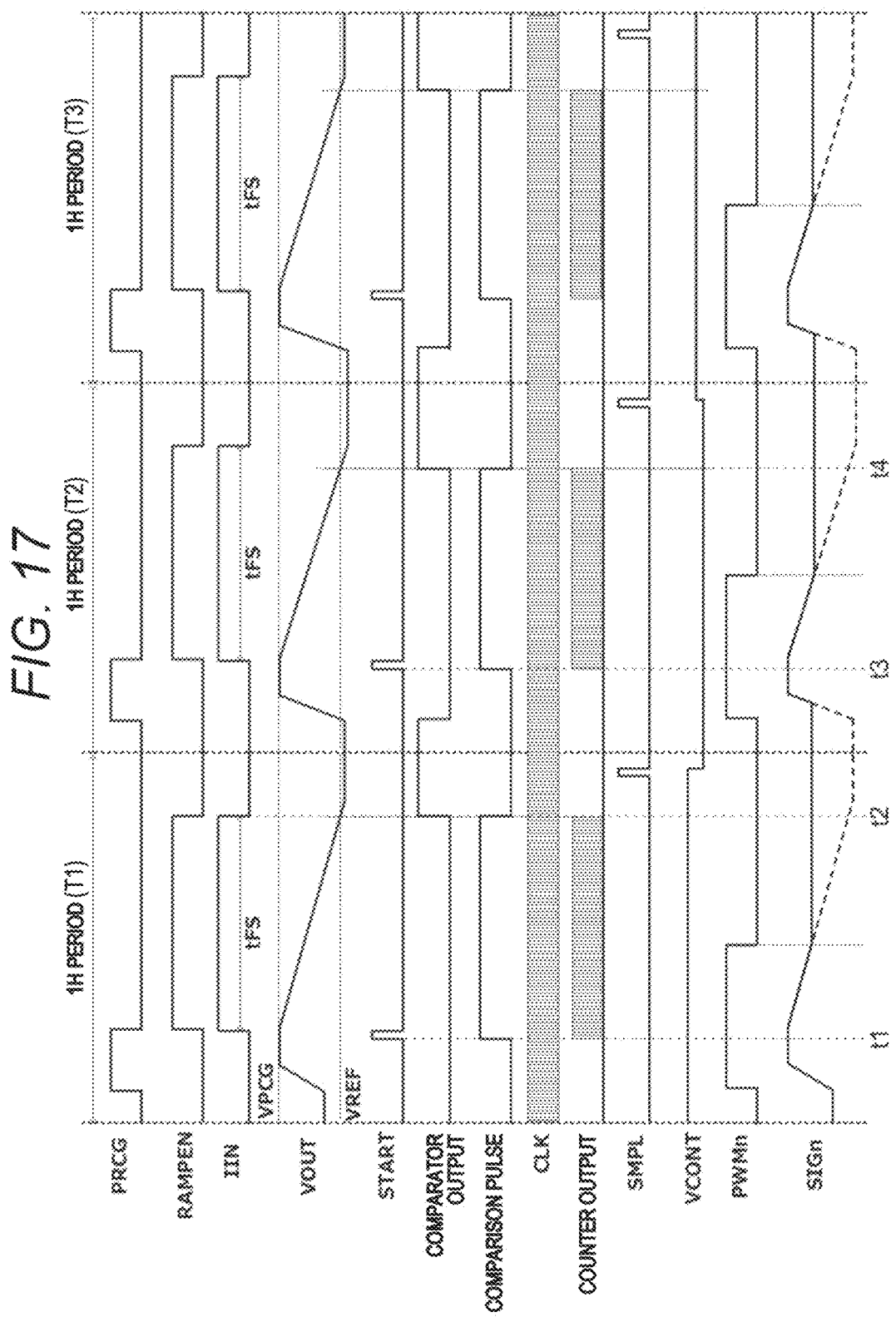
FIG. 17 is an operation timing diagram of the display drive circuit of FIG. 16.

FIG. 16 is a block diagram illustrating a configuration of a main part of a display drive circuit 20 according to the fifth embodiment, and FIG. 17 is an operation timing diagram of the display drive circuit 20 of FIG. 16.

The display drive circuit 20 of FIG. 16 includes an output buffer 31 having a configuration similar to that of FIG. 8. A current generation circuit 32 of FIG. 16 includes a variable current source 35 and a DA converter (referred to as DAC below) 55. The variable current source 35 generates a current according to the current control signal output from the DAC 55.

The current control circuit 33 in the display drive circuit 20 of FIG. 16 includes a digital comparator 51, an SR latch 52, a pulse counter 56, a holding unit 37, and an arithmetic circuit 57. The operation of the digital comparator 51 and the SR latch 52 is similar to that of FIG. 14, and the SR latch 52 outputs a comparison pulse signal.

The pulse counter 56 counts the pulse width of the comparison pulse signal output from the SR latch 52 by a clock signal CLK and outputs the count value. The holding unit 37 holds the count value output from the pulse counter 56. The holding unit 37 holds the count value by a flip-flop, for example. Alternatively, the holding unit 37 may hold the count value in a plurality of logic gates.

The arithmetic circuit 57 generates a digital current control signal for controlling the current of the variable current source 35 on the basis of the count value. The DAC 55 in the current generation circuit 32 generates a current control signal obtained by DA-converting the digital current control signal.

In one horizontal line period T1 in FIG. 17, the SR latch 52 outputs the comparison pulse signal in a period (time t1 to t2) in which the voltage level of the ramp wave voltage, which is the output voltage of the output buffer 31, is larger than the reference voltage. The pulse counter 56 counts a period (time t1 to t2) of the pulse width of the comparison pulse signal by the clock signal CLK. The holding unit 37 holds the count value of the pulse counter 56. The arithmetic circuit 57 generates a digital current control signal according to the count value. The variable current source 35 defines a current flowing to a load circuit 42 in the next one horizontal line period T2 on the basis of the digital current control signal.

Similarly, in the next one horizontal line period T2, the SR latch 52 outputs the comparison pulse signal in a period (time t3 to t4) in which the voltage level of the ramp wave voltage is larger than the reference voltage. In the example of FIG. 17, the pulse width of the comparison pulse signal within one horizontal line period T2 is smaller than the pulse width of the comparison pulse signal within one horizontal line period T1. Therefore, the count value of the pulse counter 56 also decreases. Therefore, the variable current source 35 further reduces the current flowing to the load circuit 42 in the next one horizontal line period T3 on the basis of the digital current control signal from the arithmetic circuit 57.

Since the current control circuit 33 of FIG. 16 can include a digital circuit, the circuit area can be reduced as the generation of the semiconductor process advances. Therefore, the display drive circuit 20 according to the fifth embodiment can be easily integrated, and downsizing and low power consumption can be achieved.

Sixth Embodiment

A sixth embodiment is different from the first to fifth embodiments in the internal configuration of a current control circuit 33.

Figure 18:
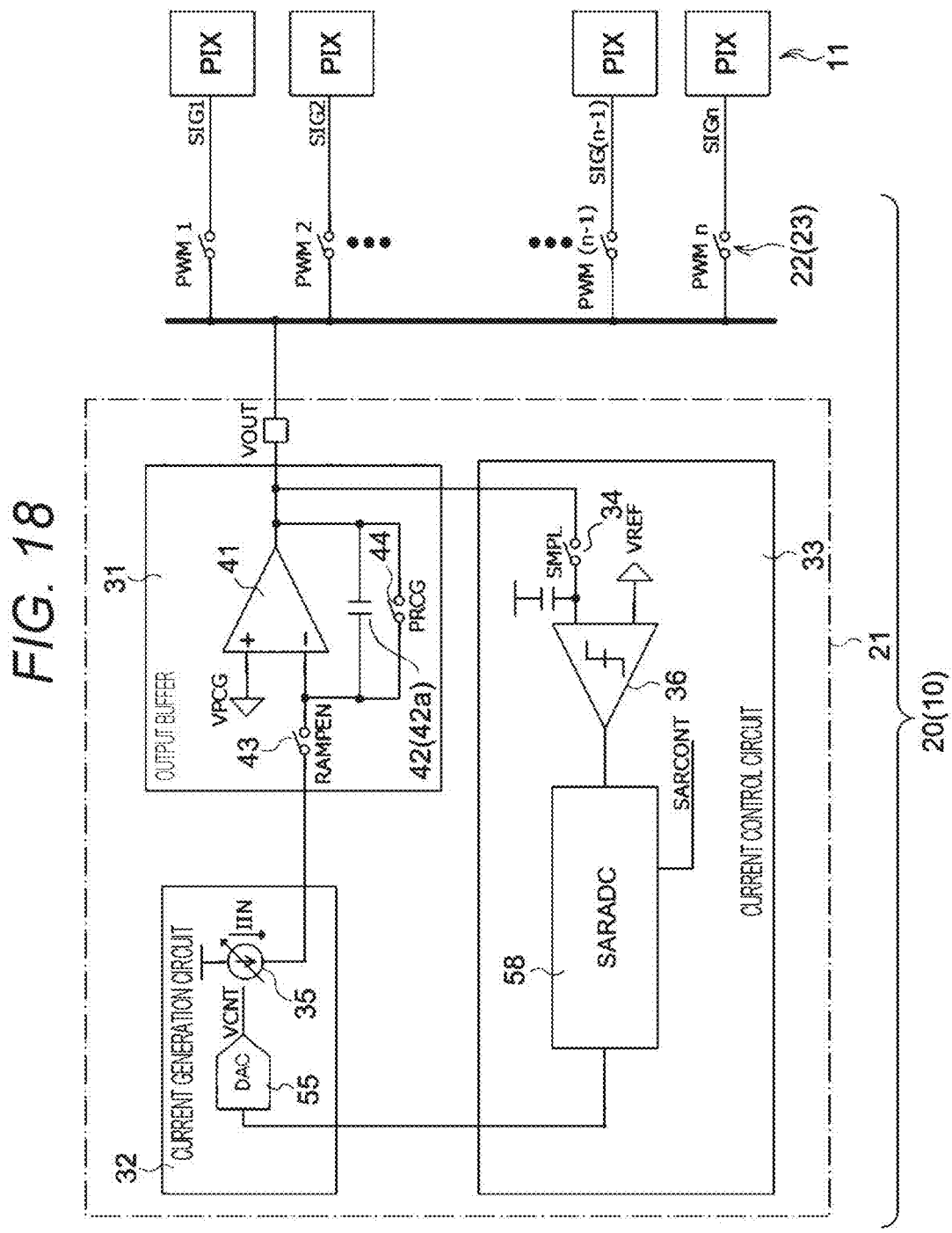
FIG. 18 is a block diagram illustrating a configuration of a main part of a display drive circuit according to a sixth embodiment.
Figure 19:
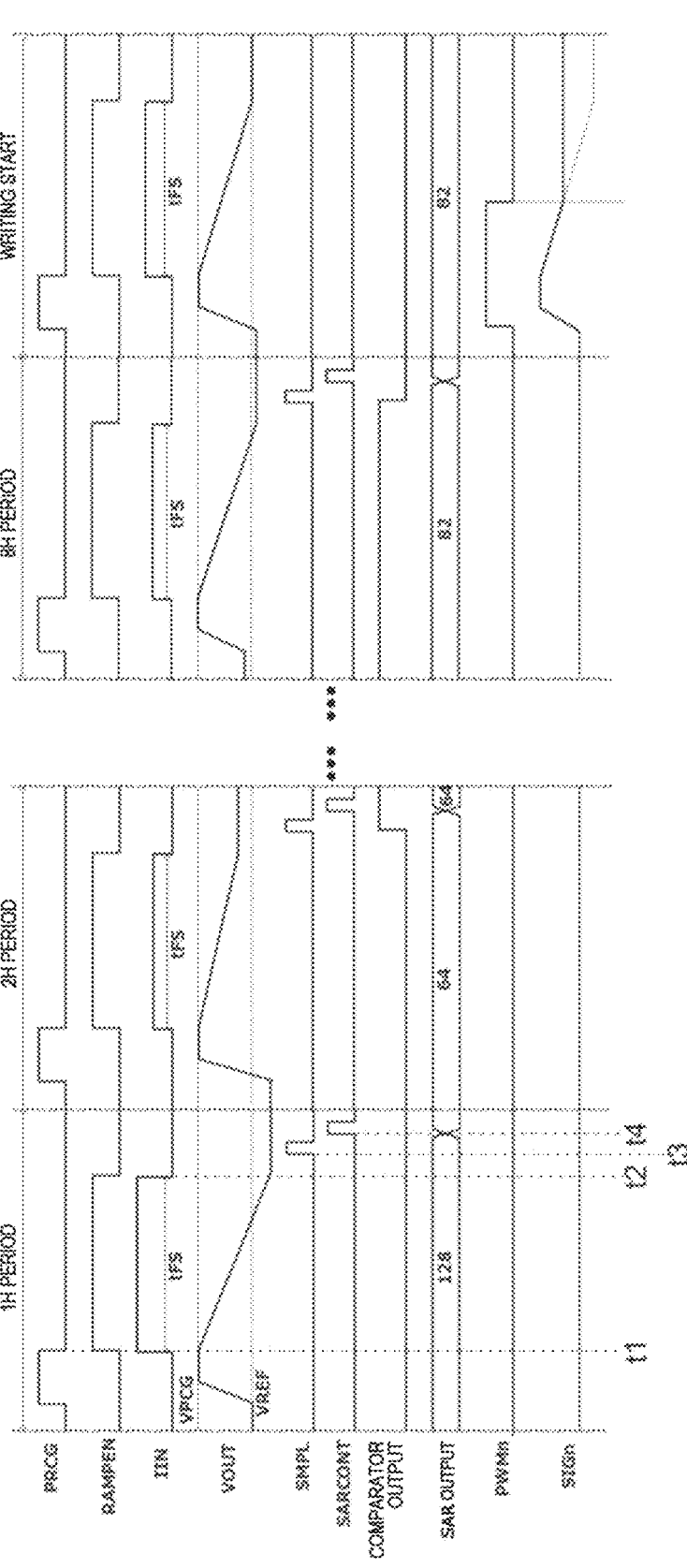
FIG. 19 is an operation timing diagram of the display drive circuit of FIG. 18.

FIG. 18 is a block diagram illustrating a configuration of a main part of a display drive circuit 20 according to a sixth embodiment, and FIG. 19 is an operation timing diagram of the display drive circuit 20 of FIG. 18.

The display drive circuit 20 of FIG. 18 includes an output buffer 31 and a current generation circuit 32 having configurations similar to those of FIG. 16. The current control circuit 33 in the display drive circuit 20 of FIG. 18 includes a comparator 36 and a successive approximation AD converter (referred to as successive approximation register analog digital converter (SARADC) below) 58.

The comparator 36 outputs a comparison result signal corresponding to a potential difference between a ramp wave voltage which is an output voltage of the output buffer 31 and a reference voltage. The SARADC 58 performs successive approximation processing on the comparison result signal output from the comparator 36 to output a digital signal corresponding to the comparison result signal. A DAC 55 in the current generation circuit 32 converts the digital signal output from the SARADC 58 into an analog current control signal. A variable current source 35 controls the current flowing through a load circuit 42 on the basis of the current control signal.

The SARADC 58 performs AD conversion processing when an SMPL switch 34 is on, and holds the immediately preceding digital signal when the SMPL switch 34 transitions from on to off.

In one horizontal line period T1 in FIG. 19, a current flows from the variable current source 35 to the load circuit 42 in a period (from time t1 to t2) in which a RAMPEN switch 43 is turned on, and the ramp wave voltage decreases with time. Thereafter, at time t3, the SMPL switch 34 is turned on, and the comparator 36 outputs a comparison result signal corresponding to the voltage difference between the ramp wave voltage and the reference voltage. The SARADC 58 starts the successive approximation AD conversion operation, and when a SARCONT signal transitions from the low level to the high level at time t4, outputs a digital signal corresponding to the comparison result signal. This digital signal is held until the SARCONT signal transitions to the high level next time.

The SARADC 58 can be mounted on a semiconductor substrate and can be easily integrated. Therefore, the display drive circuit 20 of FIG. 18 can be downsized as the generation of the semiconductor process advances.

Seventh Embodiment

In the first to sixth embodiments described above, the variable current source 35 is used for the current generation circuit 32 in the display drive circuit 20, but the variable current source 35 is not necessarily used.

Figure 20:
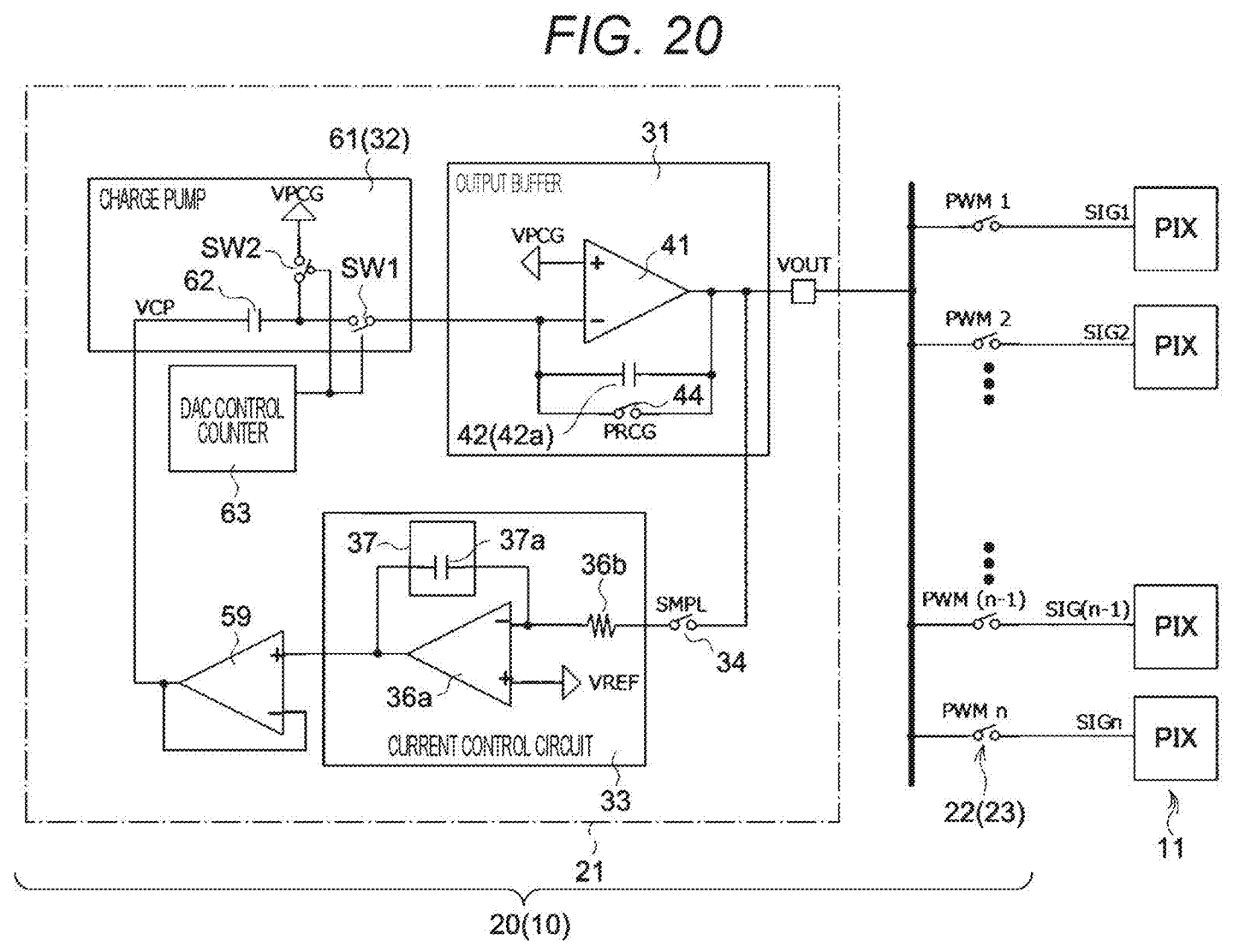
Figure 21:
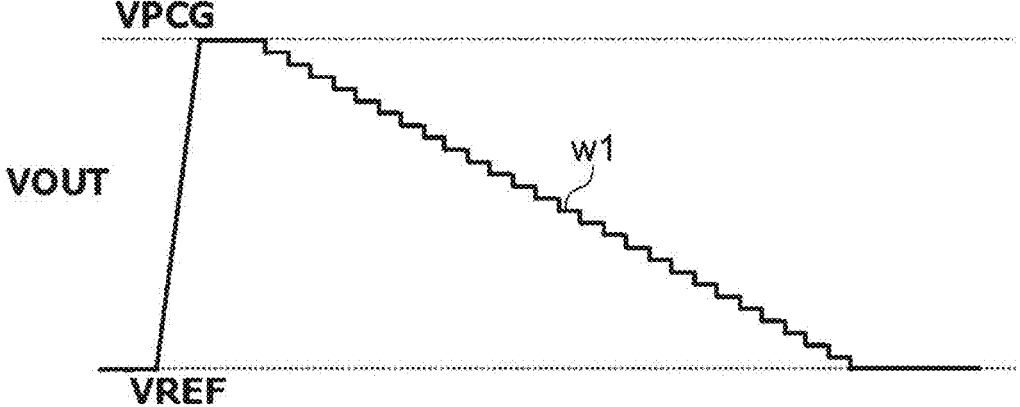
FIG. 21 is a waveform diagram of a ramp wave voltage which is an output voltage of an output buffer.

FIG. 20 is a block diagram illustrating a configuration of a main part of a display drive circuit 20 according to a seventh embodiment, and FIG. 21 is a waveform diagram of a ramp wave voltage which is an output voltage of an output buffer 31.

The display drive circuit 20 of FIG. 20 includes an output buffer 31, a comparator 36, and a holding unit 37 having configurations similar to those of FIG. 8. A voltage follower circuit 59 is connected to the output of the comparator 36.

A current generation circuit 32 in the display drive circuit 20 of FIG. 20 includes a charge pump 61 provided instead of the variable current source 35 and a DAC control counter 63. The charge pump 61 includes a capacitor 62 and a switch SW1 connected in series between the output node of the voltage follower circuit 59 and the second input node of an amplifier 41 in the output buffer 31, and a switch SW2 connected between a connection node of the capacitor 62 and the switch SW1 and a precharge voltage VPCG node.

The DAC control counter 63 performs the counting operation at predetermined time intervals. The predetermined time interval is a time interval at which the ramp wave voltage is updated. The comparator 36 in the current control circuit 33 compares the ramp wave voltage with the reference voltage every horizontal line period, and inputs a voltage signal corresponding to the comparison result signal to the charge pump 61.

The switches SW1 and SW2 in the charge pump 61 are temporarily turned on each time the DAC control counter 63 counts up. The cycle at which the DAC control counter 63 counts up is much shorter than one horizontal line period. The charge pump 61 can switch the current flowing to a load circuit 42 in stages by repeating the operation in which the switches SW1 and SW2 are temporarily turned on. As a result, as illustrated in a ramp wave voltage waveform w1 of FIG. 21, the voltage level of the ramp wave voltage decreases stepwise.

A ramp wave voltage V(t) in the display drive circuit 20 of FIG. 20 is expressed by the following formula (1).

$$V(t) = VPCG - n \ (VCP - VPCG) \qquad (1)$$

In formula (1), VPCG is the precharge voltage, VCP is the output voltage of the voltage follower circuit 59, and n is the number of counts of the DAC 55 counter.

As described above, in the display drive circuit 20 according to the seventh embodiment, the voltage level of the ramp wave voltage can be changed in stages by using the current generation circuit 32 including the charge pump 61.

Eighth Embodiment

Figure 22:
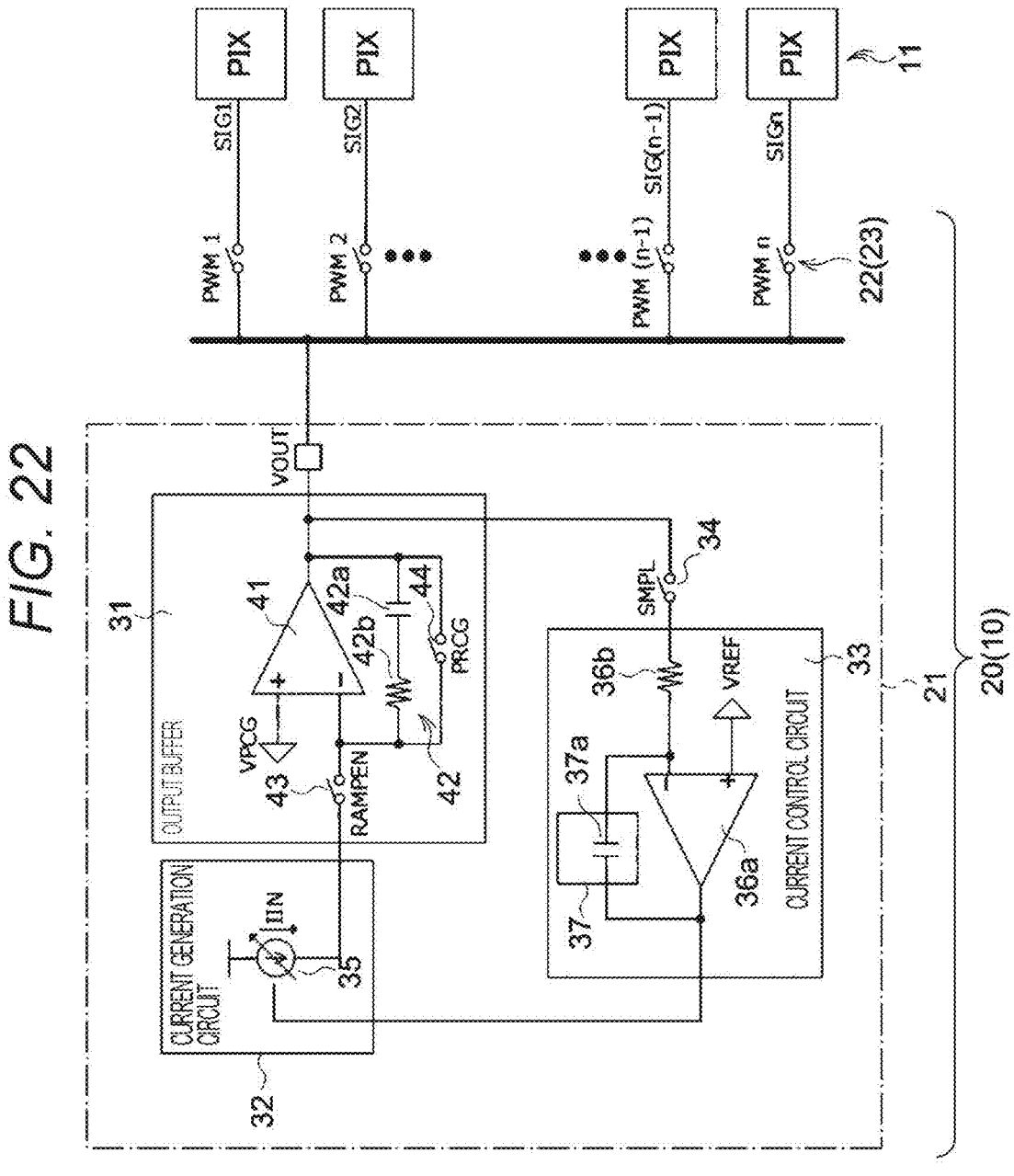
FIG. 22 is a block diagram illustrating a configuration of a main part of a display drive circuit according to an eighth embodiment.
Figure 23:
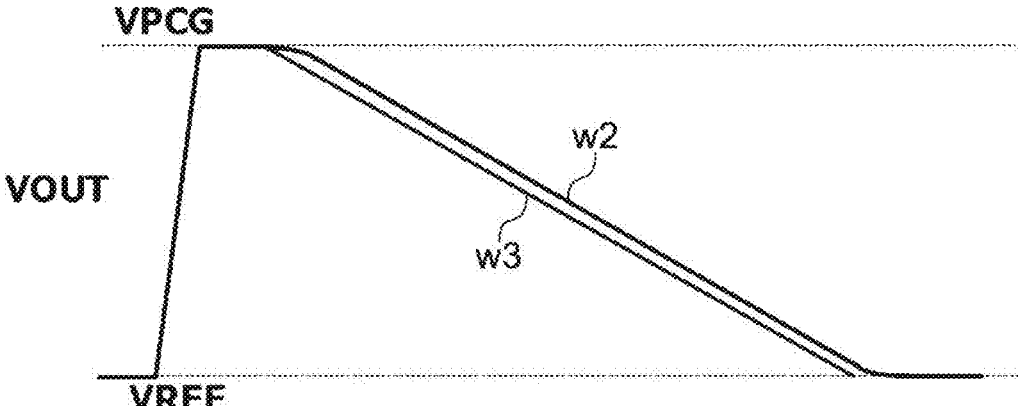
FIG. 23 is a waveform diagram of a ramp wave voltage output from the output buffer of FIG. 22.

FIG. 22 is a block diagram illustrating a configuration of a main part of a display drive circuit 20 according to an eighth embodiment, and FIG. 23 is a waveform diagram of a ramp wave voltage output from an output buffer 31 of FIG. 22. The display drive circuit 20 of FIG. 22 includes a current control circuit 33 and a current generation circuit 32 having configurations similar to those of FIG. 8.

The output buffer 31 of FIG. 22 includes a load circuit 42 having a configuration different from that of FIG. 8. The load circuit 42 of FIG. 22 includes a resistive element 42b and a capacitor 42a connected in series between the second input node and the output node of an amplifier 41.

FIG. 23 illustrates a ramp wave voltage waveform w2 of the display drive circuit 20 of FIG. 8 and a ramp wave voltage waveform w3 of the display drive circuit 20 of FIG. 22. As illustrated in FIG. 8, in a case where the load circuit 42 includes only the capacitor 42a, the waveform of the ramp wave voltage may change nonlinearly at the timing when the voltage level of the ramp wave voltage starts to decrease.

Since the load circuit 42 of FIG. 22 includes the resistive element 42b connected in series to the capacitor 42a, the voltage level can be changed substantially linearly at the timing when the ramp wave voltage starts to decrease. As a result, when the signal line voltage is determined using the ramp wave voltage, an error in the signal line voltage can be reduced.

A ramp wave voltage which is an output voltage of the output buffer 31 in the display drive circuit 20 of FIG. 22 is expressed by the following formula (2).

$$V(t) = VPCG - \left\{ R \times IIN + (1/C) \times \int IIN(t) \right\} = \qquad (2)$$
$$VPCG - IIN \times (R \times t/C)$$

In formula (2), VPCG is the precharge voltage, IIN is the current flowing through a variable current source 35, R is the resistance value of the resistive element 42b, and C is the capacitance of the capacitor 42a.

As described above, in the eighth embodiment, the resistive element 42b connected in series to the capacitor 42a is provided in the load circuit 42 connected between the second input node and the output node of the amplifier 41. Therefore, the ramp wave voltage can be linearly changed at the timing when the ramp wave voltage starts to decrease. Hence, it is possible to reduce an error from the target value when the signal line voltage is generated from the ramp wave voltage.

Ninth Embodiment

Figure 24:
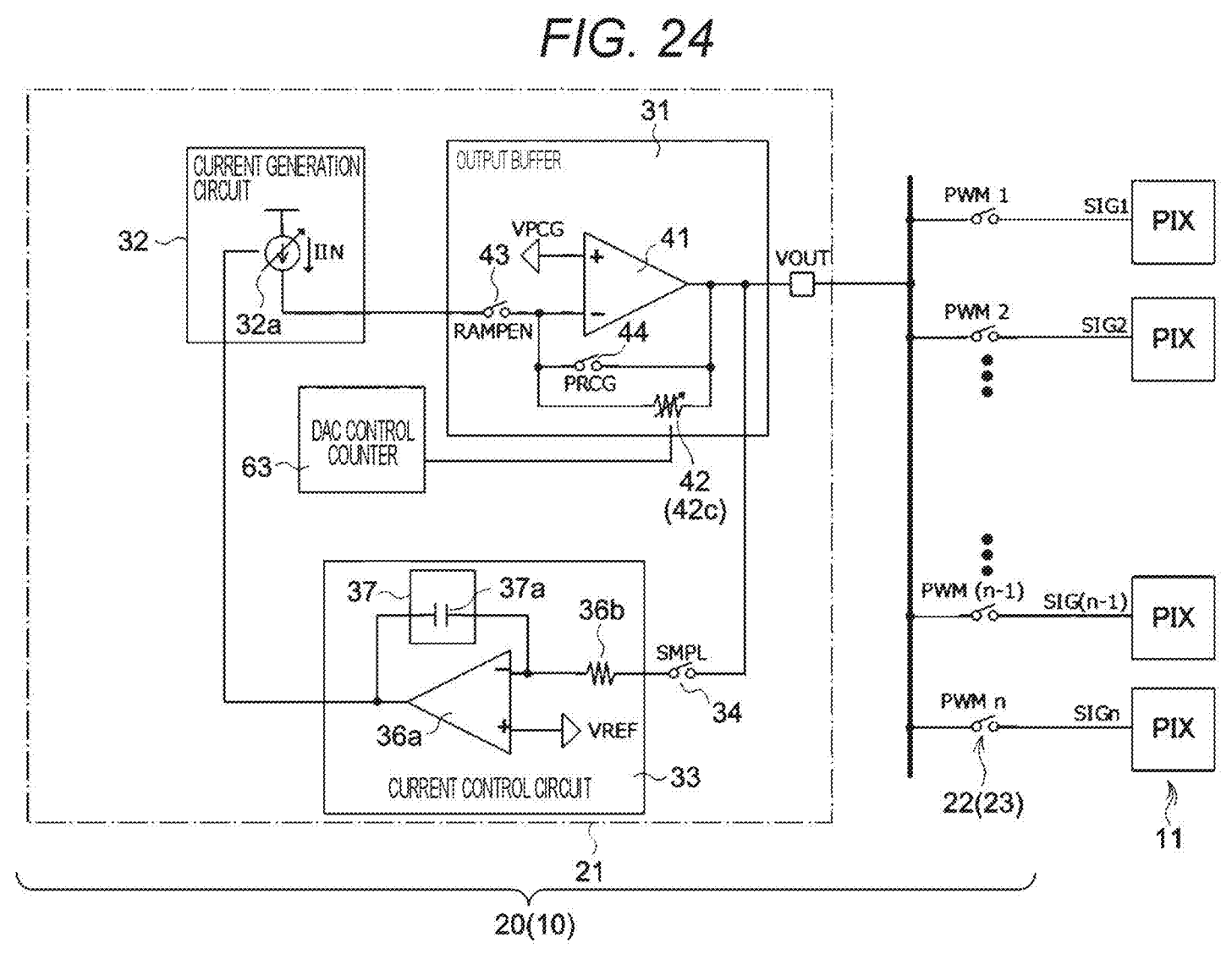
Figure 25:
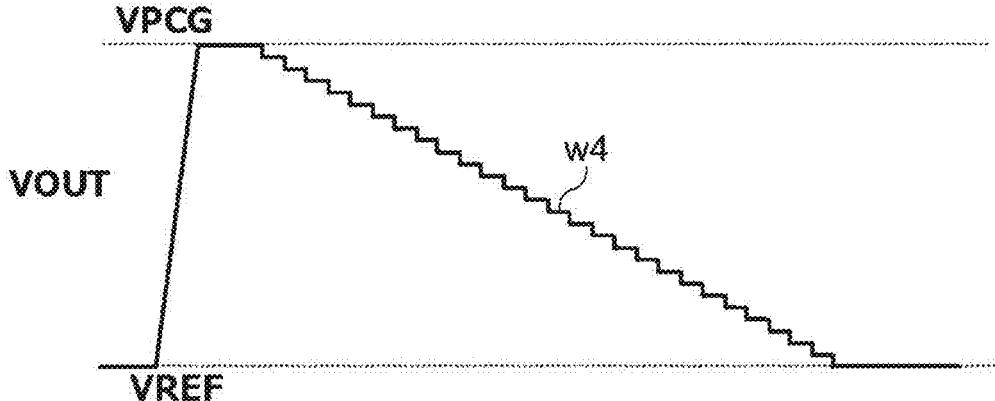
FIG. 25 is a diagram illustrating a ramp wave voltage waveform output from the output buffer of FIG. 24.

FIG. 24 is a block diagram illustrating a configuration of a main part of a display drive circuit 20 according to a ninth embodiment, and FIG. 25 is a diagram illustrating a ramp wave voltage waveform w4 output from an output buffer 31 of FIG. 24. The display drive circuit 20 of FIG. 24 includes a current control circuit 33 and a current generation circuit 32 having configurations similar to those of FIG. 8.

The output buffer 31 of FIG. 24 is different from that of FIG. 22 in the circuit configuration of a load circuit 42. The load circuit 42 of FIG. 24 includes a variable resistor 42c instead of the capacitor 42a. The resistance value of the variable resistor 42c is controlled in stages by a DAC control counter 63. More specifically, the resistance value of the variable resistor 42c increases in stages as the count value of the DAC control counter 63 increases. As a result, the ramp wave voltage decreases in stages from the precharge voltage.

A ramp wave voltage which is an output voltage of the output buffer 31 in the display drive circuit 20 of FIG. 24 is expressed by the following formula (3).

$$V(t) = VPCG - R \times I(t) \tag{3}$$

In formula (3), R is a resistance value of the variable resistor 42c, and I(t) is a current flowing through the variable resistor 42c.

As described above, in the ninth embodiment, since the load circuit 42 includes the variable resistor 42c and the resistance value of the variable resistor 42c is switched in stages, a ramp wave voltage whose voltage level changes in stages can be generated with a simple configuration.

Tenth Embodiment

Figure 26:
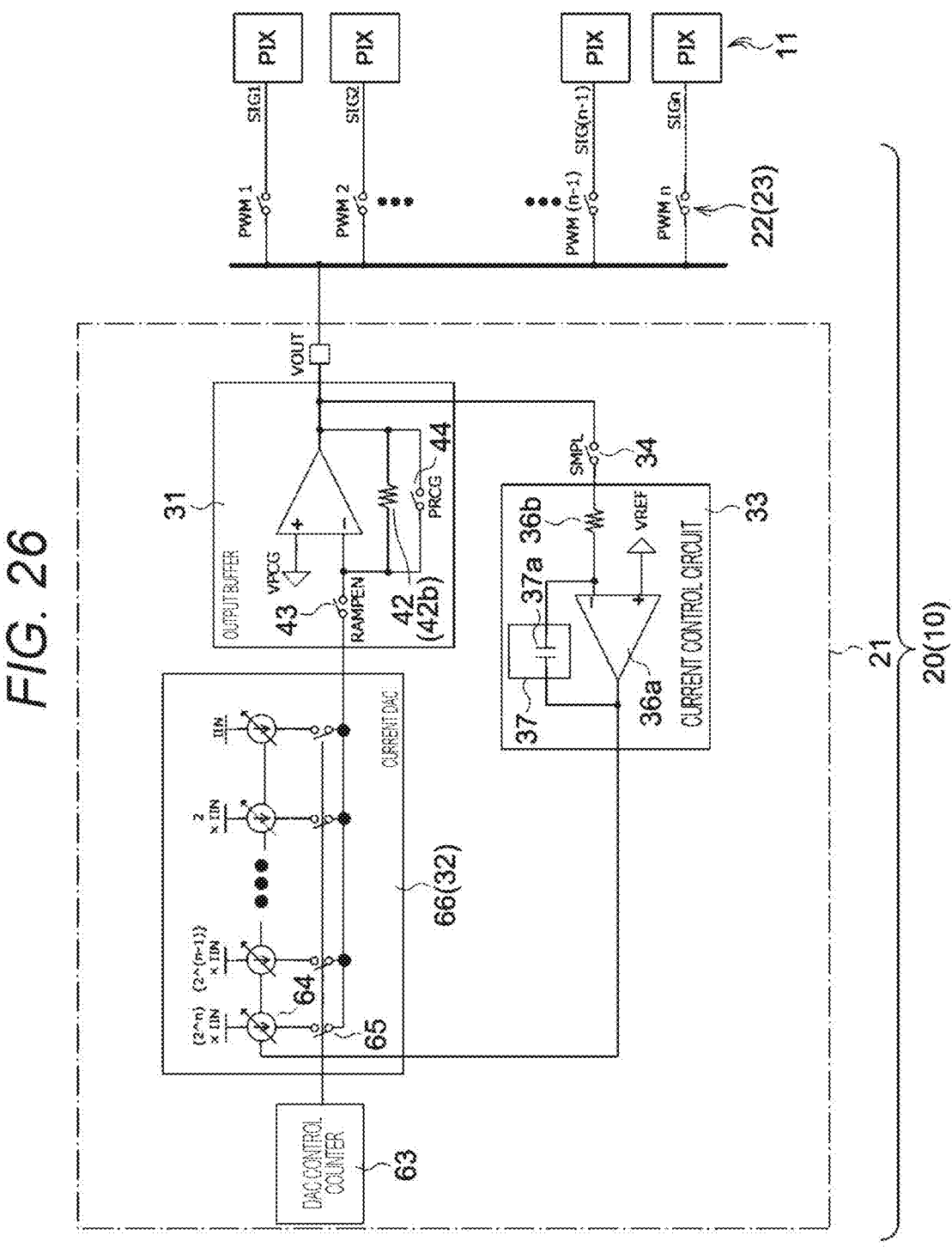
FIG. 26 is a block diagram illustrating a configuration of a main part of a display drive circuit according to a tenth embodiment.
Figure 27:
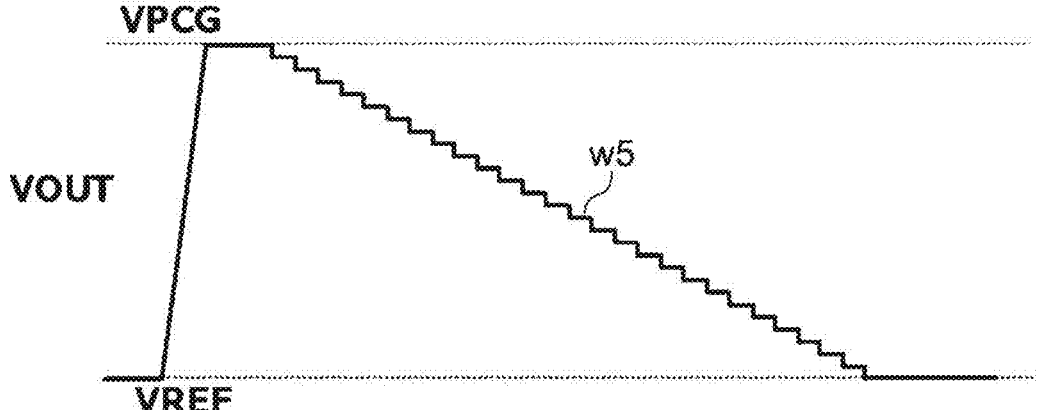
FIG. 27 is a diagram illustrating a ramp wave voltage waveform output from the output buffer of FIG. 26.

FIG. 26 is a block diagram illustrating a configuration of a main part of a display drive circuit 20 according to a tenth embodiment, and FIG. 27 is a diagram illustrating a ramp wave voltage waveform w5 output from an output buffer 31 of FIG. 26. The display drive circuit 20 of FIG. 26 includes the output buffer 31 and a current control circuit 33 having configurations similar to those of FIG. 8.

A current generation circuit 32 of FIG. 26 includes a current DAC 66 including n (n is an integer of two or more) current sources 64 through which different currents flow and n switches 65. The corresponding current source 64 and switch 65 are connected in series. Each current source 64 and each switch 65 correspond to each bit of the n-bit count value output from the DAC control counter 63. The most significant bit of the count value corresponds to the current source 64 and the switch 65 at the left end, and the least significant bit of the count value corresponds to the current source 64 and the switch 65 at the right end.

The n current sources 64 variably control a current IIN according to the comparison result signal output from a comparator 36 in the current control circuit 33. The current source 64 at the left end causes a current of $2^n \times IIN$ to flow, the current source 64 adjacent thereto causes a current of $2^{n-1} \times IIN$ to flow, the current source 64 second from the right end causes a current of $2 \times IIN$ to flow, and the current source 64 at the right end causes a current of IIN to flow. The currents flowing through the n current sources 64 and the n switches 65 are summed and supplied to a load circuit 42.

In a case where the voltage difference between the ramp wave voltage and the reference voltage is small, a small current flows from the n current sources 64 to the load circuit 42. Furthermore, since the count value of the DAC 55 counter increases toward the latter half of one horizontal line period, as illustrated in FIG. 27, a larger current flows from the n current sources 64, and the ramp wave voltage decreases further in a stepwise manner.

A ramp wave voltage V(t) output from the output buffer 31 in FIG. 26 is expressed by the following formula (4).

$$V(t) = VPCG - R \times I(t) \tag{4}$$

In formula (4), R is a resistance value of the resistive element, and I(t) is a current flowing through the resistance element.

As described above, in the tenth embodiment, since the n current sources 64 and the n switches 65 capable of finely controlling the current flowing through the load circuit 42 in stages are provided, the ramp wave voltage can be finely controlled.

Eleventh Embodiment

Figure 28:
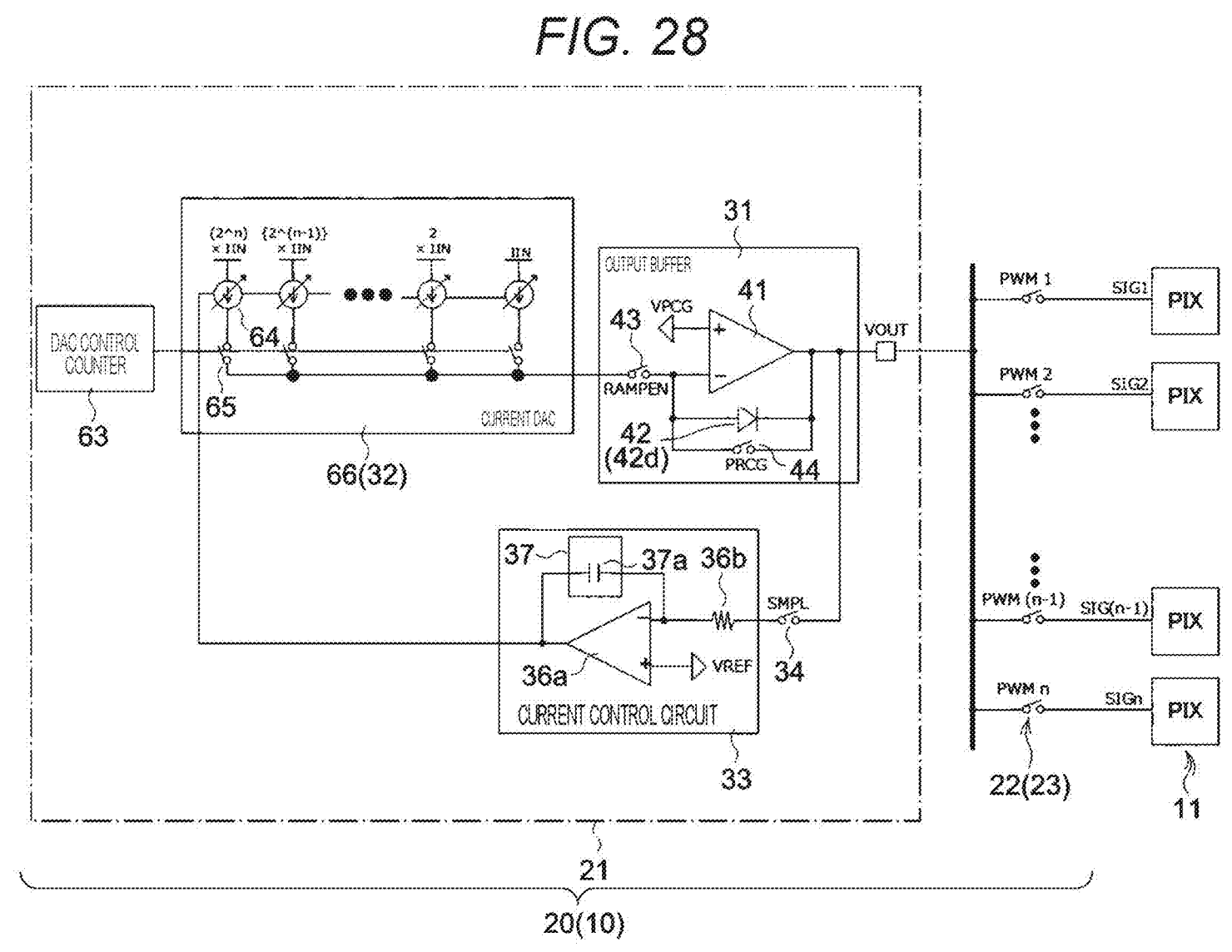
Figure 29:
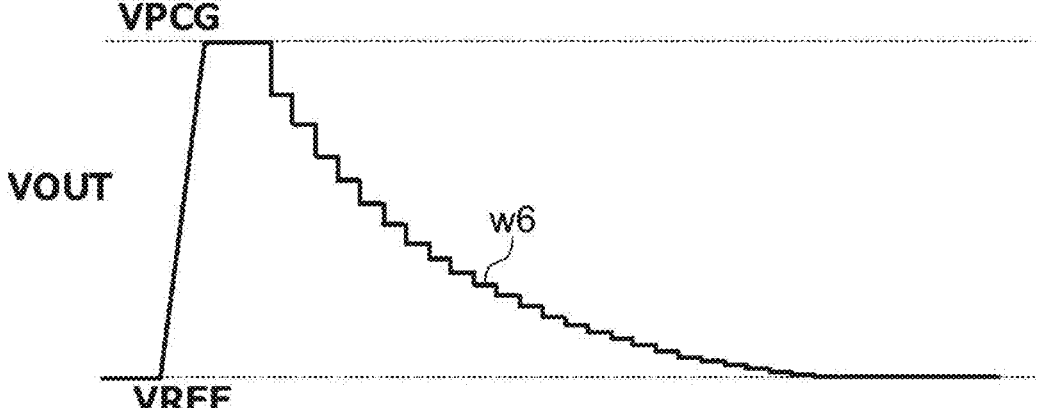
FIG. 29 is a diagram illustrating a ramp wave voltage waveform output from the output buffer of FIG. 28.

FIG. 28 is a block diagram illustrating a configuration of a main part of a display drive circuit 20 according to an eleventh embodiment, and FIG. 29 is a diagram illustrating a ramp wave voltage waveform w6 output from an output buffer 31 of FIG. 28. The display drive circuit 20 of FIG. 28 includes a current generation circuit 32 and a current control circuit 33 having configurations similar to those of FIG. 26.

A load circuit 42 in the output buffer 31 of FIG. 28 includes a diode 42d instead of the resistive element. In the diode 42d, since the relationship between the forward voltage and the forward current is nonlinear, the ramp wave voltage has a nonlinear waveform as illustrated in FIG. 29. A ramp wave voltage V(t) is expressed by the following formula (5).

$$V(t) = VPCG - Vt \times \ln \left\{ (I(t) + Is)/Is \right\} \tag{5}$$

In formula (5), Vt is the forward voltage of the diode 42d, I(t) is the current flowing through a RAMPEN switch 43, and Is is the forward current of the diode 42d.

As described above, in the eleventh embodiment, since the diode 42d is provided in the load circuit 42, the voltage level of the ramp wave voltage can be nonlinearly changed with time.

Twelfth Embodiment

Figure 30:
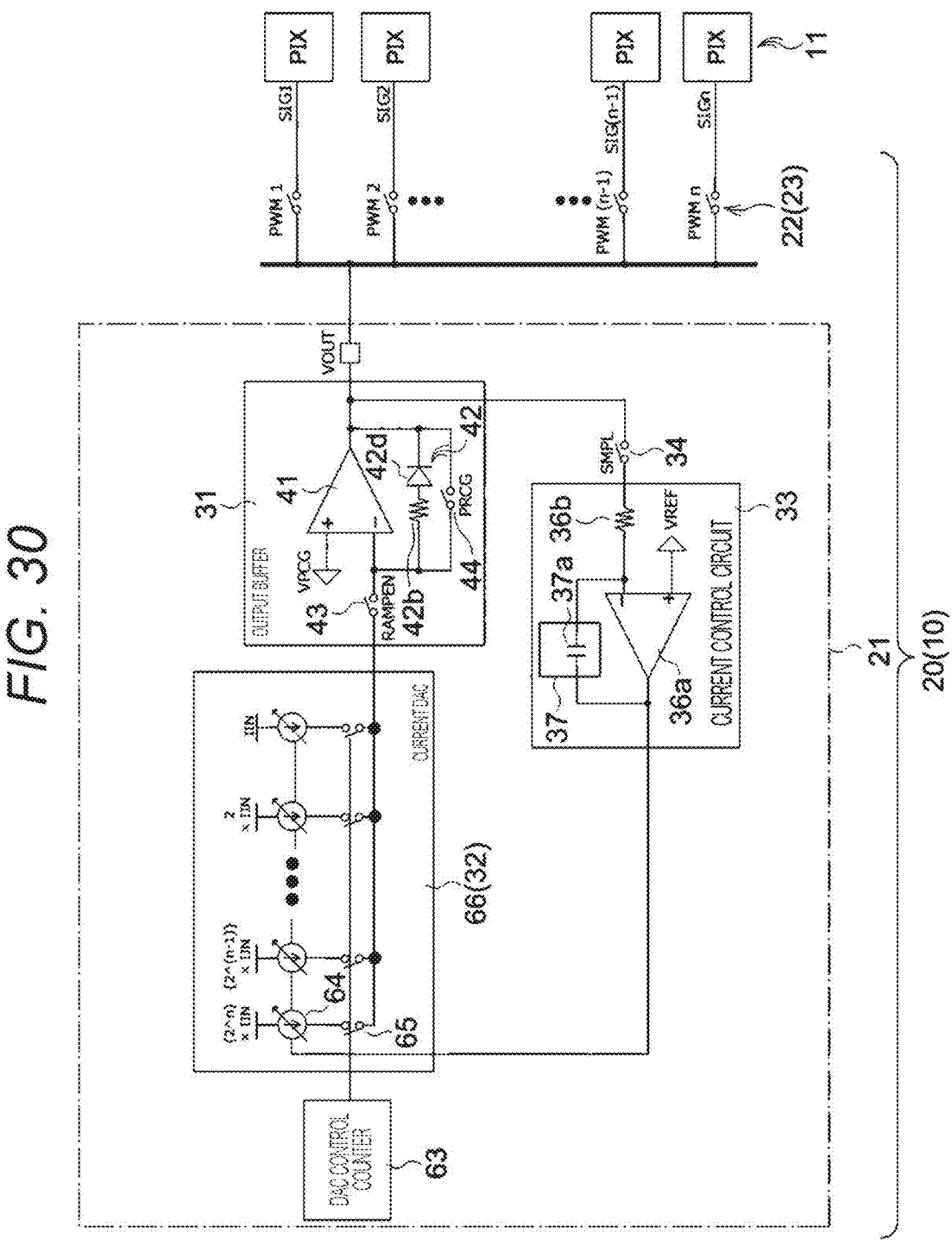
FIG. 30 is a block diagram illustrating a configuration of a main part of a display drive circuit according to a twelfth embodiment.
Figure 31:
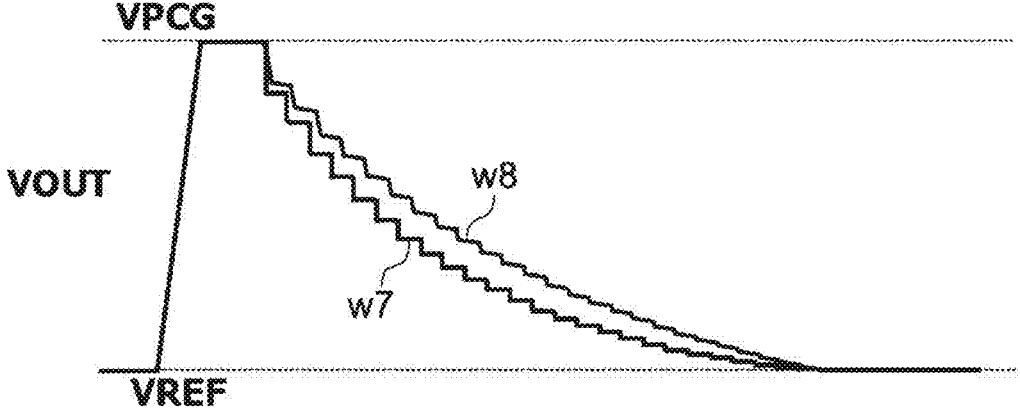
FIG. 31 is a diagram illustrating a ramp wave voltage waveform output from the output buffer of FIG. 30.

FIG. 30 is a block diagram illustrating a configuration of a main part of a display drive circuit 20 according to a twelfth embodiment, and FIG. 31 is a diagram illustrating a ramp wave voltage waveform output from an output buffer 31 of FIG. 30. The display drive circuit 20 of FIG. 30 includes a current generation circuit 32 and a current control circuit 33 having configurations similar to those of FIG. 26.

A load circuit 42 in the output buffer 31 of FIG. 30 includes a diode 42d connected in series to a resistive element 42b. FIG. 31 illustrates a waveform w7 of the ramp wave voltage in a case where load circuit 42 includes only the diode 42d, and a waveform w8 of the ramp wave voltage in a case where load circuit 42 includes the resistive element 42b and the diode 42d connected in series.

As can be seen by comparing the waveforms w7 and w8, the non-linear shape of the ramp wave voltage can be made close to a linear shape by connecting the resistive element 42b in series to the diode 42d.

A ramp wave voltage V(t) output from the output buffer 31 in FIG. 30 is expressed by the following formula (6).

$$V(t) = VPCG - \{R \times I(t) + Vt \times In\{ (I(t) + Is)/Is\} \} \qquad (6)$$

In formula (6), R is the resistance value of the resistive element 42b, I(t) is the current flowing through a RAMPEN switch 43, Vt is the forward voltage of the diode 42d, and Is is the forward current of the diode 42d.

As described above, in the twelfth embodiment, since the resistive element 42b and the diode 42d connected in series are provided in the load circuit 42, the nonlinear shape of the waveform of the ramp wave voltage can be made into a desired shape by optimizing the resistance value of the resistive element 42b.

Thirteenth Embodiment

Figure 32:
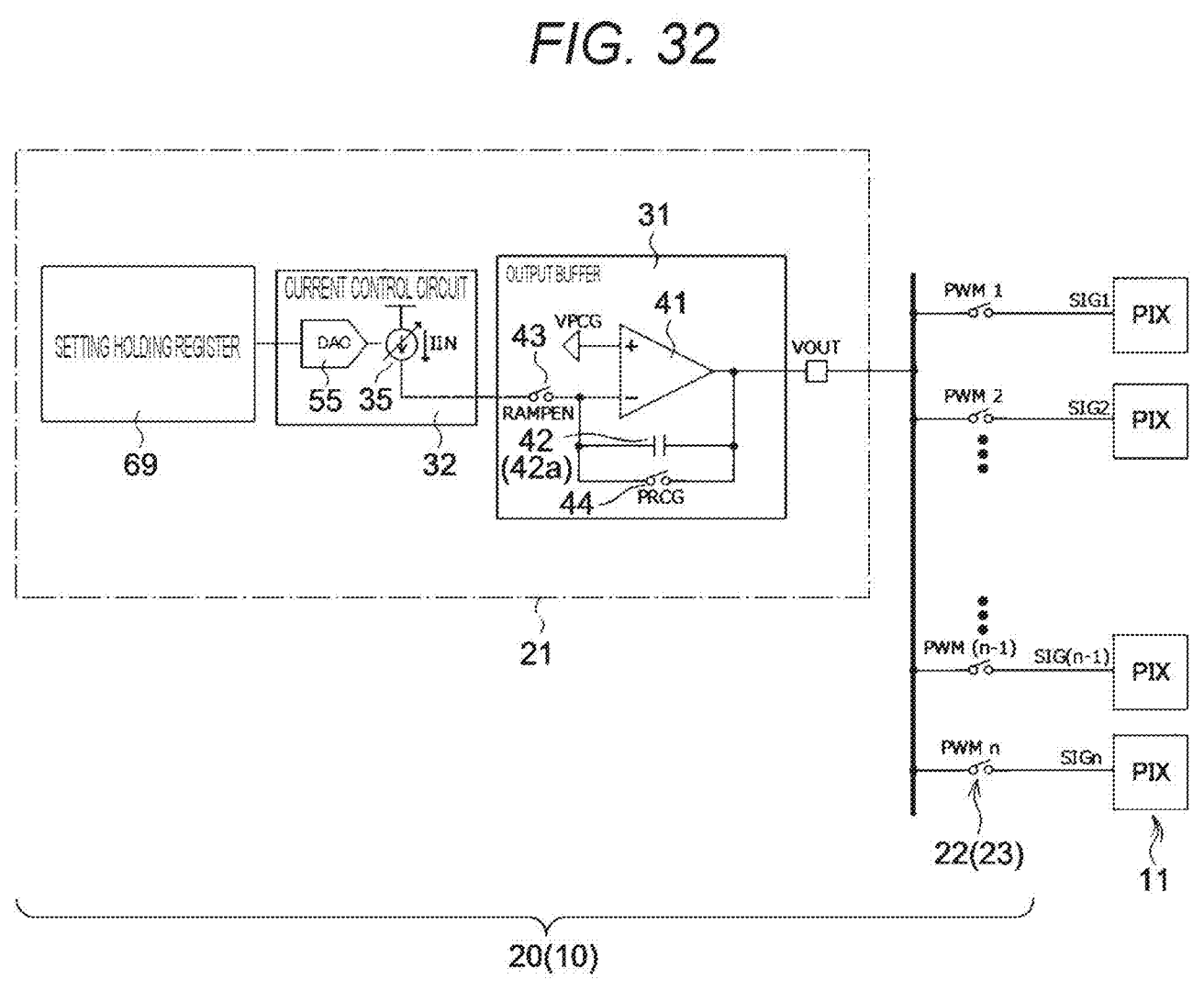

FIG. 32 is a block diagram illustrating a configuration of a main part of a display drive circuit 20 according to a thirteenth embodiment. The display drive circuit 20 of FIG. 32 includes an output buffer 31 and a current generation circuit 32 having configurations similar to those of FIG. 18. The display drive circuit 20 of FIG. 32 includes a setting holding register 69 instead of the current control circuit 33.

In the thirteenth embodiment, before the display drive circuit 20 or a display device 1 including the display drive circuit 20 is shipped, the ramp wave voltage which is the output voltage of the output buffer 31 is monitored, and the current to flow to a load circuit 42 and the control value of a variable current source 35 for flowing the current are detected in advance. Then, the display drive circuit 20 is shipped after the control value is stored in the setting holding register 69.

During operation, the current generation circuit 32 in the display drive circuit 20 causes a current to flow from the variable current source 35 to the load circuit 42 on the basis of a control signal obtained by DA-converting the control value stored in the setting holding register 69 by a DAC 55, and adjusts the voltage level of the ramp wave voltage.

As described above, in the thirteenth embodiment, the current to flow to the load circuit 42 is detected in advance, and the control value is stored in the setting holding register 69 such that the detected current flows to the load circuit 42. Therefore, it is not necessary to control the current of the variable current source 35 by feeding back the ramp wave voltage, and the configuration of the display drive circuit 20 can be simplified.

Fourteenth Embodiment

Figure 33:
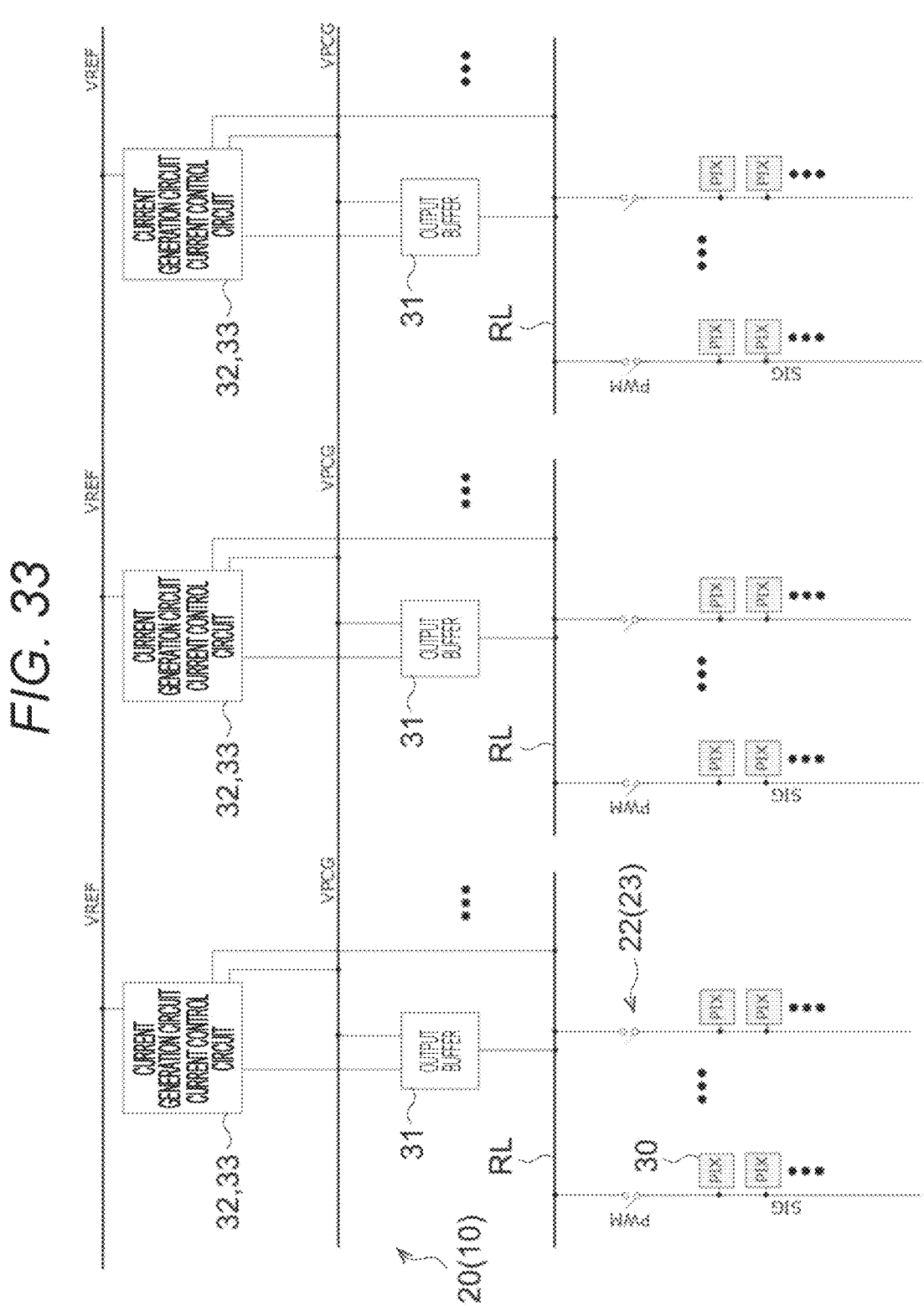
FIG. 33 is a block diagram illustrating a configuration of a main part of a display drive circuit according to a fourteenth embodiment.
Figure 34:
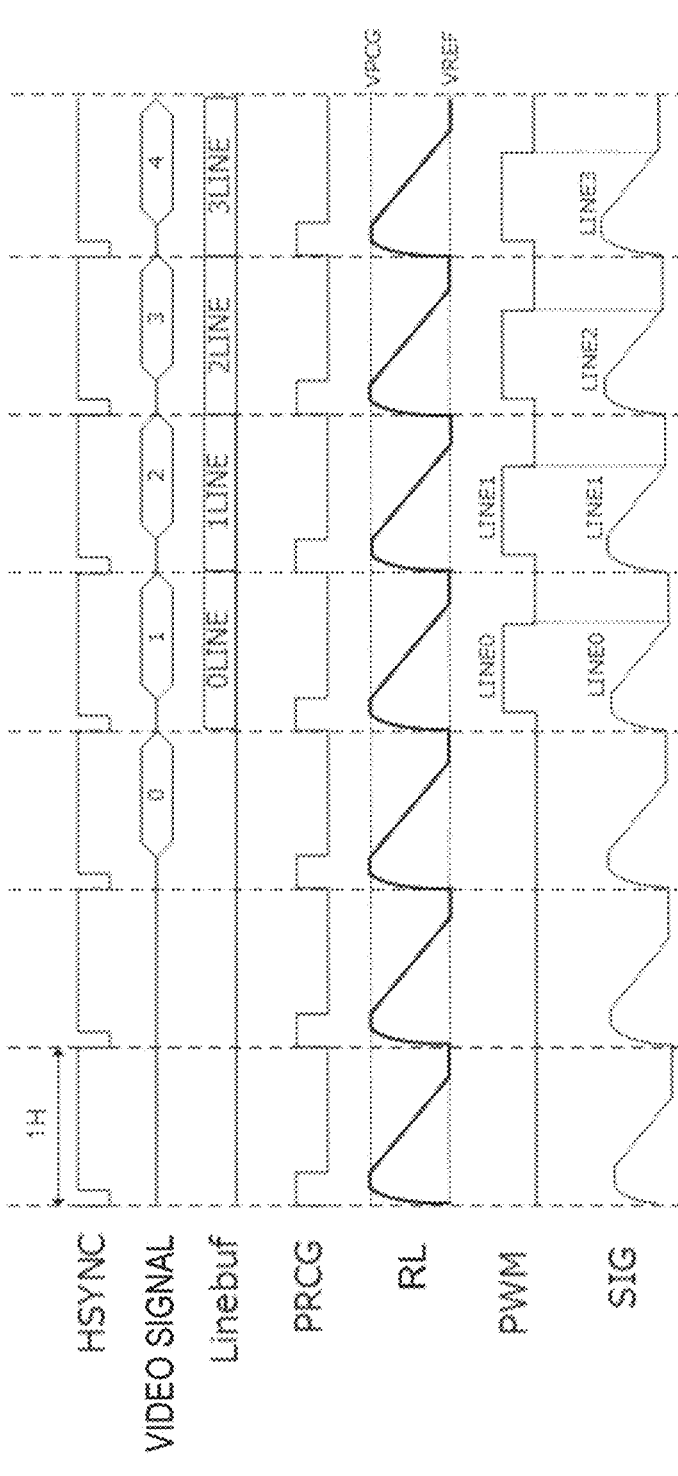
FIG. 34 is an operation timing diagram of the display drive circuit of FIG. 33.

FIG. 33 is a block diagram illustrating a configuration of a main part of a display drive circuit 20 according to a fourteenth embodiment, and FIG. 34 is an operation timing diagram of the display drive circuit 20 of FIG. 33. A plurality of signal lines arranged at regular intervals in the horizontal direction in a pixel array unit 11 is divided into a plurality of signal line groups using two or more signal lines as one signal line group, and each of the signal line groups includes a current generation circuit 32, an output buffer 31, and a current control circuit 33. The ramp wave voltage output from the output buffer 31 of each signal line group is supplied to each signal line in the same signal line group via each PWM switch 23 in the same signal line group.

In the display drive circuit 20 of FIG. 33, as shown in FIG. 34, the cycle of the ramp wave voltage is set to one horizontal line period. In addition, an offset voltage is not supplied to each signal line. In each horizontal line period, the ramp wave voltage at the falling timing of the PWM signal is written as a signal line voltage to the corresponding signal line.

Figure 35:
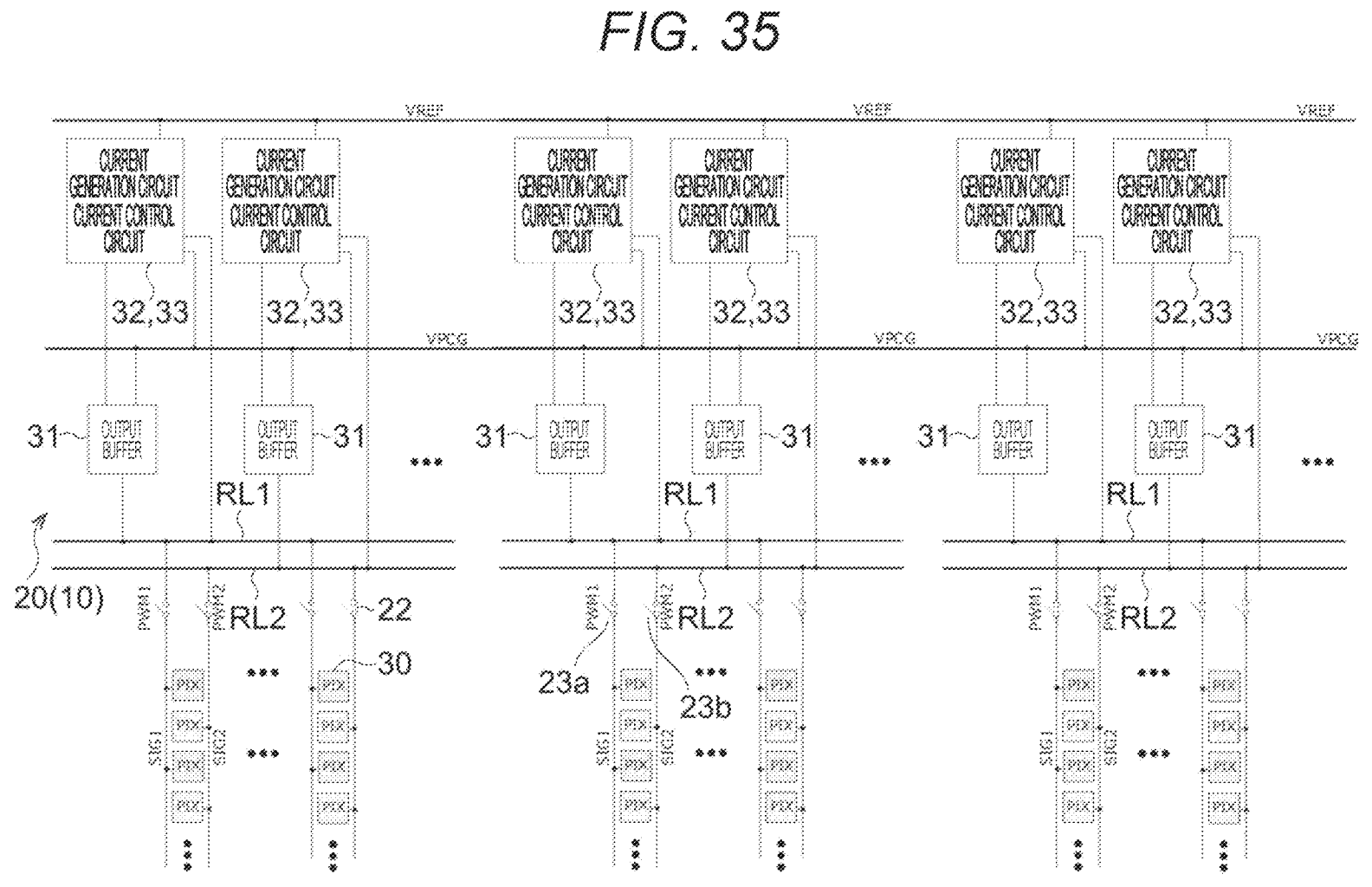
Figure 36:
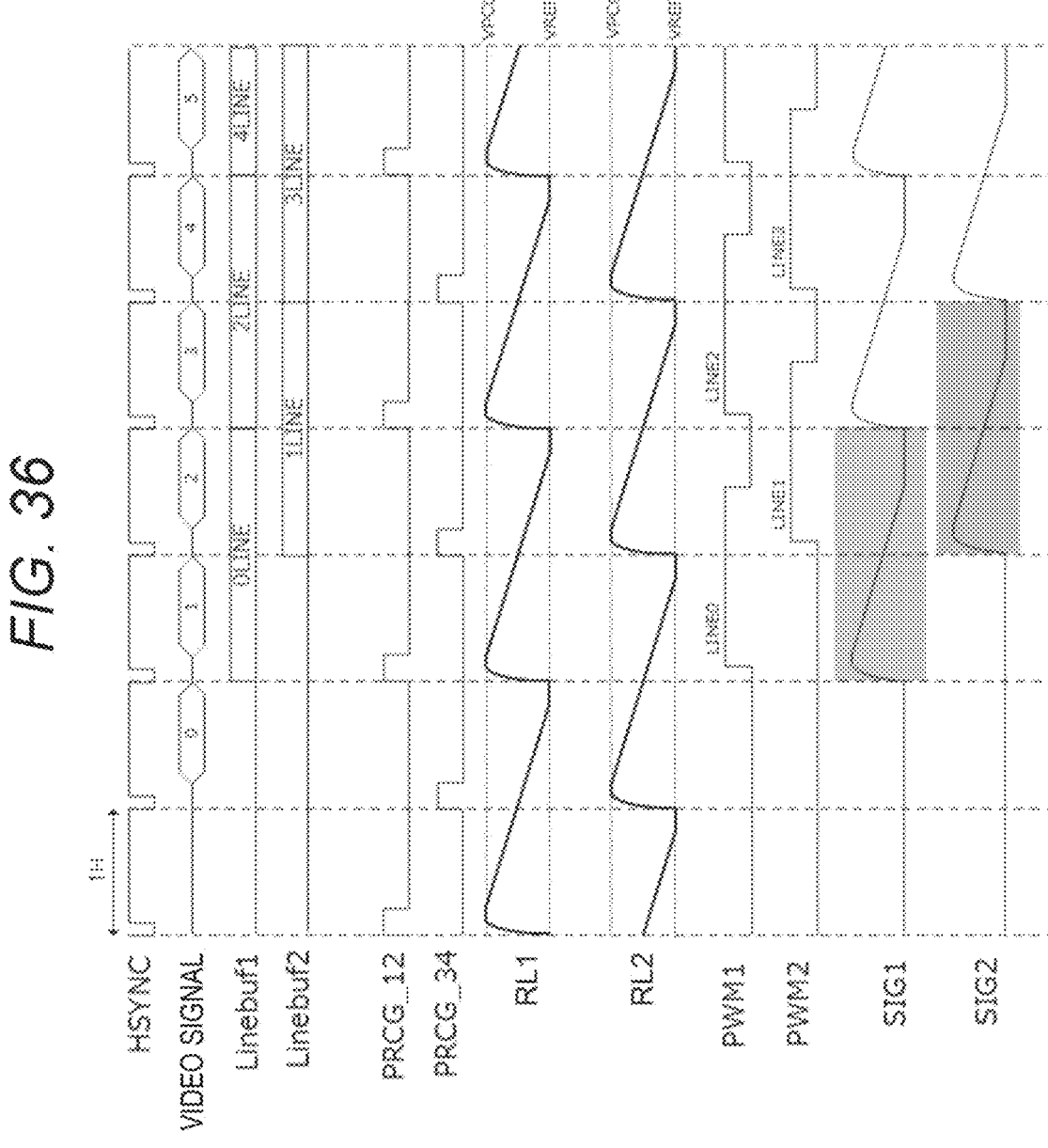
FIG. 36 is an operation timing diagram of the display drive circuit of FIG. 35.

FIG. 35 is a block diagram illustrating a configuration of a main part of a display drive circuit 20 according to a first modification of FIG. 33, and FIG. 36 is an operation timing diagram of the display drive circuit 20 of FIG. 35. The display drive circuit 20 of FIG. 35 includes a signal line SIG1 connected to the pixel rows of the odd-numbered lines arranged in the vertical direction, and a signal line SIG2 connected to the pixel rows of the even-numbered rows arranged in the vertical direction. Ramp wiring RL1 is connected to the signal line SIG1 via a PWM1 switch 23a, and ramp wiring RL2 is connected to the signal line SIG2 via a PWM2 switch 23b. The ramp wave voltage on the ramp wiring RL1 and the ramp wave voltage on the ramp wiring RL2 have a cycle of two horizontal line periods, and there is a phase shift of one horizontal line period from each other. Both the PWM1 signal for switching on and off the PWM1 switch 23a and the PWM2 signal for switching on and off the PWM2 switch 23b are cycles of two horizontal line periods, and there is a phase shift of one horizontal line period from each other. The voltages of the signal line SIG1 and the signal line SIG2 also have a cycle of two horizontal line periods, and there is a phase shift of one horizontal line period from each other.

Figure 37:
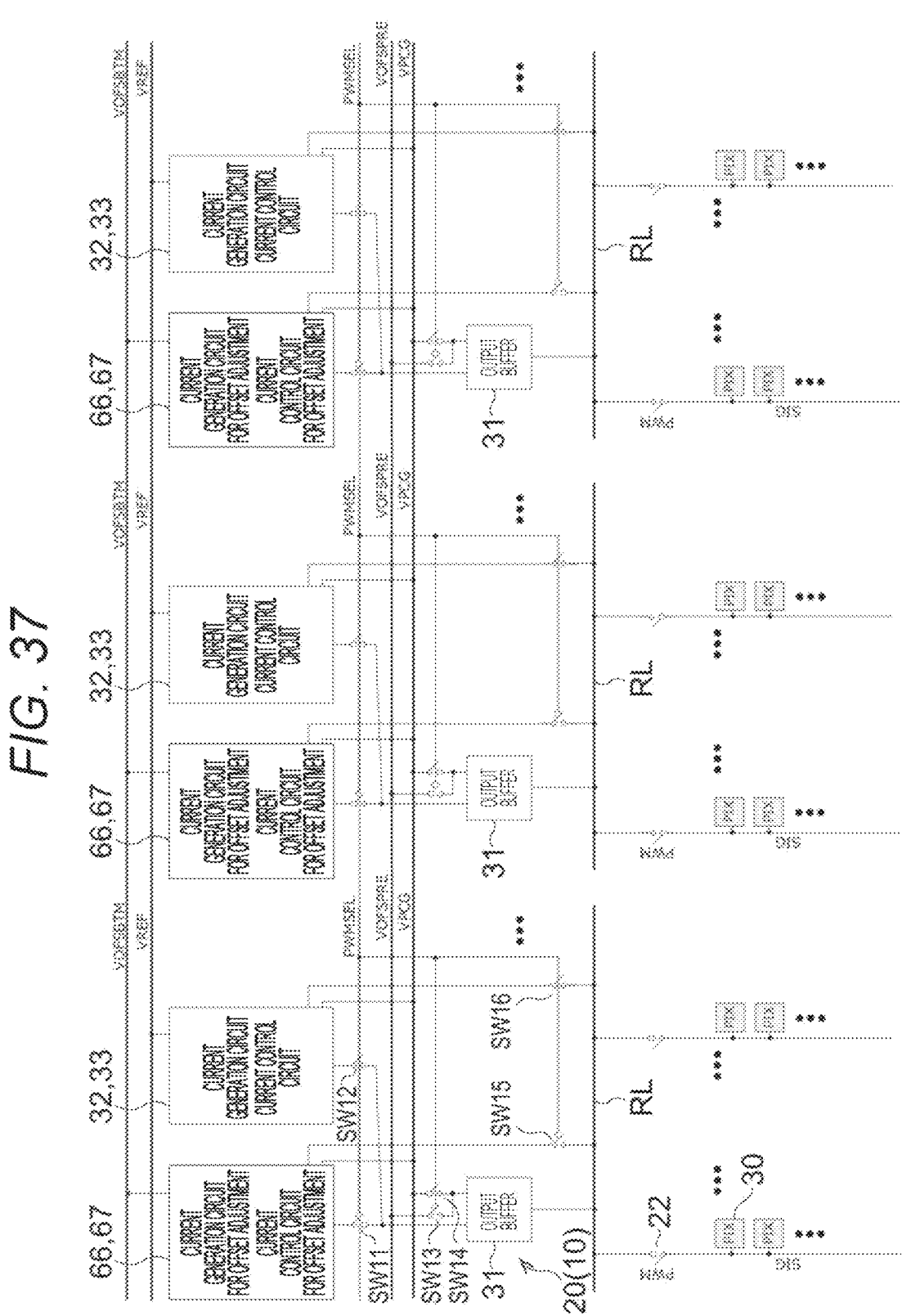
FIG. 37 is a block diagram illustrating a configuration of a main part of a display drive circuit according to a second modification of FIG. 33.
Figure 38:
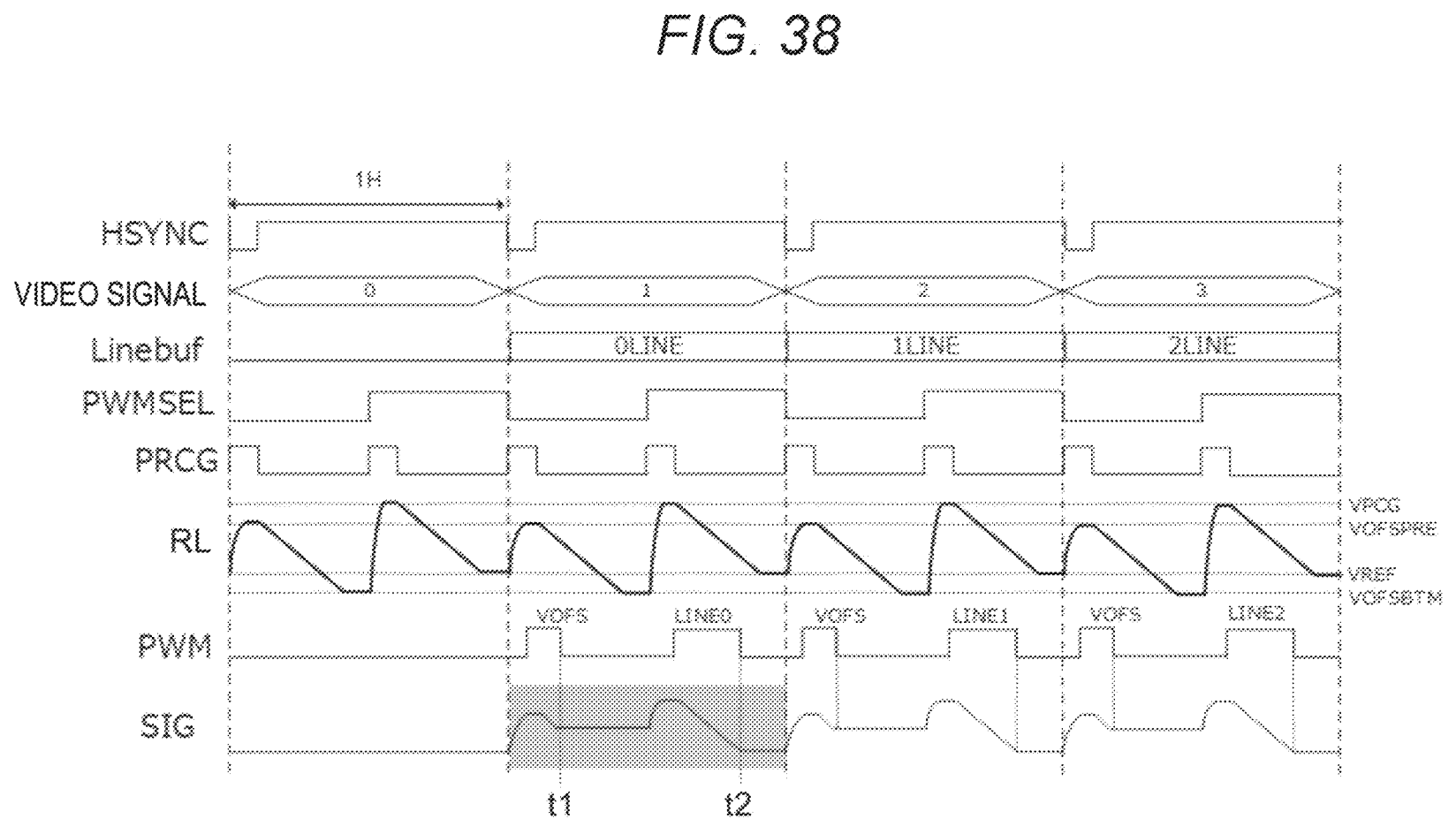

FIG. 37 is a block diagram illustrating a configuration of a main part of a display drive circuit 20 according to a second modification of FIG. 33, and FIG. 38 is an operation timing diagram of the display drive circuit 20 of FIG. 37. The display drive circuit 20 of FIG. 37 has a configuration in which a current generation circuit 66 and a current control circuit 67 for offset adjustment are added, and switches SW11 to SW16 are also added to the display drive circuit 20 of FIG. 33.

The switch SW11 switches whether or not to flow a current from the current generation circuit 66 for offset adjustment to an output buffer 31. The switch SW12 switches whether or not to flow a current from a current generation circuit 32 for signal voltage writing to the output buffer 31. The switch SW13 switches whether or not to supply an offset precharge voltage VOFSPRE to the output buffer 31. The switch SW14 switches whether or not to supply a precharge voltage VPCG to the output buffer 31. The switch SW15 performs switching control of whether or not to feed back the ramp wave voltage to the current control circuit 67 for offset adjustment. The switch SW16 performs switching control of whether or not to feed back the ramp wave voltage to a current control circuit 33.

As illustrated in FIG. 38, the ramp wave voltage for offset adjustment is supplied to the ramp wiring RL in the first half of one horizontal line period, and the ramp wave voltage for signal line writing is supplied to the ramp wiring RL in the latter half of one horizontal line period.

The ramp wave voltage for offset adjustment is held at the falling edge of the PWM signal for offset adjustment, and is written in the signal line (time t1). Thereafter, the ramp wave voltage for signal line writing is held at the falling edge of the PWM signal for signal line writing, and is written in the signal line (time t2).

Figure 39:
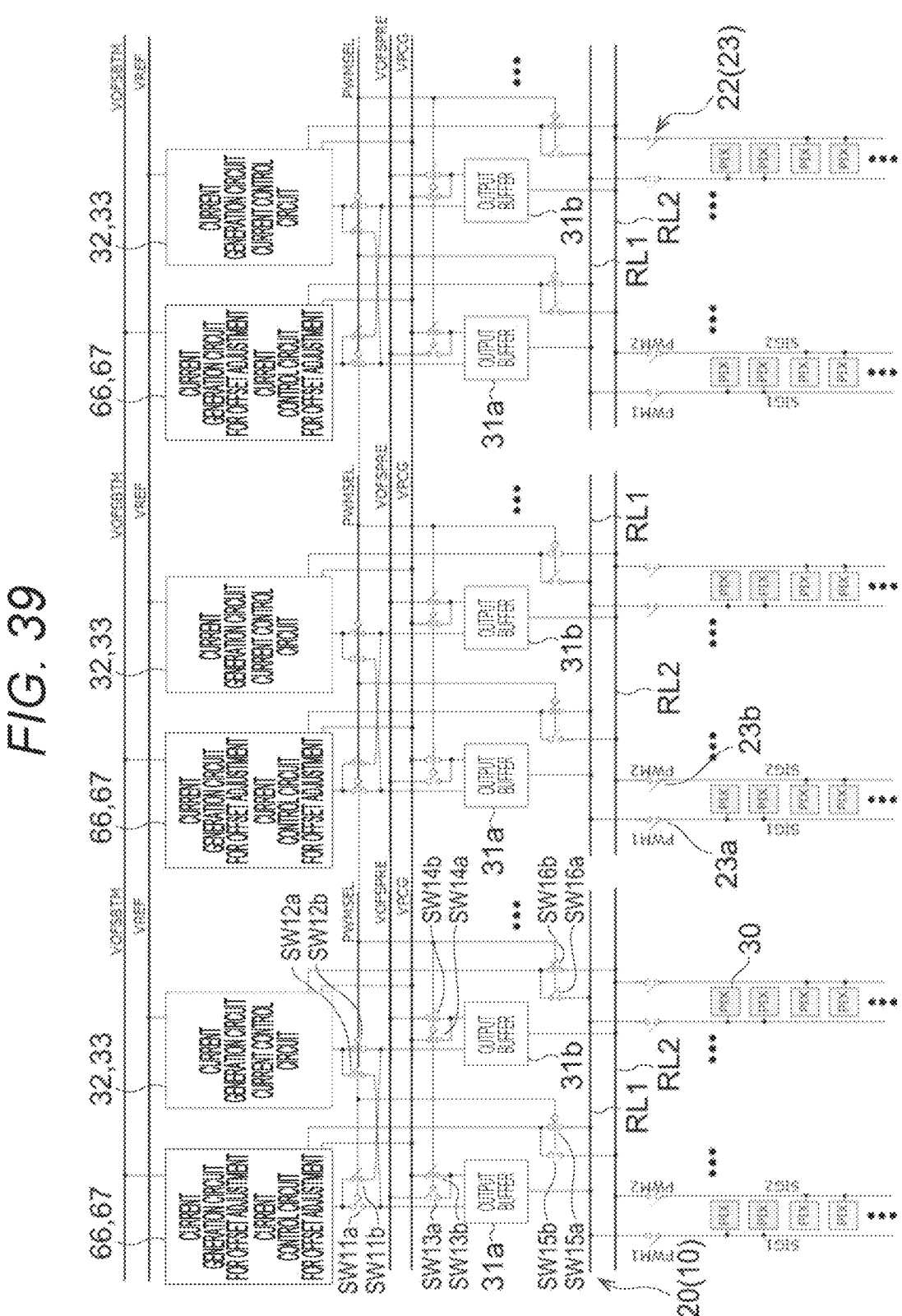
FIG. 39 is a block diagram illustrating a configuration of a main part of a display drive circuit according to a third modification of FIG. 33.
Figure 40:
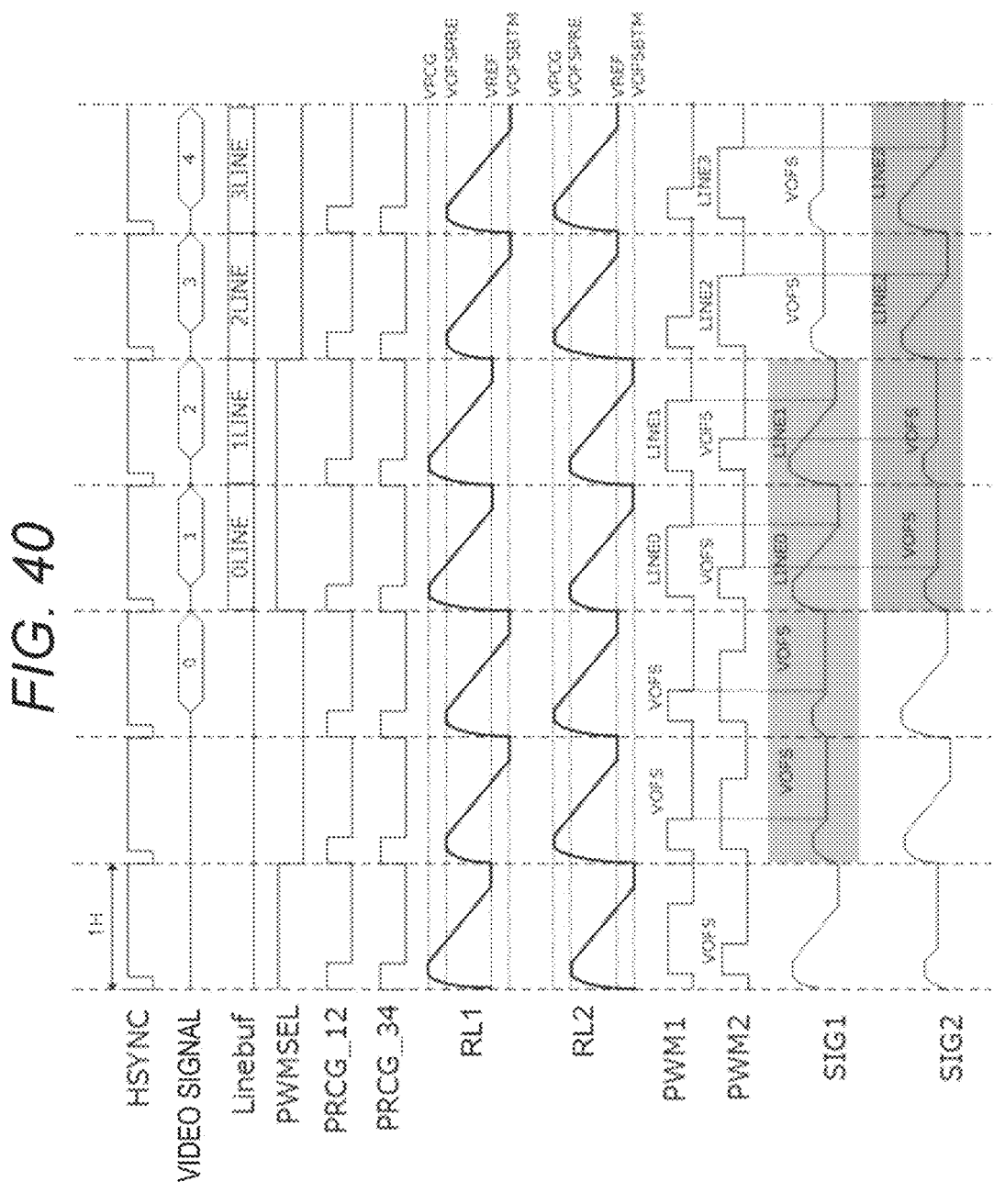
FIG. 40 is an operation timing diagram of the display drive circuit of FIG. 39.

FIG. 39 is a block diagram illustrating a configuration of a main part of a display drive circuit 20 according to a third modification of FIG. 33, and FIG. 40 is an operation timing diagram of the display drive circuit 20 of FIG. 39. The display drive circuit 20 of FIG. 39 has a configuration in which a current generation circuit 66 and a current control circuit 67 for offset adjustment are added, and switches SW11*a*, SW1*b*, SW12*a*, SW12*b*, SW13*a*, SW13*b*, SW14*a*, SW14*b*, SW15*a*, and SW15*b* are also added to the display drive circuit 20 of FIG. 35. In addition, two output buffers 31 (hereinafter referred to as first output buffer 31*a* and second output buffer 31*b*) are provided for each signal line group including two or more signal lines.

The switch SW11*a* switches whether or not to flow a current from the current generation circuit 66 for offset adjustment to the first output buffer 31*a*. The switch SW11*b* switches whether or not to flow a current from the current generation circuit 66 for offset adjustment to the second output buffer 31*b*. The switch SW12*a* switches whether or not to flow a current from the current generation circuit 32 for signal voltage writing to the first output buffer 31*a*. The switch SW11*b* switches whether or not to flow a current from the current generation circuit 32 for signal voltage writing to the second output buffer 31*b*.

The switch SW13*a* switches whether or not to supply an offset precharge voltage VOFSPRE to the first output buffer 31*a*. The switch SW13*b* switches whether or not to supply a precharge voltage VPCG to the first output buffer 31*a*. The switch SW14*a* switches whether or not to supply the pre-charge voltage VPCG to the second output buffer 31*b*. The switch SW14*b* switches whether or not to supply the offset precharge voltage VOFSPRE to the second output buffer 31*b*. The switch SW15*a* performs switching control of whether or not to feed back the ramp wave voltage on ramp wiring RL1 to the current control circuit 67 for offset adjustment. The switch SW15*b* performs switching control of whether or not to feed back the ramp wave voltage on ramp wiring RL2 to the current control circuit 67 for offset adjustment. The switch SW16*a* performs switching control of whether or not to feed back the ramp wave voltage on the ramp wiring RL1 to the current control circuit 33. The switch SW16*b* performs switching control of whether or not to feed back the ramp wave voltage on the ramp wiring RL2 to the current control circuit 33.

As illustrated in FIG. 40, among four pixel rows adjacent in the vertical direction, the ramp wiring RL1 is connected to two adjacent pixel rows via a PWM1 switch 23*a*, and the ramp wiring RL2 is connected to the remaining two pixel rows via a PWM2 switch 23*b*. During the period in which the offset voltage is supplied to the ramp wiring RL1, the ramp wave voltage is supplied to the ramp wiring RL2. In addition, during the period in which the ramp wave voltage is supplied to the ramp wiring RL1, the offset voltage is supplied to the ramp wiring RL2. Whether to supply the ramp wave voltage or the offset voltage to the ramp wiring RL1 and the ramp wiring RL2 is switched every two horizontal line periods.

Figure 41:
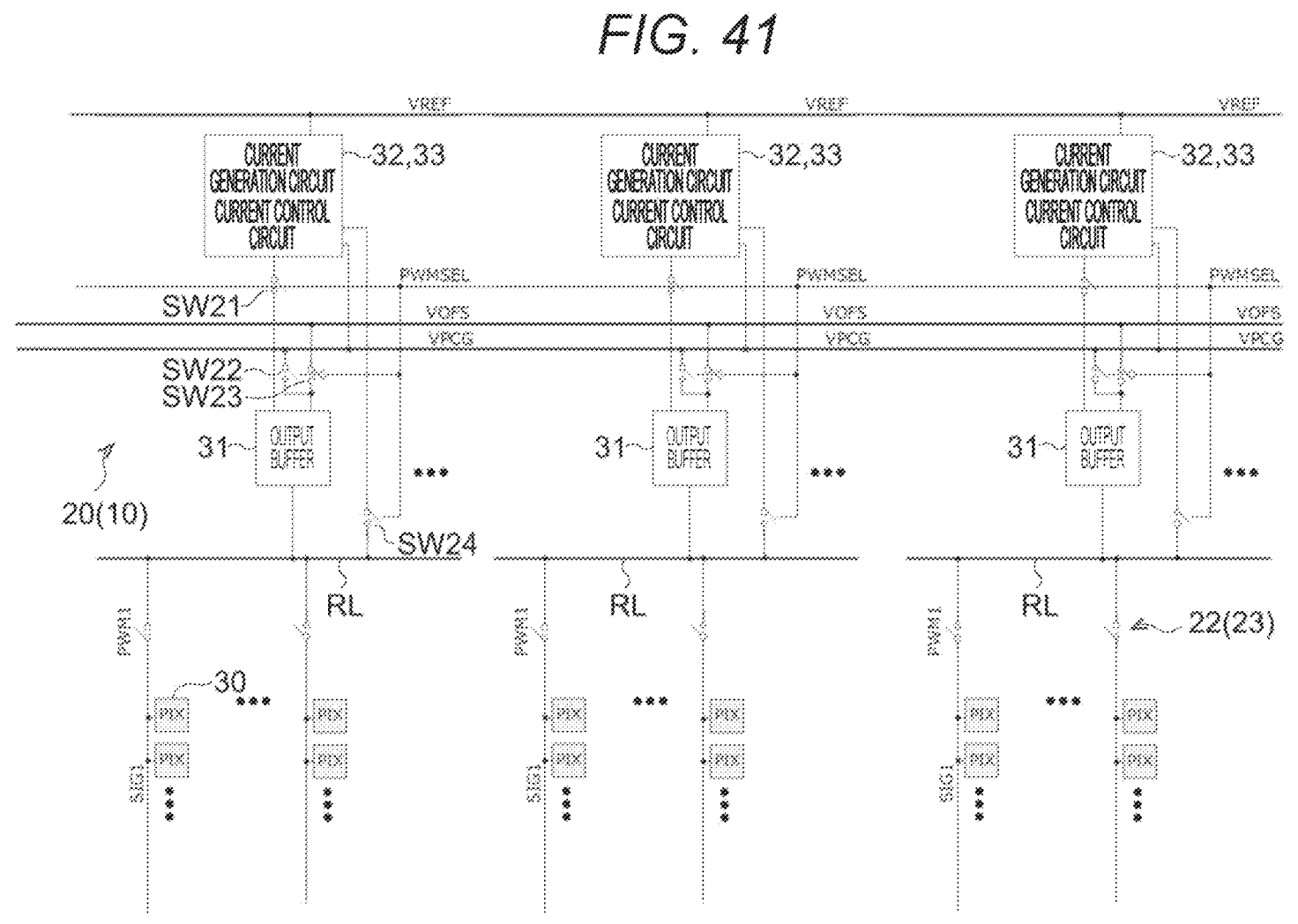
Figure 42:
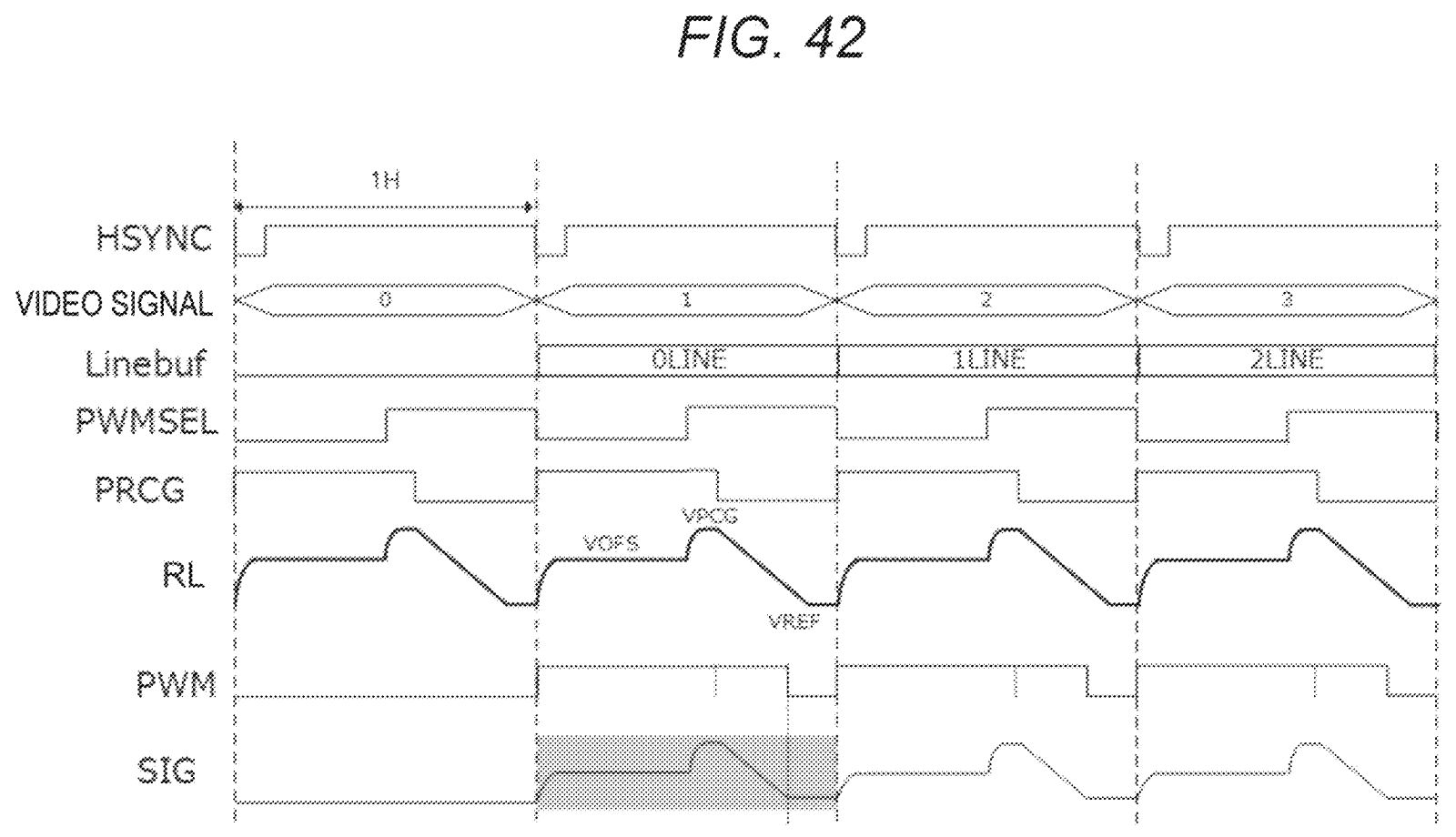

FIG. 41 is a block diagram illustrating a configuration of a main part of a display drive circuit 20 according to a fourth modification of FIG. 33, and FIG. 42 is an operation timing diagram of the display drive circuit 20 of FIG. 41.

The display drive circuit 20 of FIG. 41 includes switches SW21 to SW24 in addition to the circuit configuration of FIG. 33. The switch SW21 is connected to an output path of the current generation circuit 32. The switch SW22 switches whether or not to supply a precharge voltage VPCG to an output buffer 31. The switch SW23 switches whether or not to supply an offset voltage VOFS to the output buffer 31. The switch SW24 performs switching control of whether or not to feed back the ramp wave voltage on ramp wiring RL to a current control circuit 33.

1 In the first half of one horizontal line period, the switches SW21 and SW22 are turned off, and the switch SW23 is turned on. At this time, the output buffer 31 functions as a voltage follower, and the offset voltage VOFS is supplied to the ramp wiring RL.

In the second half of one horizontal line period, the switches SW21 and SW22 are turned on, and the switch SW23 is turned off. At this time, the output buffer 31 supplies the ramp wave voltage to the ramp wiring RL.

Figure 43:
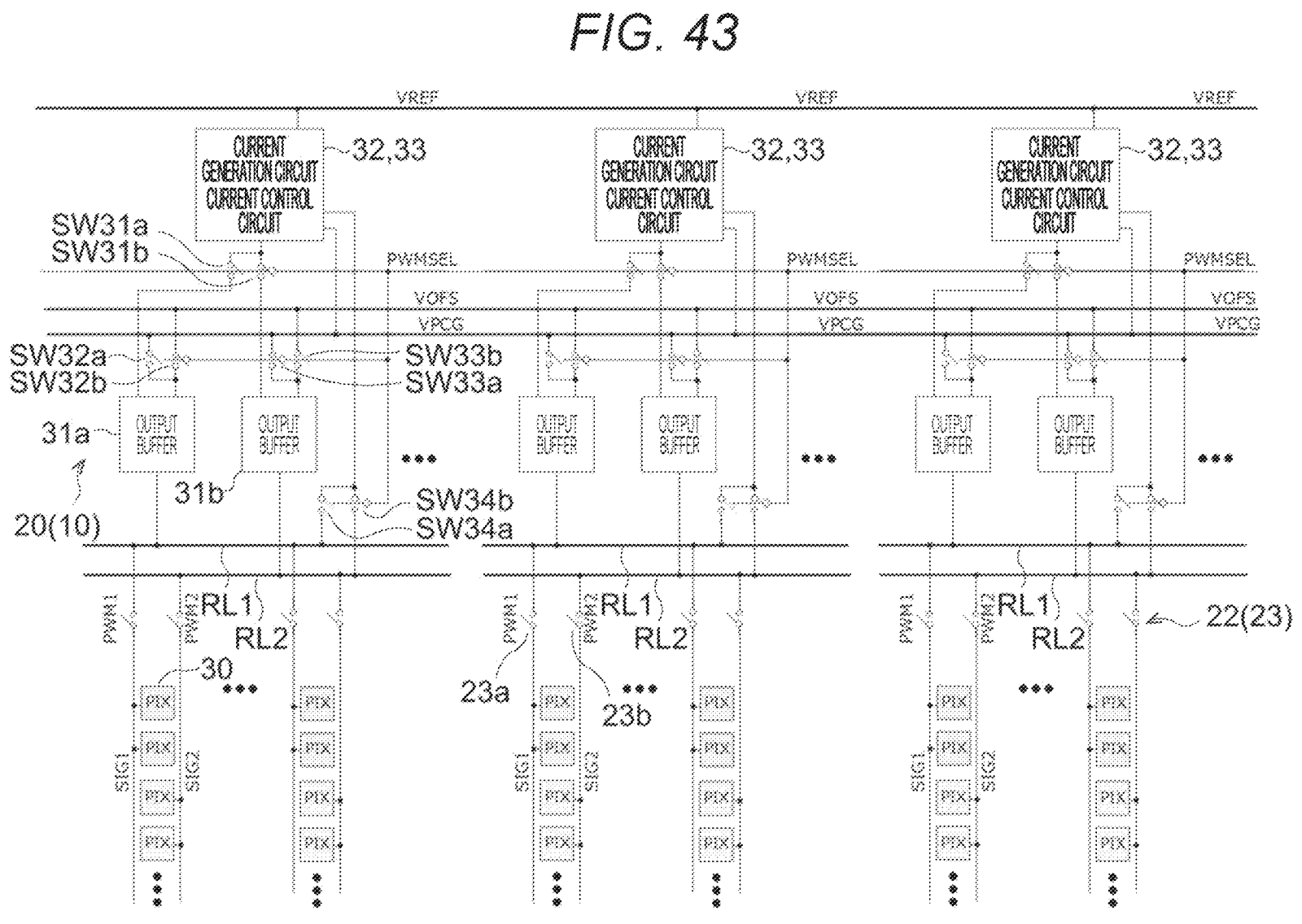
Figure 44:
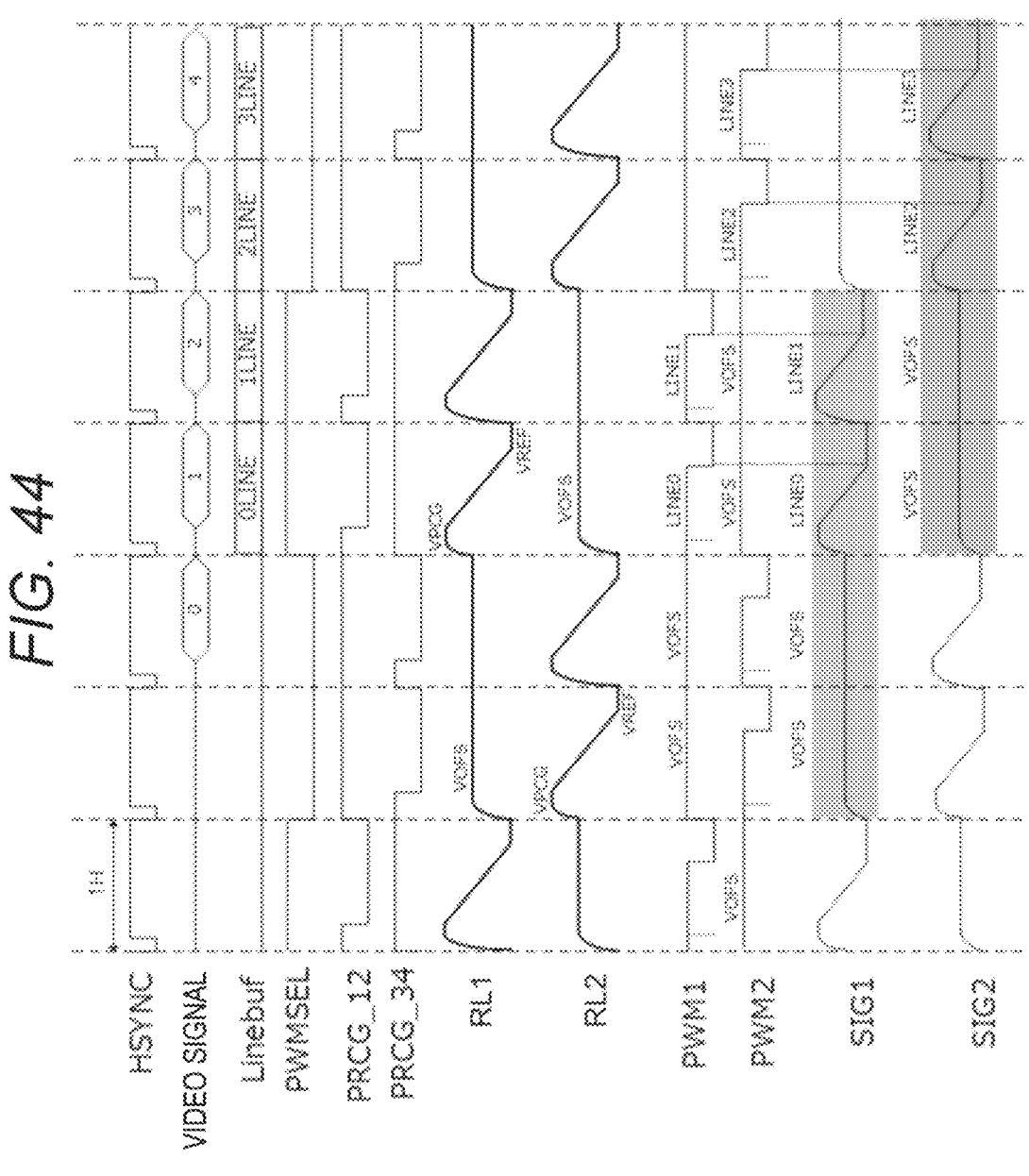
FIG. 44 is an operation timing diagram of the display drive circuit of FIG. 43.

FIG. 43 is a block diagram illustrating a configuration of a main part of a display drive circuit 20 according to a fifth modification of FIG. 33, and FIG. 44 is an operation timing diagram of the display drive circuit 20 of FIG. 43.

The display drive circuit 20 of FIG. 43 includes, as one signal line group, two or more signal lines arranged in the horizontal direction, one current generation circuit 32, one current control circuit 33, two output buffers 31 (hereinafter referred to as first output buffer 31*a* and second output buffer 31*b*), and switches SW21*a*, SW31*b*, SW32*a*, SW32*b*, SW33*a*, SW33*b*, SW34*a*, and SW34*b* for each signal line group.

The switch SW31*a* switches whether or not to flow a current from the current generation circuit 32 to the first output buffer 31*a*. The switch SW31*b* switches whether or not to flow a current from the current generation circuit 32 to the second output buffer 31*b*. The switch SW32*a* switches whether or not to supply a precharge voltage VPCG to the first output buffer 31*a*. The switch SW32*b* switches whether or not to supply an offset voltage VOFS to the first output buffer 31*a*. The switch SW33*a* switches whether or not to supply the precharge voltage VPCG to the second output buffer 31*b*. The switch SW33*b* switches whether or not to supply the offset voltage VOFS to the second output buffer 31*b*.

The switch SW34*a* switches whether or not to feed back the ramp wave voltage on ramp wiring RL1 to the current control circuit 33. The switch SW34*b* switches whether or not to feed back the ramp wave voltage on ramp wiring RL2 to the current control circuit 33.

As illustrated in FIG. 44, among four pixel rows adjacent in the vertical direction, the ramp wiring RL1 is connected to two adjacent pixel rows via a PWM1 switch 23*a*, and the ramp wiring RL2 is connected to the remaining two pixel rows via a PWM2 switch 23*b*. During the period in which the offset voltage is supplied to the ramp wiring RL1, the ramp wave voltage is supplied to the ramp wiring RL2. In addition, during the period in which the ramp wave voltage is supplied to the ramp wiring RL1, the offset voltage is supplied to the ramp wiring RL2. Whether to supply the ramp wave voltage or the offset voltage to the ramp wiring RL1 and the ramp wiring RL2 is switched every two horizontal line periods.

As described above, in the fourteenth embodiment, by supplying the ramp wave voltage output from the output buffer 31 to a plurality of signal lines, the number of the current generation circuits 32, the output buffers 31, and the current control circuits 33 can be reduced. Furthermore, it is also possible to supply the signal line write voltage after supplying the offset voltage to the signal line within one horizontal line period.

Fifteenth Embodiment

Figure 45:
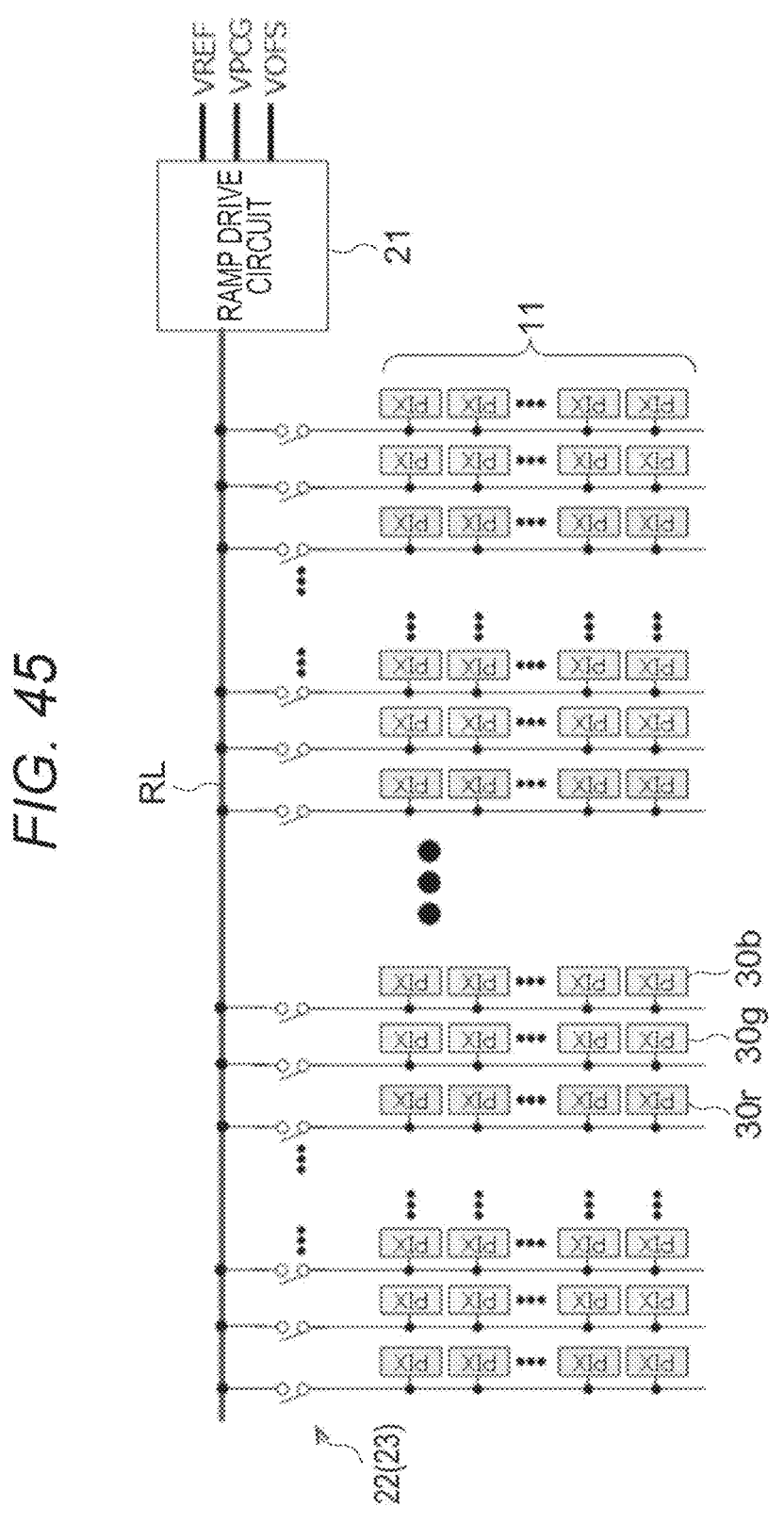

FIG. 45 is a diagram illustrating a characteristic part of a display drive circuit 20 according to a fifteenth embodiment. In FIG. 45, a ramp drive circuit 21 including the current generation circuit 32, the output buffer 31, and the current control circuit 33 described in the first to fourteenth embodiments is arranged at the end in the horizontal direction of a pixel array unit 11. As a result, the ramp drive circuit 21 can be arranged without affecting the display of pixels 30.

FIG. 45 illustrates an example in which the pixel 30 includes three subpixels 30r, 30g, and 30b of red, green, and blue. Subpixels of the same color are arranged in the vertical direction of the pixel array unit 11, and a signal line is arranged for each subpixel column arranged in the vertical direction. One end side of each signal line is connected to ramp wiring via a corresponding PWM switch.

Figure 46:
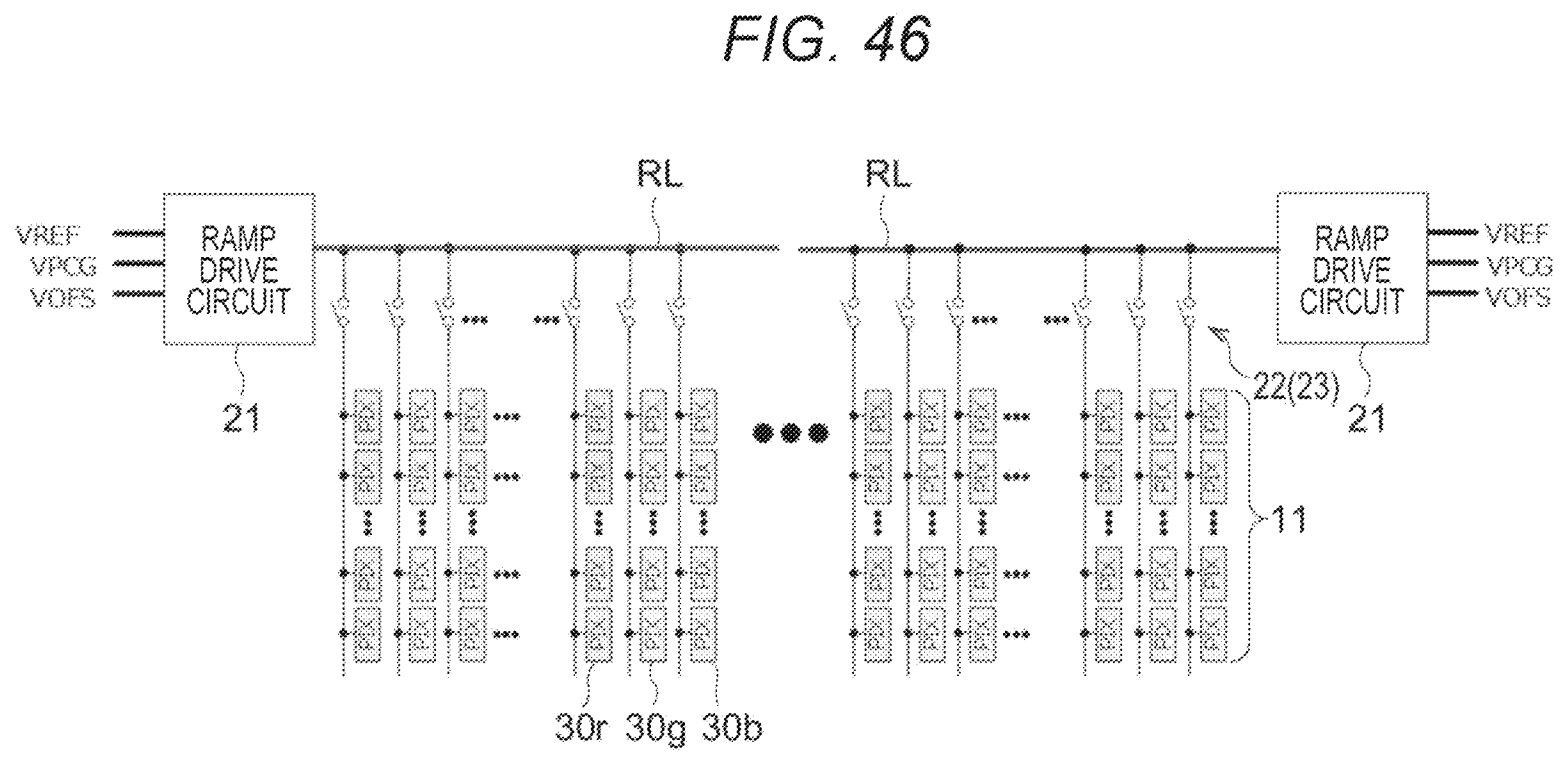

FIG. 46 is a diagram illustrating a characteristic part of a display drive circuit 20 according to a first modification of FIG. 45. In FIG. 46, a ramp drive circuit 21 is arranged on both sides of a pixel array unit 11 in the horizontal direction. As a result, the wiring resistance on ramp wiring RL can be made smaller than that in a case where the ramp drive circuit 21 is arranged on one side, and the voltage drop of the ramp wave voltage due to the wiring resistance can be curbed. In addition, while it is necessary to increase the wiring width of the ramp wiring RL in a case where the ramp drive circuit 21 is provided only on one side, the wiring width of the ramp wiring RL can be reduced by providing the ramp drive circuit 21 on both sides.

Figure 47:
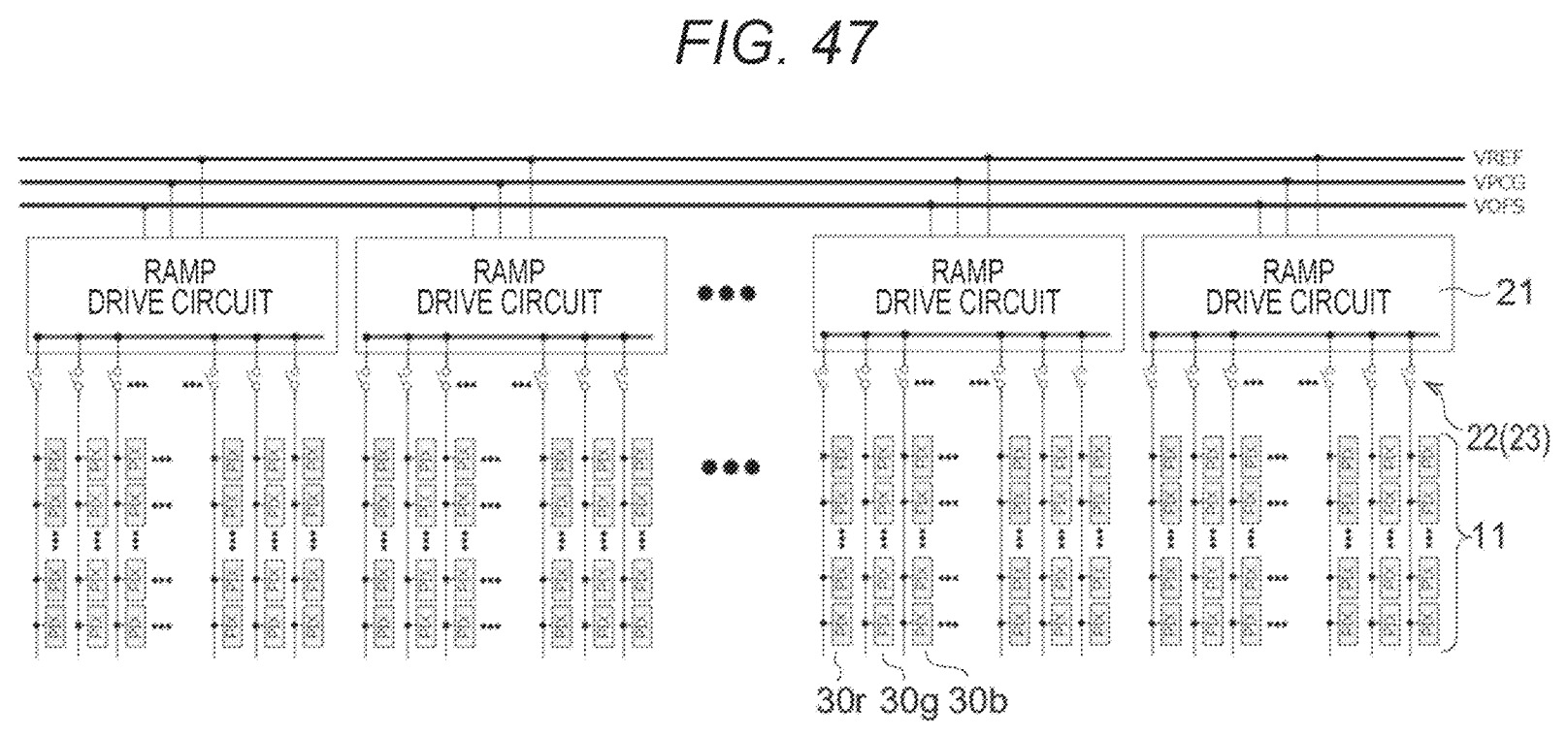

FIG. 47 is a diagram illustrating a characteristic part of a display drive circuit 20 according to a second modification of FIG. 45. In FIG. 47, a ramp drive circuit 21 is arranged for each signal line group including two or more signal lines in the horizontal direction. As a result, as compared with FIGS. 45 and 46, the wiring resistance on ramp wiring RL can be further reduced, and the wiring width of the ramp wiring RL can be further reduced.

Figure 48:
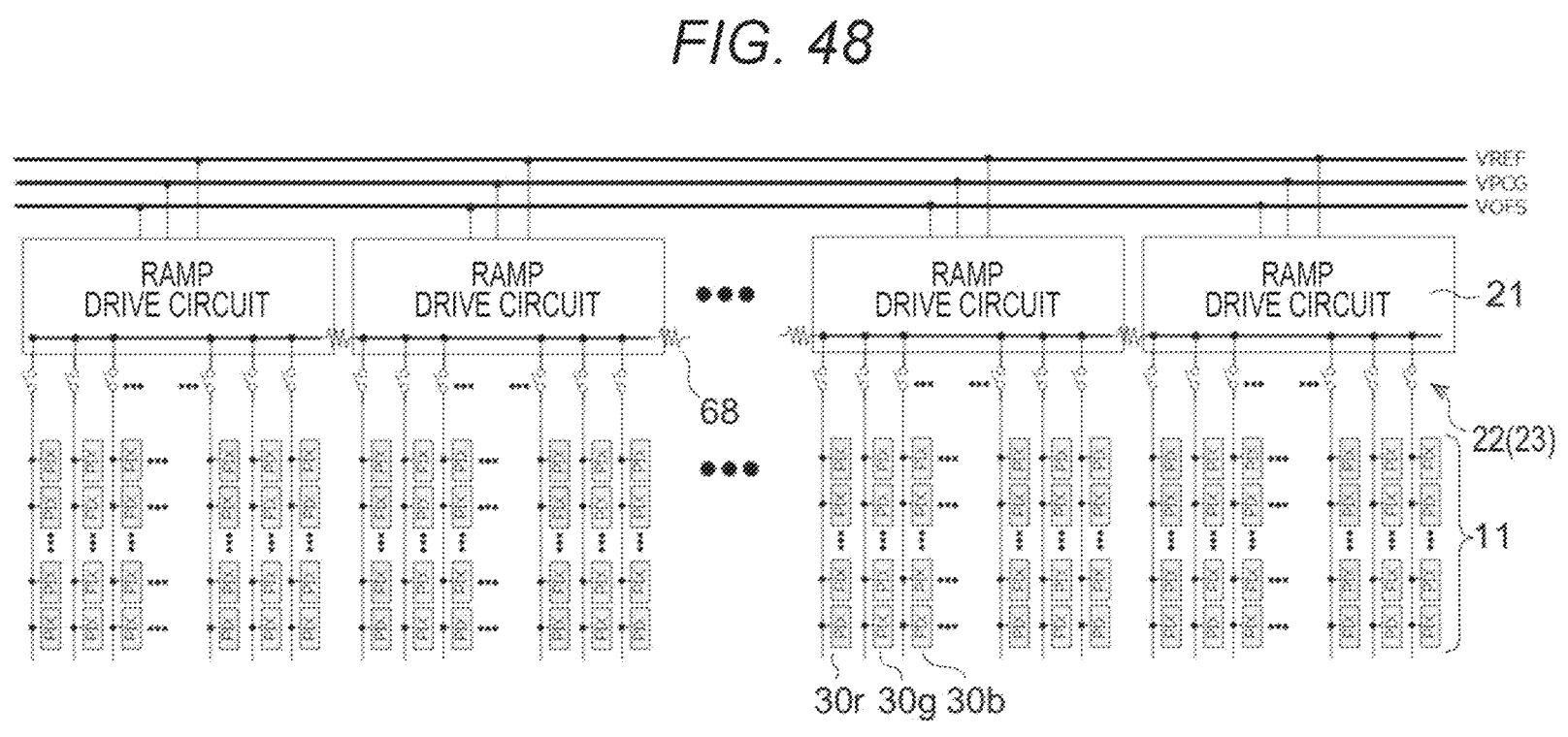
Figure 49:
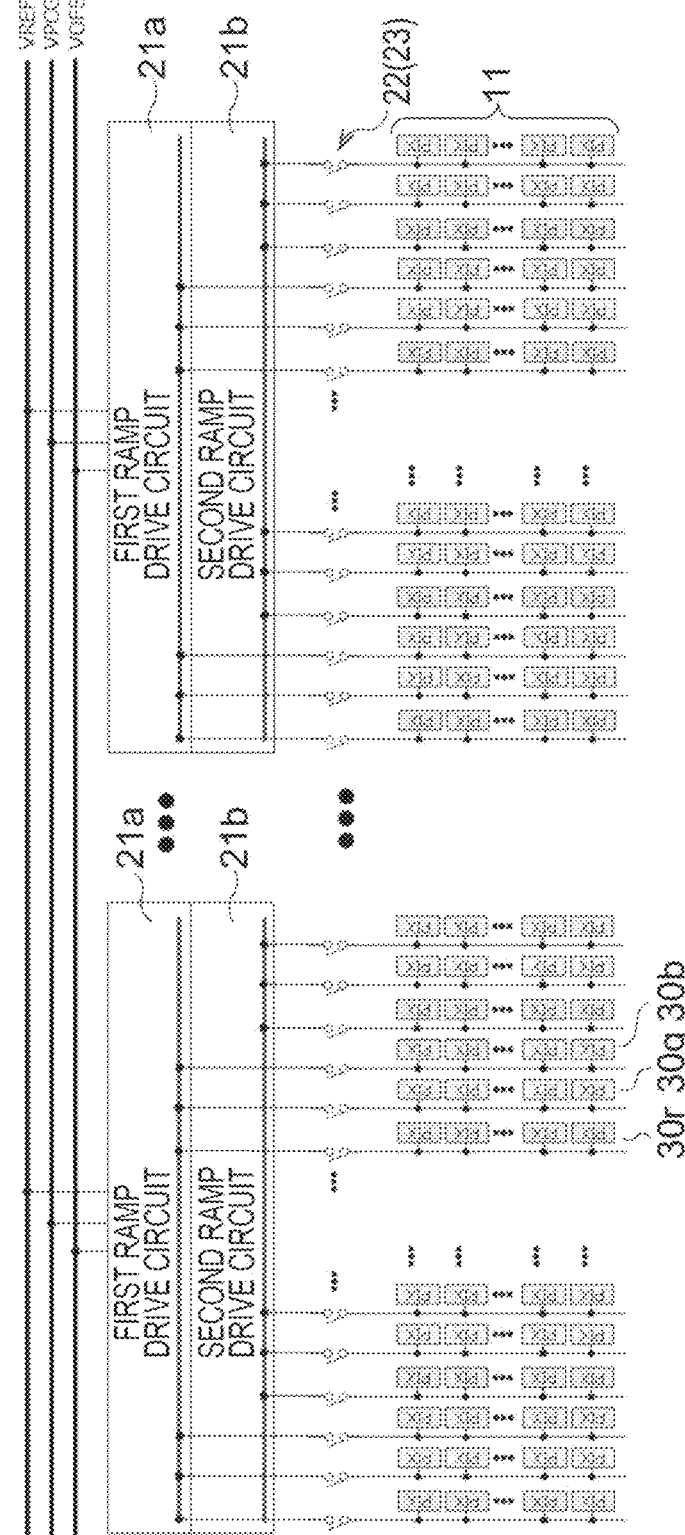
FIG. 49 is a diagram illustrating a characteristic part of a display drive circuit according to a fourth modification of FIG. 45.

FIG. 48 is a diagram illustrating a characteristic part of a display drive circuit 20 according to a third modification of FIG. 45. In FIG. 48, a plurality of ramp wirings RL corresponding to a plurality of ramp drive circuits 21 are connected to each other by a resistive element 68. By optimizing the resistance value of the resistive element 68, it is possible to prevent the waveform of the ramp wave voltage from being adversely affected. FIG. 49 is a diagram illustrating a characteristic part of a display drive circuit 20 according to a fourth modification of FIG. 45. In the display drive circuit 20 of FIG. 49, two ramp drive circuits 21 (hereinafter referred to as first ramp drive circuit 21a and second ramp drive circuit 21b) are arranged for each signal line group including two or more signal lines arranged in the horizontal direction, the first ramp drive circuit 21a being connected to ramp wiring RL that supplies a signal line voltage to signal lines of odd-numbered columns, and the second ramp drive circuit 21b being connected to ramp wiring RL that supplies a signal line voltage to signal lines of even-numbered columns.

FIG. 49 illustrates an example in which each pixel includes three subpixels of red, green, and blue, and three signal lines corresponding to the three subpixels are alternately connected to the first ramp drive circuit 21a and the second ramp drive circuit 21b.

Figure 50:
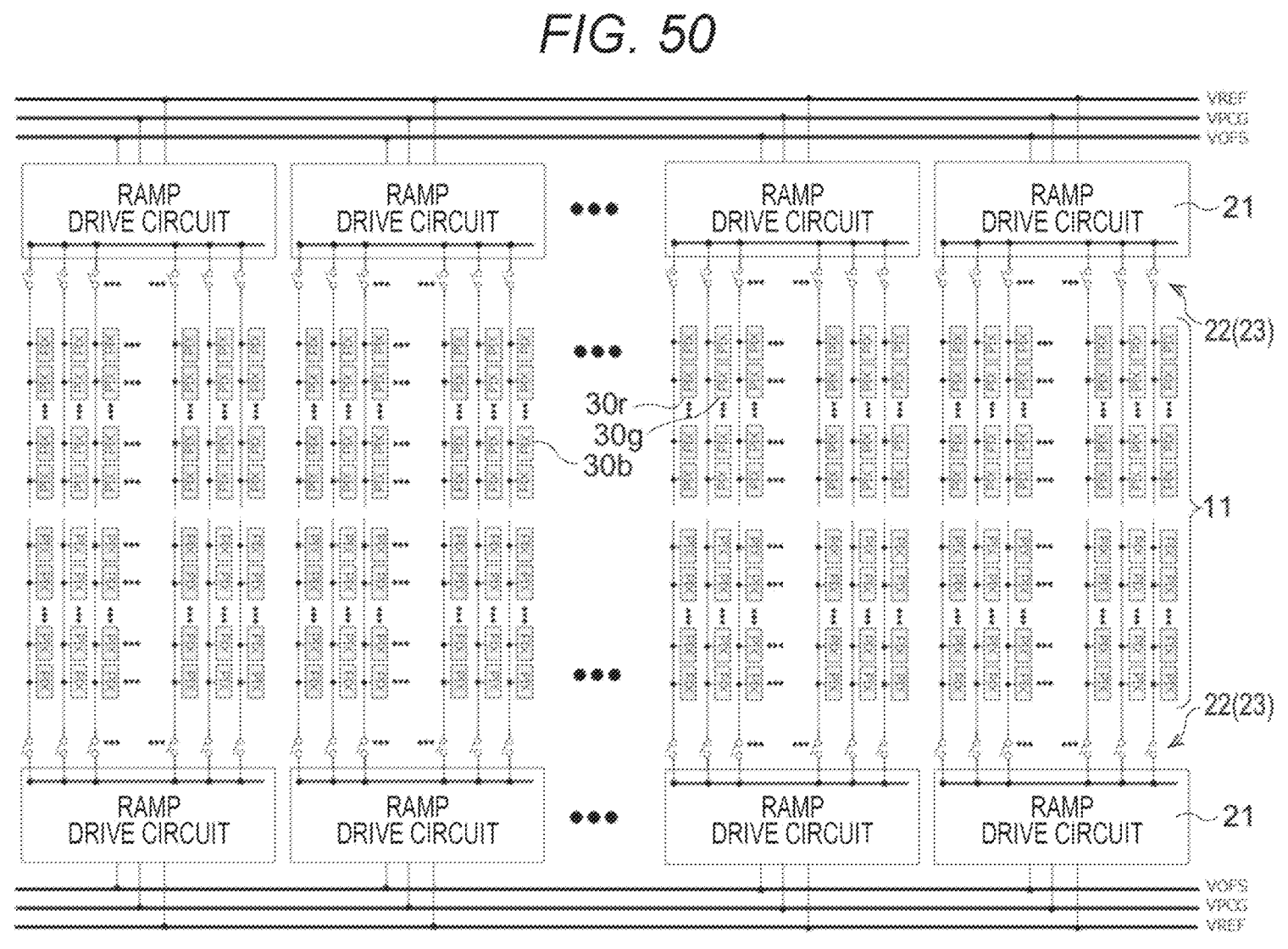

FIG. 50 is a diagram illustrating a characteristic part of a display drive circuit 20 according to a fifth modification of FIG. 45. In the display drive circuit 20 of FIG. 50, a ramp drive circuit 21 is provided for each signal line group on both sides in the vertical direction. As a result, wiring resistance on the signal line can be reduced.

Figure 51:
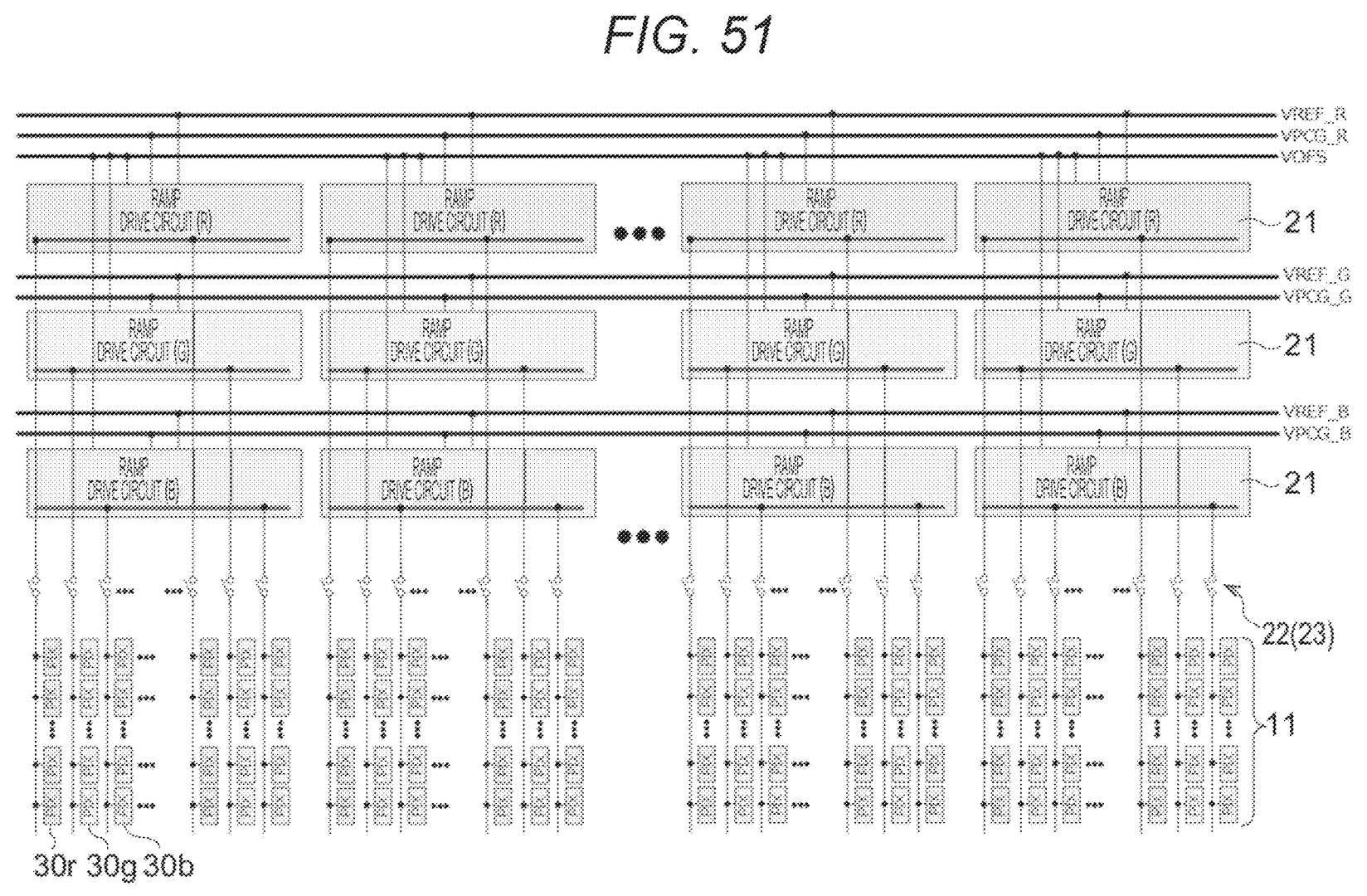

FIG. 51 is a diagram illustrating a characteristic part of a display drive circuit 20 according to a sixth modification of FIG. 45. The display drive circuit 20 of FIG. 51 is provided with a ramp drive circuit 21 separately for each color.

Therefore, the display drive circuit 20 of FIG. 51 has three times as many ramp drive circuits 21 as the display drive circuit 20 of FIG. 49.

Furthermore, as a modification of the display drive circuit 20 of FIG. 51, a plurality of ramp drive circuits 21 may be arranged for each color on both sides in the vertical direction as in FIG. 50. In this case, twice as many ramp drive circuits 21 as in FIG. 51 are provided.

As described above, in the fifteenth embodiment, the arrangement place and the number of the ramp drive circuits 21 can be optimized so that the wiring resistance on the ramp wiring RL is as small as possible.

Sixteenth Embodiment

Figure 52:
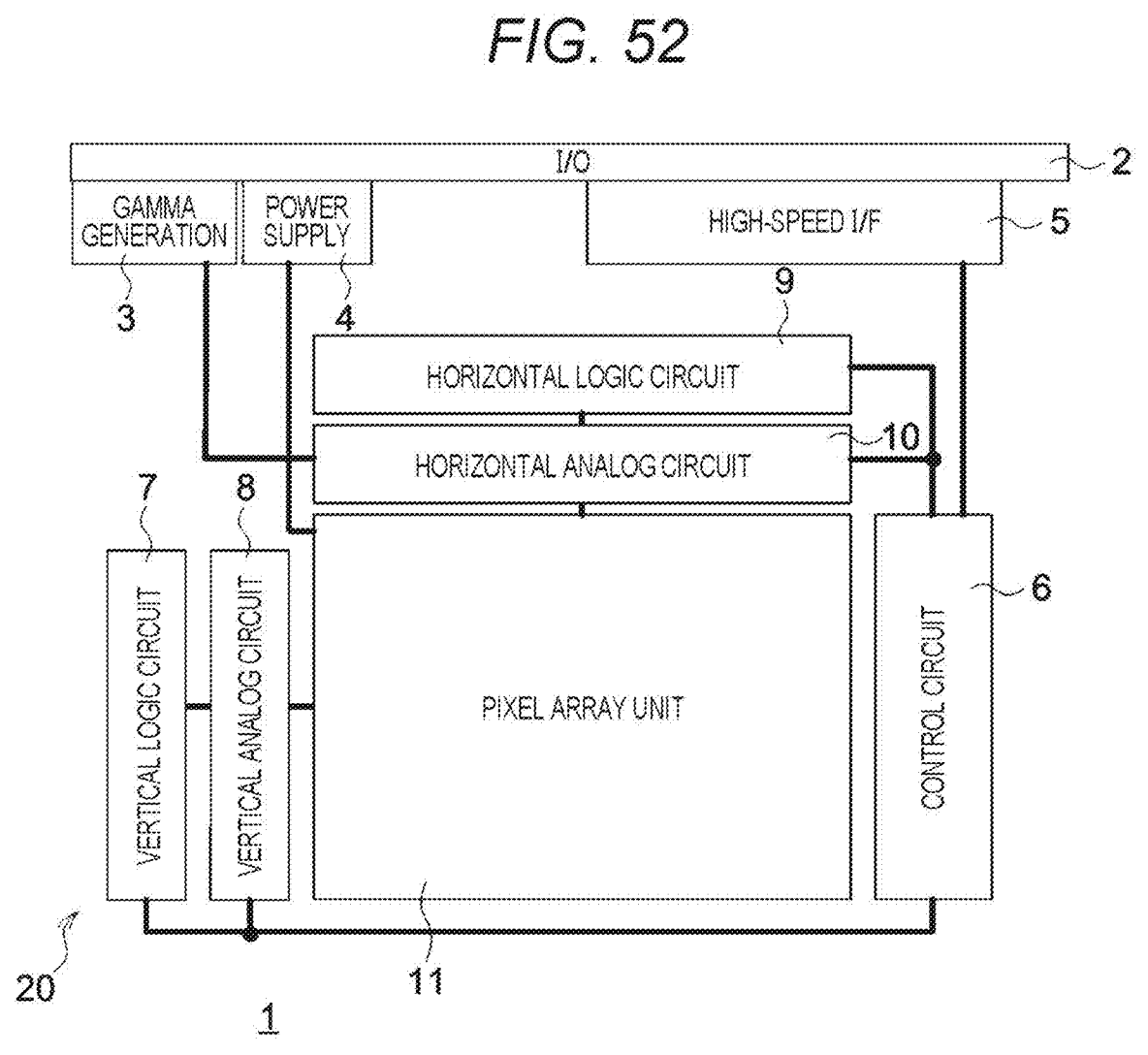

FIG. 52 is a block diagram illustrating a schematic configuration of a display device 1 including a display drive circuit 20 according to a sixteenth embodiment. The display device 1 of FIG. 52 has, for example, a block configuration of a micro OLED.

The display drive circuit 20 of FIG. 52 is configured similarly to the display drive circuit 20 according to any one of the first to fifteenth embodiments. The display drive circuit 20 and a pixel array unit 11 of FIG. 52 can be arranged on the same semiconductor substrate.

Alternatively, a first substrate on which the pixel array unit 11 is arranged, and a second substrate on which an input/output interface unit 2 (I/O) other than the pixel array unit 11, a gamma generation circuit 3, a power supply circuit 4, a high-speed interface unit 5 (high-speed I/F), a control circuit 6, a vertical logic circuit 7, a vertical analog circuit 8, a horizontal logic circuit 9, and a horizontal analog circuit 10 are arranged may be bonded by Cu—Cu bonding, bumps, vias, or the like to transmit signals.

Figure 53:
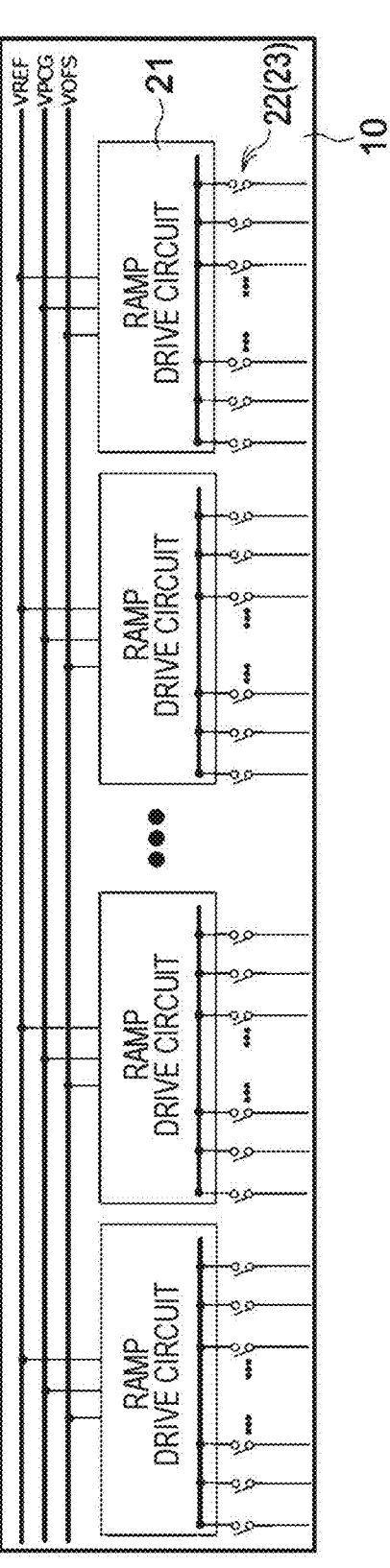
FIG. 53 is a block diagram illustrating an example of an internal configuration of a horizontal analog circuit of FIG. 52.

FIG. 53 is a block diagram illustrating an example of an internal configuration of the horizontal analog circuit 10 of FIG. 52. As illustrated in FIG. 47 and other drawings, the horizontal analog circuit 10 of FIG. 53 includes a plurality of ramp drive circuits 21 in units of signal line groups including two or more signal lines arranged in the horizontal direction.

Figure 54:
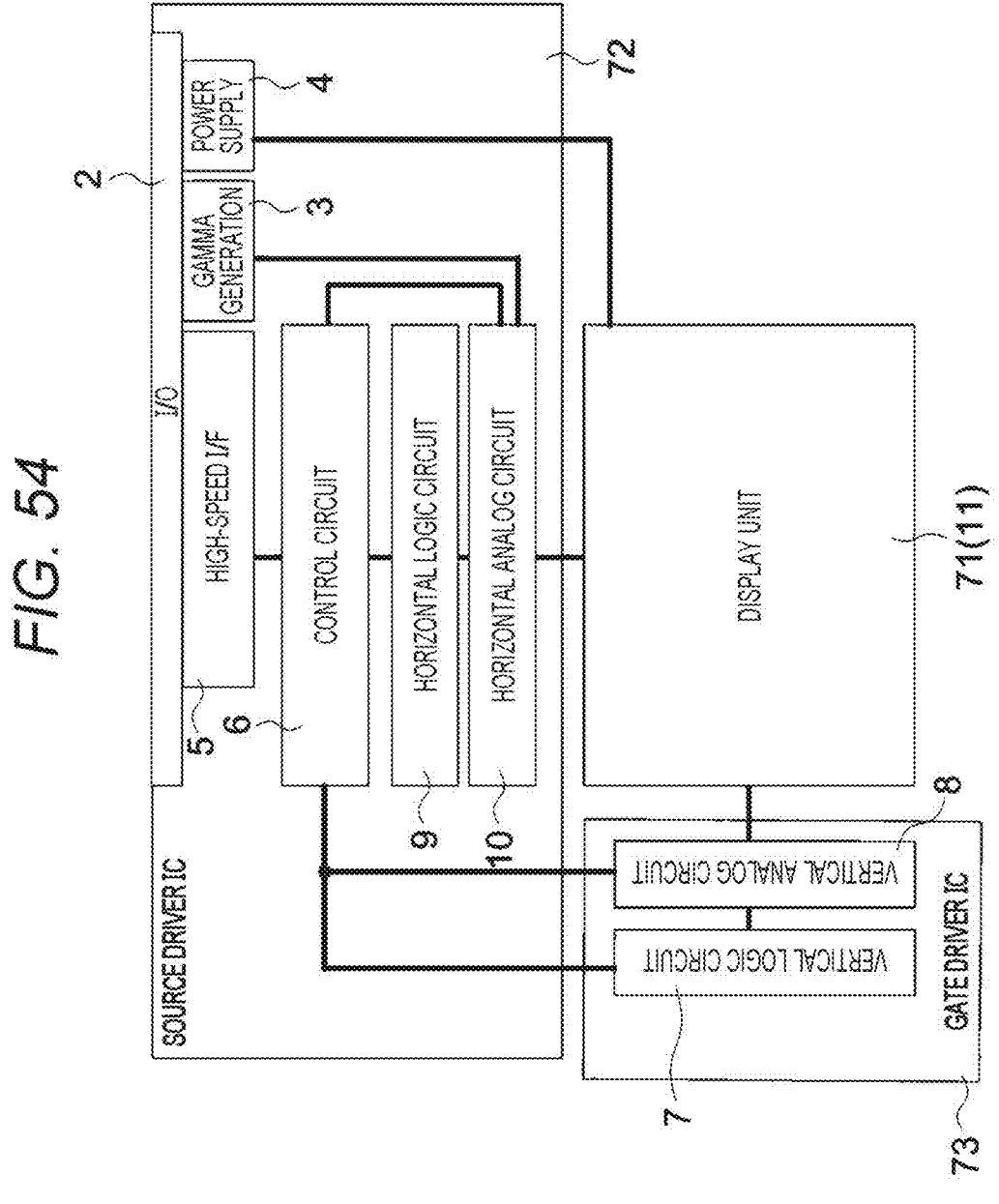
FIG. 54 is a block diagram illustrating a schematic configuration of a display device according to a modification of FIG. 52.

FIG. 54 is a block diagram illustrating a schematic configuration of a display device 1 according to a modification of FIG. 52. The display device 1 of FIG. 54 is, for example, a liquid crystal display device 1.

The display device 1 of FIG. 54 includes a display unit 71, a source driver IC72, and a gate driver IC73. The display unit 71, the source driver IC72, and the gate driver IC73 perform signal transmission via, for example, a flexible printed circuit board or the like. The source driver IC72 and the gate driver IC73 may be integrated into one semiconductor chip.

The source driver IC72 of FIG. 54 includes an input/output interface unit (I/O) 2, a gamma generation circuit 3, a power supply circuit 4, a high-speed interface unit 5 (high-speed I/F), a control circuit 6, a horizontal logic circuit 9, and a horizontal analog circuit 10. The gate driver IC73 includes a vertical logic circuit 7 and a vertical analog circuit 8.

As described above, the display drive circuit 20 according to the first to fourteenth embodiments may be incorporated in the display device 1 of FIG. 52 or may be incorporated in the display device 1 of FIG. 54.

<Circuit Configuration of Pixel>

The pixel array unit 11 in the display device 1 of FIG. 1 has a pixel circuit including a light emission element such as an organic EL element for each pixel. Various modifications are conceivable as a specific circuit configuration of the pixel circuit. Hereinafter, a representative circuit configuration will be described.

First Specific Example

Figure 55:
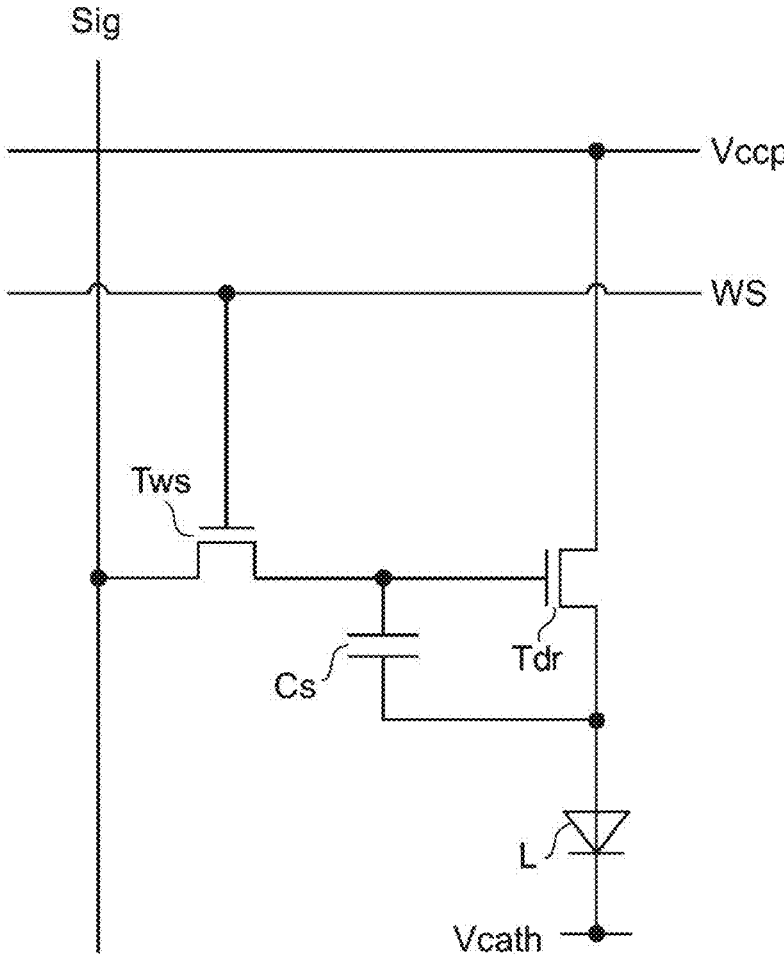
FIG. 55 is a circuit diagram of a pixel circuit according to a first specific example.

FIG. 55 is a circuit diagram of a pixel circuit according to a first specific example. The pixel circuit of FIG. 55 includes a light emission element L. Furthermore, the pixel includes a transistor Tws, a transistor Tdr, and a capacitor Cs.

The light emission element L may be any element such as a light emitting diode (LED), an OLED, or an organic electro luminescence (OEL). In these elements, a cathode may be connected to a ground voltage, and light may be emitted by a current flowing from an anode. Furthermore, as another example, the pixel may change the light emission intensity by controlling the liquid crystal.

The light emission element L emits light when a current flows from the anode to the cathode. The cathode is connected to a reference voltage Vcath (for example, ground voltage). The anode of the light emission element L is connected to the source of the transistor Tdr and one terminal of the capacitor Cs.

The transistor Tws is an n-type MOSFET, for example, and is a transistor (write transistor) that controls writing of a pixel value. In the transistor Tws, a data voltage indicating a pixel value is input to the drain from a signal line Sig, the source is connected to the other end of the capacitor Cs and the gate of the transistor Tds, and a control signal WS for write control is applied to the gate.

The transistor Tws writes the data voltage supplied from the signal line Sig to the capacitor Cs in response to the control signal WS. When the transistor Tws is turned on, the capacitor Cs is charged (written) with the data voltage supplied from the signal line Sig, and the light emission intensity of the light emission element L is controlled by the charge amount of the capacitor Cs.

The transistor Tdr is, for example, an n-type MOSFET. The current based on the voltage indicating the pixel value written in the capacitor Cs by the transistor Tws flows to the light emission element L by driving the transistor Tdr. The transistor Tdr has the drain connected to a voltage Vccp for driving the MOSFET, the source connected to the anode of the light emission element L, and the gate connected to the drain of the transistor Tws.

Since the signal stored by the capacitor Cs is applied to the gate of the transistor Tdr, the source potential becomes a sufficiently large value, so that a drain current corresponding to the signal flows. When the drain current flows, the light emission element L emits light with intensity (luminance) corresponding to the data voltage input to the pixel.

As a simple example, the pixel emits light with appropriate intensity by performing writing based on the data voltage input from the signal line Sig for determining the light emission intensity for each pixel in this manner and causing a drain current corresponding to the intensity of the written signal to flow to the light emission element L.

Second Specific Example

Figure 56:
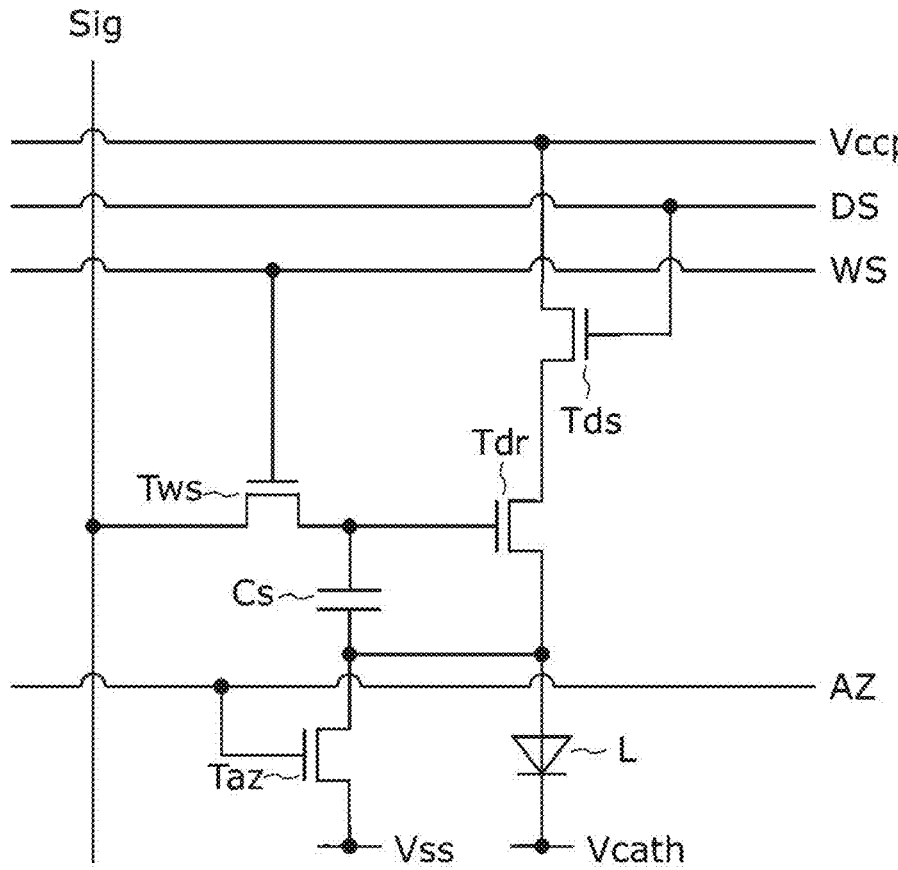
FIG. 56 is a circuit diagram of a pixel circuit according to a second specific example.

FIG. 56 is a circuit diagram of a pixel circuit according to a second specific example. As a general simple example, as illustrated in FIG. 56, the pixel may include a transistor Taz, a transistor Tws, a transistor Tds, a transistor Tdr, and a capacitor Cs.

The anode of the light emission element L is connected to the drain of the transistor Taz, the source of the transistor Tdr, and one terminal of the capacitor Cs.

The transistor Taz is, for example, an n-type MOSFET, and has the drain connected to the anode of the light emission element L, the source connected to a voltage Vss, and the gate to which a reset voltage AZ is applied. The transistor Taz is a transistor that initializes the potential of the anode of the light emission element L according to the reset voltage AZ. The voltage Vss is a reference voltage at the power supply voltage, for example, and may represent a grounded state or may be a potential of 0 V.

The capacitor Cs is a capacitor for controlling the potential on the anode side of the light emission element L.

The transistor Tws is, for example, an n-type MOSFET, and is a transistor that controls writing of a pixel value. In the transistor Tws, a data voltage indicating a pixel value is input to the drain from a signal line Sig, the source is connected to the other end of the capacitor Cs and the gate of the transistor Tdr, and a control signal WS for write control is applied to the gate.

The transistor Tws writes the data voltage supplied from the signal line Sig to the capacitor Cs in response to the control signal WS. When the transistor Tws is turned on, the capacitor Cs is charged (written) with the data voltage supplied from the signal line Sig, and the light emission intensity of the light emission element L is controlled by the charge amount of the capacitor Cs.

The transistor Tds is an n-type MOSFET, for example, and is a transistor that controls driving for applying a current based on the potential corresponding to the written pixel value to the light emission element L. The transistor Tds has the drain connected to a power supply voltage Vccp for driving the MOSFET, the source connected to the drain of the transistor Tdr, and the gate to which a drive signal for controlling the potential of the drain of the transistor Tdr is applied from a signal line Ds. According to the signal applied from the signal line Ds, the transistor Tds causes a drain current to flow, and increases the drain potential of the transistor Tdr.

The transistor Tdr is, for example, an n-type MOSFET. The current based on the voltage indicating the pixel value written in the capacitor Cs by the transistor Tws flows to the light emission element L by driving the transistor Tdr. The transistor Tdr has the drain connected to the source of the transistor Tds, the source connected to the anode of the light emission element L, and the gate connected to the drain of the transistor Tws.

Since the signal stored by the capacitor Cs is applied to the gate of the transistor Tdr, the source potential becomes a sufficiently large value, so that a drain current corresponding to the signal flows. When the drain current flows, the light emission element L emits light with intensity (luminance) corresponding to the data voltage input to the pixel.

Similarly to the above, as a simple example, the pixel emits light by performing writing based on the data voltage input from the signal line Sig for determining the light emission intensity for each pixel in this manner and causing a drain current corresponding to the intensity of the written signal to flow to the light emission element L.

The transistor Taz is a transistor that performs a quick discharge operation at a timing after light emission to initialize a written state. The body of the transistor Taz needs to be held at a sufficiently large potential for appropriate driving while the pixel operates (light emission, extinction), and the power supply voltage Vccp is applied, for example.

In the present disclosure, for example, the anode of the light emission element L may be appropriately opened. In the following example, similarly, it is assumed that the anode is appropriately opened in a second pixel 102 unless otherwise specified.

Third Specific Example

Figure 57:
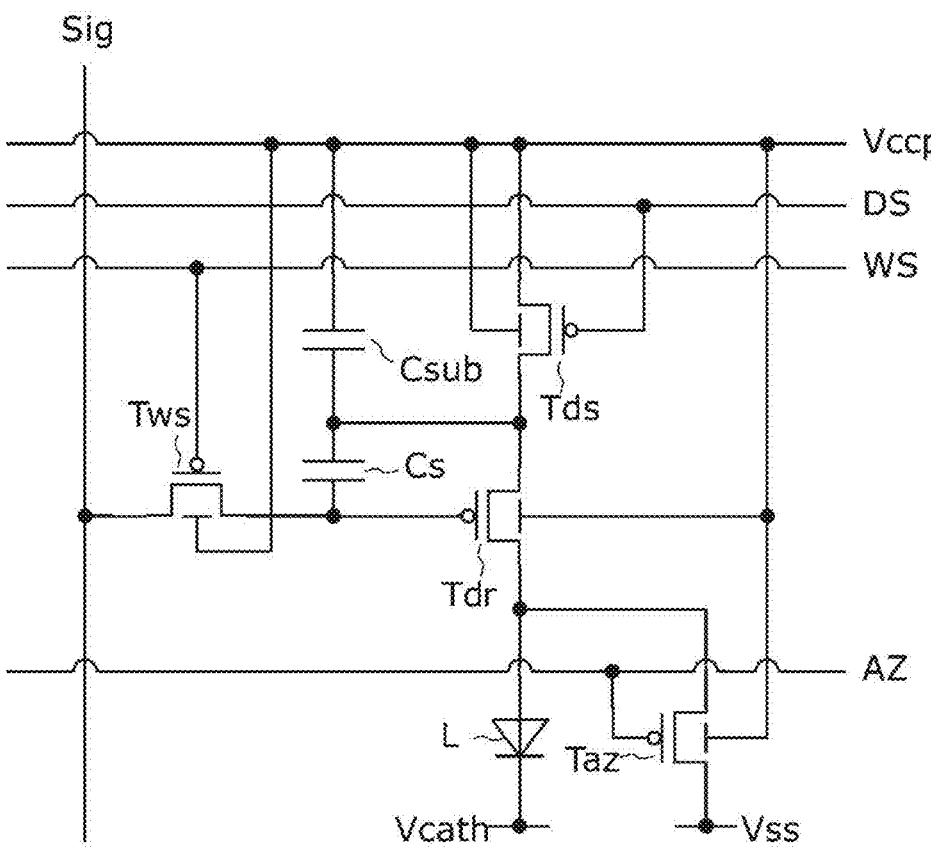
FIG. 57 is a circuit diagram of a pixel circuit according to a third specific example.

FIG. 57 is a circuit diagram of a pixel circuit according to a second specific example. In FIG. 56, the configuration includes four transistors Tws, Tds, Tdr, and Taz and one capacitor Cs, but in FIG. 57, the pixel includes four transistors Tws, Tds, Tdr, and Taz and two capacitors Cs and Csub.

The capacitor Csub is a capacitor for charging a voltage corresponding to a signal Sig on the basis of a write signal WS together with the capacitor Cs. In this manner, even if the number of capacitors is changed, the potential of the anode of a light emission element L is controlled by the transistor Taz, to appropriately perform an extinction and light emission operation.

In a case where two capacitors Cs and Csub are provided as illustrated in FIG. 57, the luminance can also be controlled by changing the ratio of the capacitances of the capacitors Cs and Csub.

Fourth Specific Example

Figure 58:
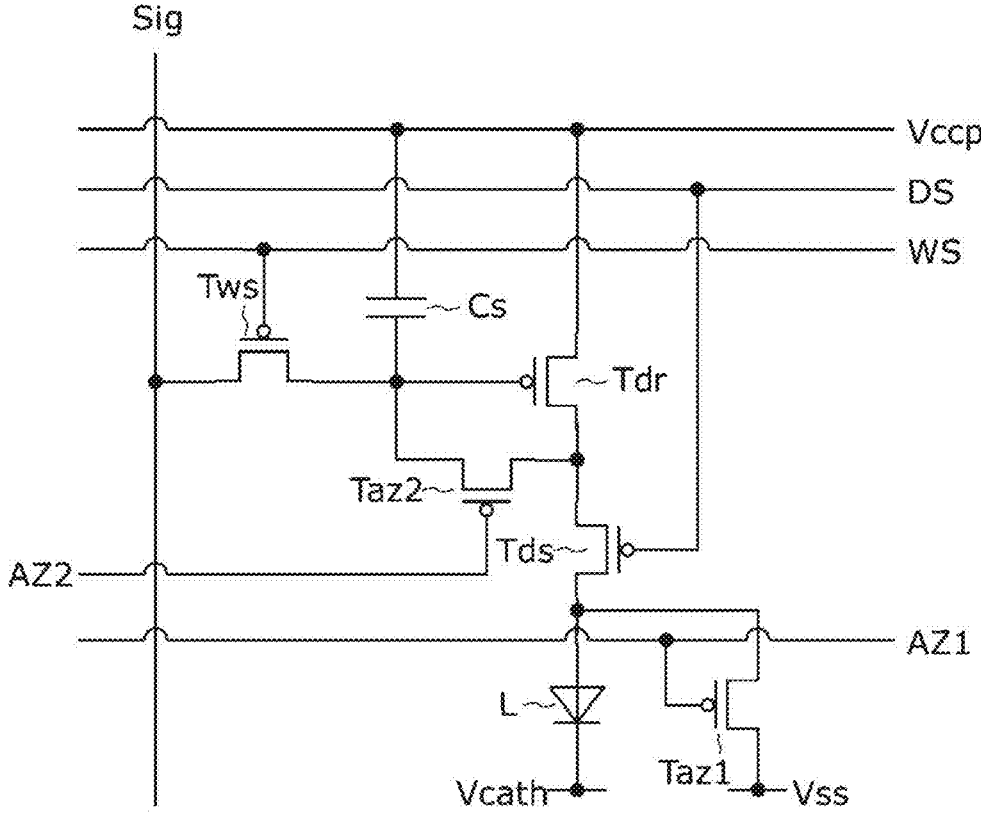
FIG. 58 is a circuit diagram of a pixel circuit according to a fourth specific example.

FIG. 58 is a circuit diagram of a pixel circuit according to a fourth specific example. In FIG. 58, the pixel includes a transistor Taz1 and a transistor Taz2 as transistors that control initialization of the anode potential of a light emission element L, in addition to transistors Tws, Tdr, and Tds. In such a mode, too, a voltage similar to that in each of the modes described above is applied to the transistor Taz1. Furthermore, a similar voltage may also be applied to the transistor Taz2 at the same timing.

The transistor Taz2 is a switch for resetting the charge accumulated in the capacitor Cs. With this switch, the capacitor Cs can be appropriately discharged before charging is started.

Even in such a mode, the optical system for the light emission element L or the path from a power supply voltage Vccp can be operated in a manner similar to those of the above-described embodiments.

Fifth Specific Example

Figure 59:
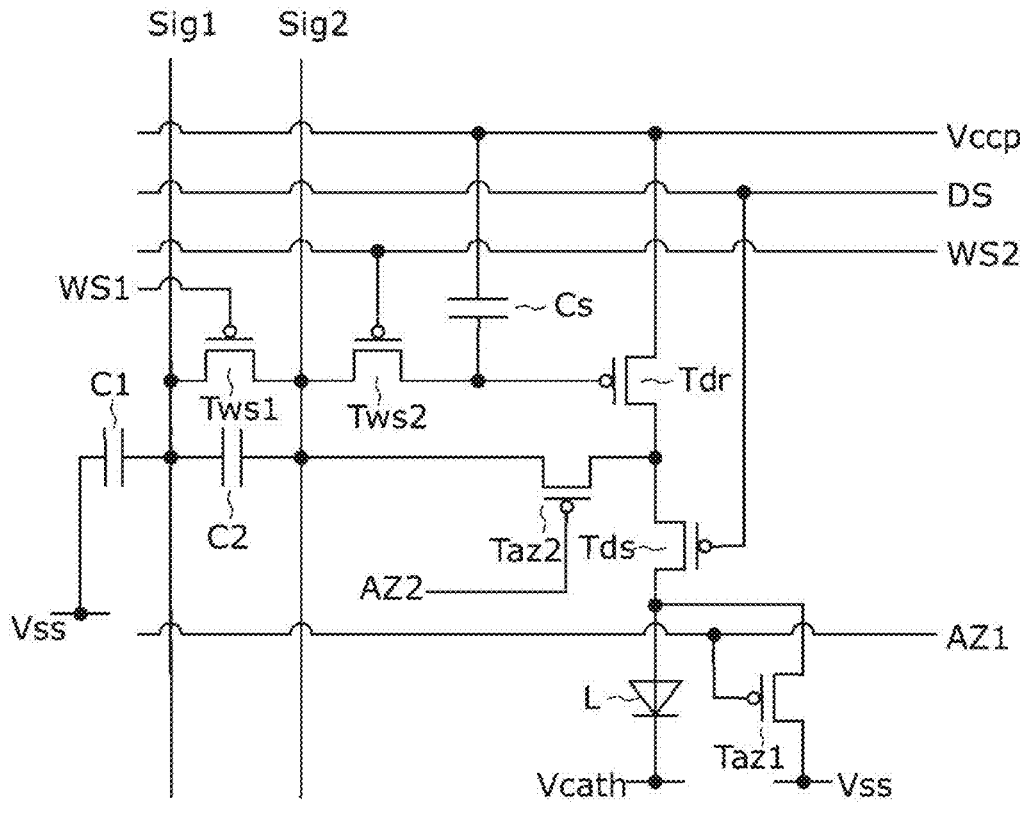
FIG. 59 is a circuit diagram of a pixel circuit according to a fifth specific example.

FIG. 59 is a circuit diagram of a pixel circuit according to a fifth specific example. The pixel circuit of FIG. 59 includes six transistors Tws1, Tws2, Tdr, Tds, Taz1, and Taz2, and three capacitors Cs, C1, and C2. As illustrated in FIG. 59, even in a case where there are two signal lines Sig1 and Sig2 that propagate data signals indicating the intensity of pixels, it is possible to operate the optical system for a light emission element L or the path from a power supply voltage Vccp in a manner similar to those of the above-described embodiments.

Sixth Specific Example

Figure 60:
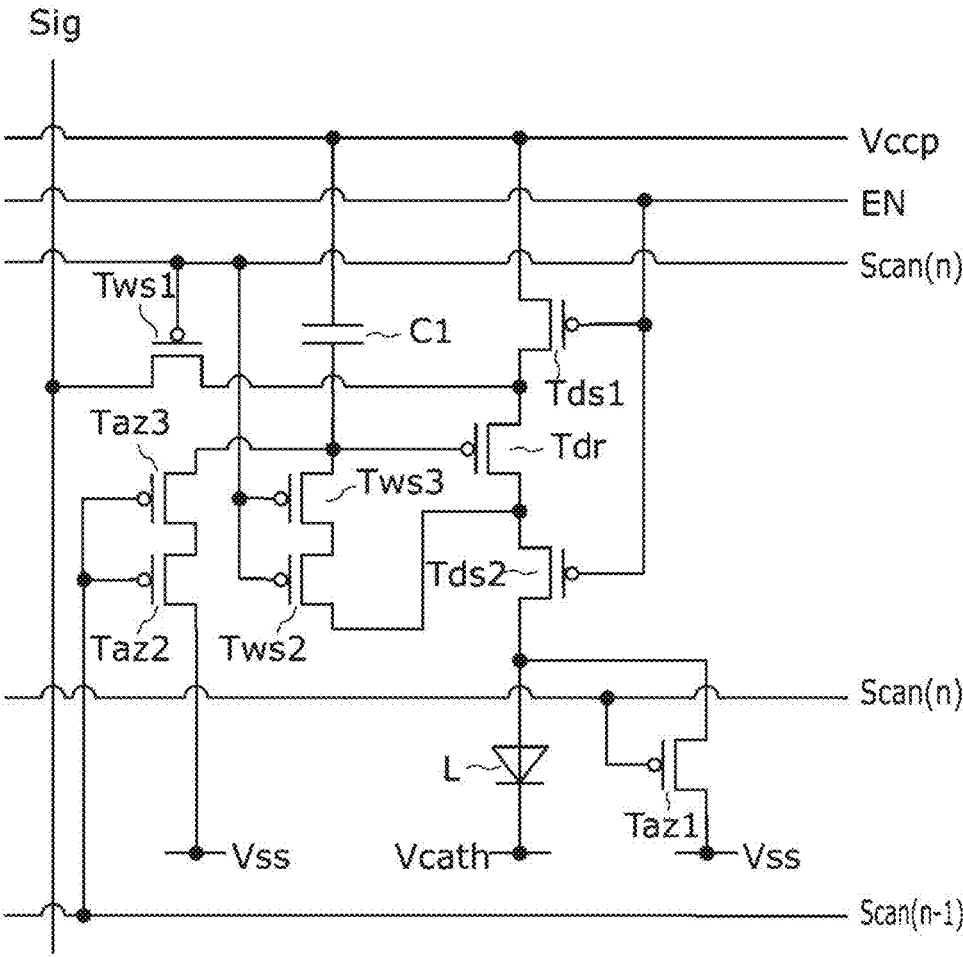
FIG. 60 is a circuit diagram of a pixel circuit according to a sixth specific example.

FIG. 60 is a circuit diagram of a pixel circuit according to a sixth specific example. The pixel circuit of FIG. 60 includes nine transistors T and one capacitor C1. The pixel is connected to a signal line Scan (n) that propagates a voltage for performing write control on the pixel, and also a signal line Scan (n-1) that propagates a voltage for performing write control of a previous line scanned first, and is controlled with a signal input from the signal line Scan (n-1) as an offset. In such a mode that depends on control by another line, too, the present disclosure can be appropriately applied. Moreover, to stabilize charging, the pixel includes a write transistor that uses an offset and assists a transistor Tws.

Even in such a mode, the optical system for the light emission element L or the path from a power supply voltage Vccp can be operated in a manner similar to those of the above-described embodiments.

Seventh Specific Example

Figure 61:
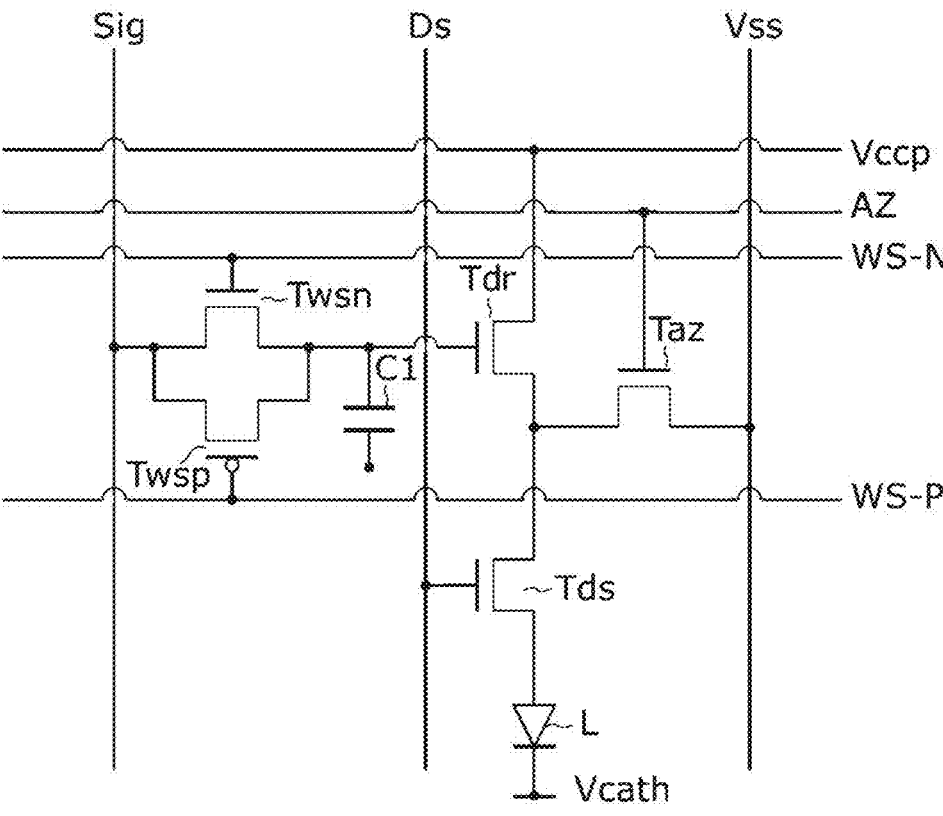
FIG. 61 is a circuit diagram of a pixel circuit according to a seventh specific example.

FIG. 61 is a circuit diagram of a pixel circuit according to a seventh specific example. In order to complementarily control a signal WS, the pixel circuit of FIG. 61 has a configuration including transistors Tws_n and Tws_p instead of the transistor Tws in the above-described examples. In such a configuration, too, control according to the present disclosure can be adopted.

Note that in the above description, only the relevant components of the present disclosure have been explained with respect to appropriate components such as other circuits necessary for display, but the pixels of the display device 1 appropriately includes components (not illustrated) necessary for displaying a video image or the like, in addition to the relevant components.

In addition, whether each transistor in the above is an n-type transistor or a p-type transistor is illustrated, but these transistors are illustrated as non-limiting examples, and the polarity of the transistor is not particularly limited as long as the transistor operates appropriately.

Application Example of Image Display Device 1 and Electronic Device According to Present Disclosure

First Application Example

Figure 62A:
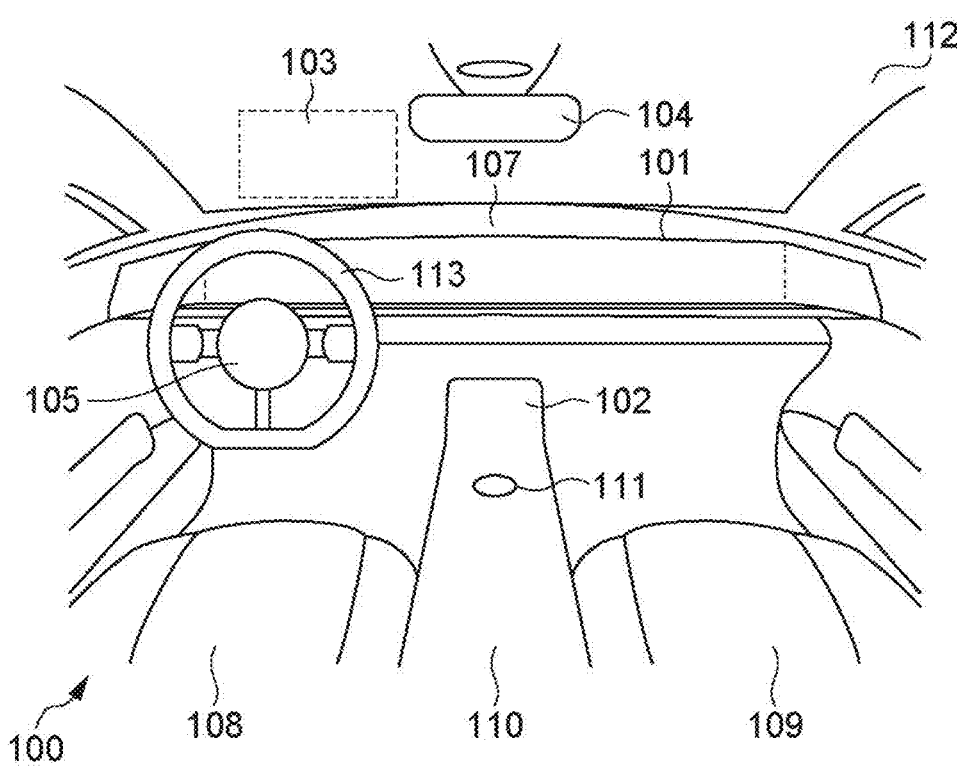
FIG. 62A is a diagram illustrating an internal state of a vehicle from the rear side to the front side of the vehicle.
Figure 62B:
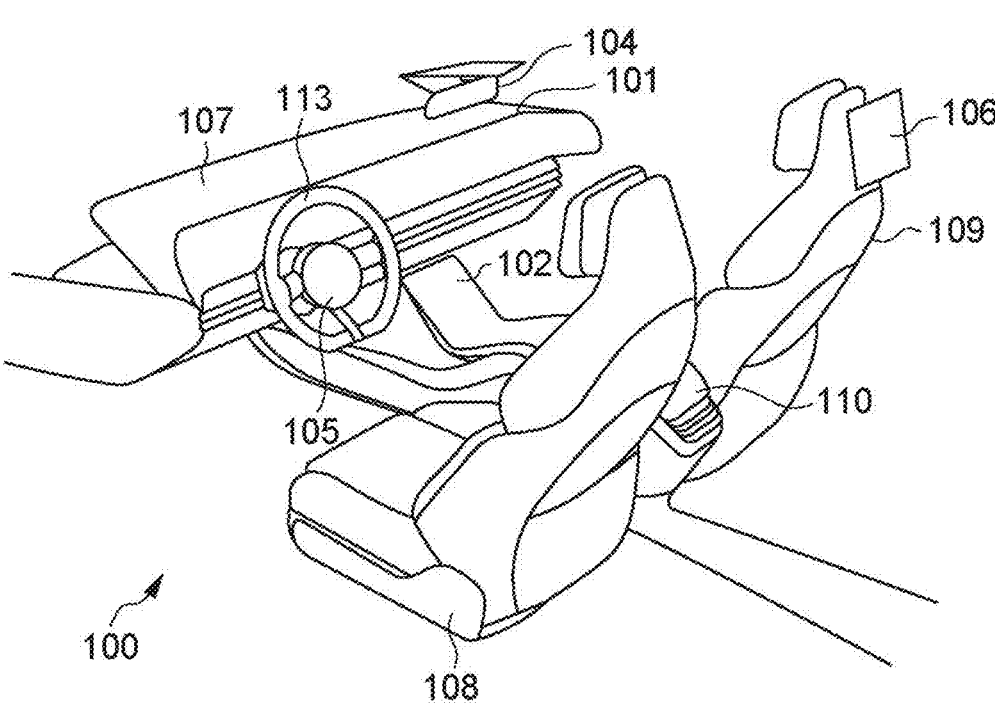
FIG. 62B is a diagram illustrating an internal state of the vehicle from an oblique rear side to an oblique front side of the vehicle.

An image display device 1 and an electronic device 50 according to the present disclosure can be used for various purposes. FIGS. 62A and 62B are diagrams illustrating an internal configuration of a vehicle 100 as a first application example of the electronic device 50 including the image display device 1 according to the present disclosure. FIG. 62A is a diagram illustrating an internal state of the vehicle 100 as viewed from the rear side to the front side of the vehicle 100, and FIG. 62B is a diagram illustrating an internal state of the vehicle 100 as viewed from an oblique rear side to an oblique front side of the vehicle 100.

The vehicle 100 in FIGS. 62A and 62B includes a center display 101, a console display 102, a head-up display 103, a digital rear mirror 104, a steering wheel display 105, and a rear entertainment display 106.

The center display 101 is arranged on a dashboard 107 at a location facing a driver seat 108 and a passenger seat 109. FIGS. 62A and 62B illustrate an example of the center display 101 having a horizontally long shape extending from the driver seat 108 side to the passenger seat 109 side, but any screen size and arrangement location of the center display 101 may be adopted. The center display 101 can display information detected by the various sensors. As a specific example, the center display 101 can display a captured image captured by an image sensor, an image of a distance to an obstacle in front of or on the side of the vehicle, the distance being measured by a ToF sensor, a passenger's body temperature detected by an infrared sensor, and the like. The center display 101 can be used to display, for example, at least one of safety-related information, operation-related information, a life log, health-related information, authentication/identification-related information, or entertainment-related information.

The safety-related information is information of doze sensing, looking-away sensing, sensing of mischief of a child riding together, presence or absence of wearing of a seat belt, sensing of leaving of an occupant, and the like, and is information sensed by the sensor arranged to overlap the back surface side of the center display 101, for example. The operation-related information detects a gesture related to an operation by the occupant by using the sensor. The detected gestures may include an operation of various types of equipment in the vehicle 100. For example, operations of air conditioning equipment, a navigation device, an AV device, a lighting device, and the like are detected. The life log includes life logs of all the occupants. For example, the life log includes an action record of each occupant in the vehicle. By acquiring and storing the life log, it is possible to check a state of the occupant at the time of an accident. In the health-related information, the health condition of the occupant is estimated on the basis of the body temperature of the occupant detected by using a temperature sensor. Alternatively, the face of the occupant may be imaged by using an image sensor, and the health condition of the occupant may be estimated from the imaged facial expression. Moreover, a conversation may be made with an occupant in automatic voice, and the health condition of the occupant may be estimated on the basis of the contents of a response from the occupant. The authentication/identification-related information includes a keyless entry function of performing face authentication using a sensor, and a function of automatically adjusting a seat height and position through face identification. The entertainment-related information includes a function of detecting, with a sensor, operation information about an AV device being used by an occupant, and a function of recognizing the face of the occupant with a sensor and providing content suitable for the occupant through the AV device.

The console display 102 can be used, for example, to display the life log information. The console display 102 is arranged near a shift lever 111 of a center console 110 between the driver seat 108 and the passenger seat 109. The console display 102 can also display information detected by the various sensors. Furthermore, the console display 102 may display an image of the surroundings of the vehicle captured by an image sensor, or may display an image of a distance to an obstacle present in the surroundings of the vehicle.

The head-up display 103 is virtually displayed behind a windshield 112 in front of the driver seat 108. The head-up display 103 can be used to display, for example, at least one of the safety-related information, the operation-related information, the life log, the health-related information, the authentication/identification-related information, or the entertainment-related information. Since the head-up display 103 is virtually arranged in front of the driver seat 108 in many cases, the head-up display 103 is suitable for displaying information directly related to an operation of the vehicle 100, such as a speed of the vehicle 100 and a remaining amount of fuel (battery).

The digital rear mirror 104 can not only display the rear of the vehicle 100 but can also display the state of an occupant in the rear seat, and thus can be used to display the life log information, for example, by disposing the sensor to be superimposed on the back surface side of the digital rear mirror 104.

The steering wheel display 105 is arranged near the center of a steering wheel 113 of the vehicle 100. The steering wheel display 105 can be used to display, for example, at least one of the safety-related information, the operation-related information, the life log, the health-related information, the authentication/identification-related information, or the entertainment-related information. In particular, since the steering wheel display 105 is close to the driver's hand, the steering wheel display 105 is suitable for displaying the life log information such as the body temperature of the driver, or for displaying information regarding an operation of the AV device, air conditioning equipment, or the like.

The rear entertainment display 106 is attached to the back side of the driver seat 108 and the passenger seat 109, and is for the occupant in the rear seat to view. The rear entertainment display 106 can be used to display, for example, at least one of the safety-related information, the operation-related information, the life log, the health-related information, the authentication/identification-related information, or the entertainment-related information. In particular, since the rear entertainment display 106 is in front of the occupant in the rear seat, information related to the occupant in the rear seat is displayed. For example, information regarding an operation of the AV device or the air conditioning equipment may be displayed, or a result of measurement of the body temperature or the like of an occupant in the rear seat with a temperature sensor may be displayed.

As described above, arranging the sensor on the back surface side of the image display device 1 makes it possible to measure the distance to an object existing in the surroundings. Optical distance measurement methods are roughly classified into a passive type and an active type. In the passive type method, a distance is measured by receiving light from an object without projecting light from a sensor to the object. Methods of the passive type include a lens focus method, a stereo method, and a monocular vision method. In the active type method, a distance is measured by projecting light onto an object and receiving reflected light from the object with a sensor. Methods of the active type include an optical radar method, an active stereo method, an illuminance difference stereo method, a moire topography method, and an interference method. The image display device 1 according to the present disclosure can be applied to any of these types of distance measurement. The passive or active distance measurement described above can be performed by using the sensor disposed to overlap the back surface side of the image display device 1 according to the present disclosure.

Second Application Example

The image display device 1 according to the present disclosure is applicable not only to various displays used in vehicles but also to displays mounted on various electronic devices 50.

Figure 63A:
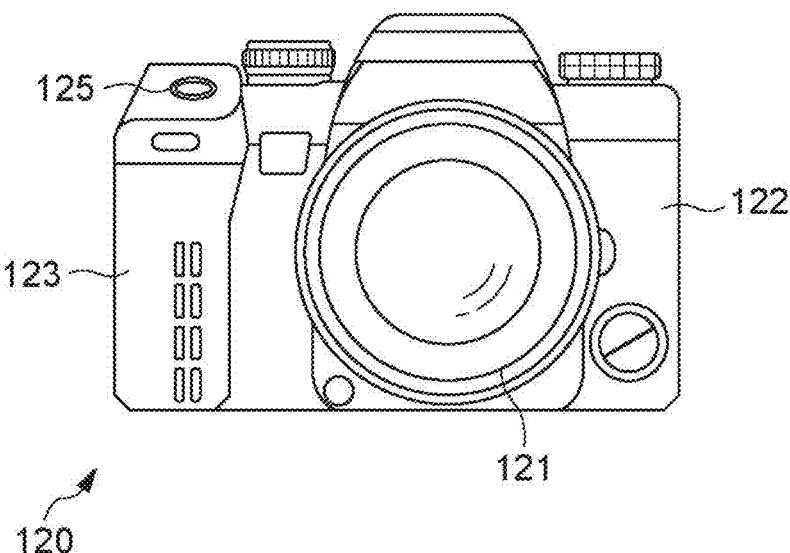
FIG. 63A is a front view of a digital camera as a second application example of an electronic device.
Figure 63B:
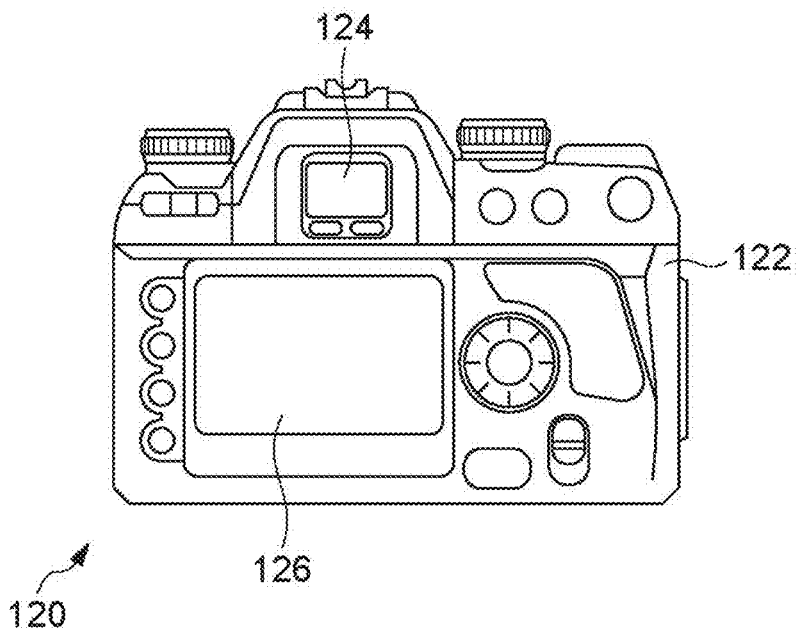
FIG. 63B is a rear view of the digital camera.

FIG. 63A is a front view of a digital camera 120 as a second application example of the electronic device 50, and FIG. 63B is a rear view of the digital camera 120. The digital camera 120 in FIGS. 63A and 63B is an example of a single-lens reflex camera in which a lens 121 is replaceable, but the electronic device 50 is also applicable to a camera in which the lens 121 is not replaceable.

In the camera in FIGS. 63A and 63B, when a person who captures an image looks into an electronic viewfinder 124 to determine a composition while holding a grip 123 of a camera body 122, and presses a shutter 125 while adjusting focus, captured image data is stored in a memory in the camera. As illustrated in FIG. 63B, on the back side of the camera, a monitor screen 126 that displays the captured image data and the like and a live image and the like, and the electronic viewfinder 124 are provided. Furthermore, there is a case where a sub screen that displays setting information such as a shutter speed and an exposure value is provided on the upper surface of the camera.

By arranging a sensor so as to overlap the back surface side of the monitor screen 126, the electronic viewfinder 124, the sub screen, and the like used for the camera, the camera can be used as the image display device 1 according to the present disclosure.

Third Application Example

The image display device 1 according to the present disclosure is also applicable to a head mounted display (hereinafter referred to as HMD). The HMD can be used for virtual reality (VR), augmented reality (AR), mixed reality (MR), substitutional reality (SR), or the like.

Figure 64A:
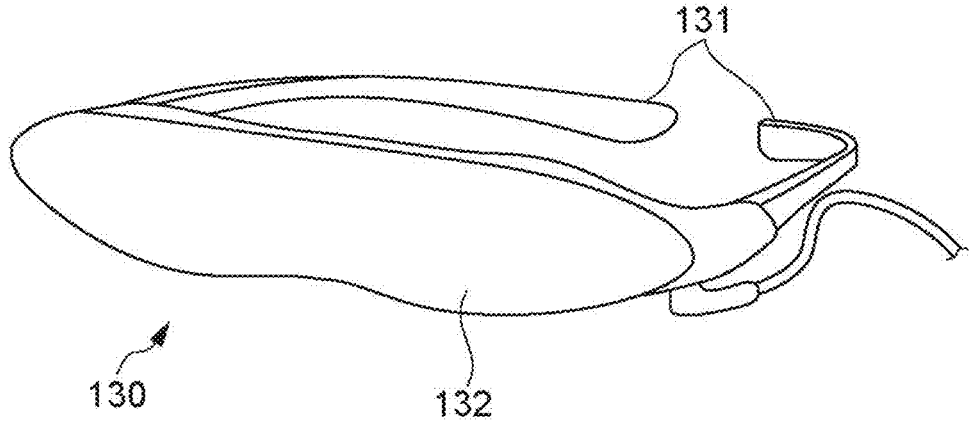
FIG. 64A is an external view of an HMD as a third application example of the electronic device.

FIG. 64A is an external view of an HMD 130 as a third application example of the electronic device 50. The HMD 130 of FIG. 64A includes a mounting member 131 for attachment to cover human eyes. The mounting member 131 is, for example, hooked and fixed to human ears. A display device 132 is provided inside the HMD 130, and a wearer of the HMD 130 can visually recognize a stereoscopic image and the like with the display device 132. The HMD 130 includes, for example, a wireless communication function and an acceleration sensor, and can switch a stereoscopic image and the like displayed on the display device 132 in accordance with a posture, a gesture, and the like of the wearer.

Furthermore, a camera may be provided in the HMD 130 to capture an image around the wearer, and an image obtained by combining the image captured by the camera and an image generated by a computer may be displayed on the display device 132. For example, by arranging the camera to overlap the back surface side of the display device 132 visually recognized by the wearer of the HMD 130, capturing an image of the surroundings of the eyes of the wearer with the camera, and displaying the captured image on another display provided on the outer surface of the HMD 130, a person around the wearer can recognize the expression of the face and the movement of the eyes of the wearer in real time.

Figure 64B:
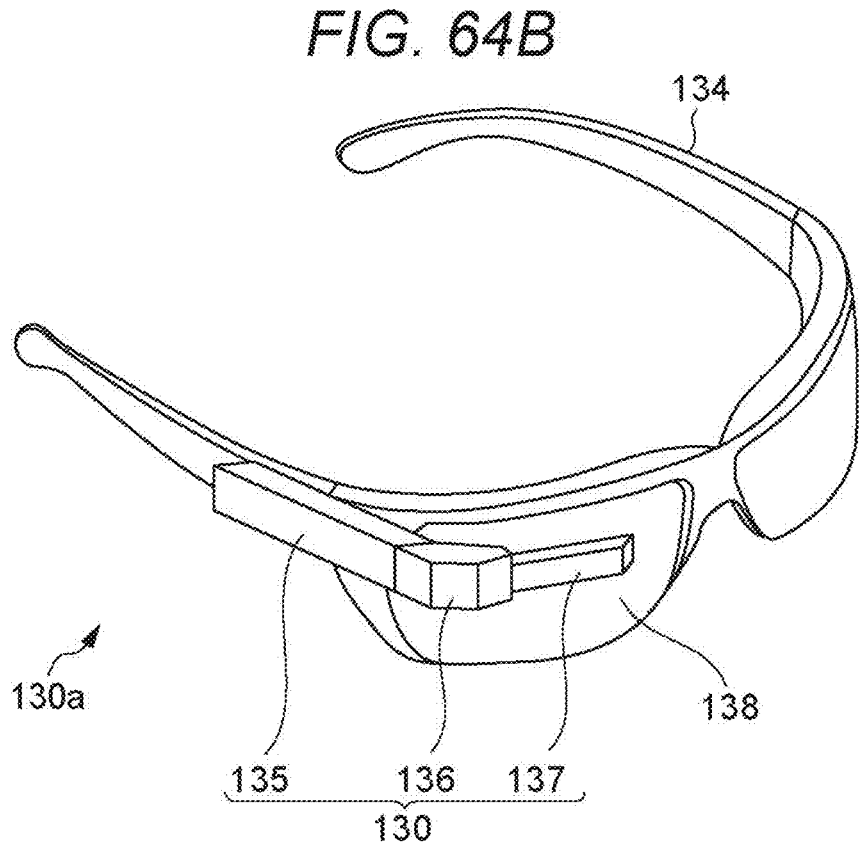
FIG. 64B is an external view of smart glasses.

Note that various types of the HMD 130 are conceivable. For example, as illustrated in FIG. 64B, the image display device 1 according to the present disclosure is also applicable to smart glasses 130a that displays various types of information on glasses 134. The smart glasses 130a of FIG. 64B includes a main body portion 135, an arm portion 136, and a lens barrel portion 137. The main body portion 135 is connected to the arm portion 136. The main body portion 135 is detachable from the glasses 134. The main body portion 135 incorporates a display unit and a control board for controlling the operation of the smart glasses 130a. The main body portion 135 and the lens barrel portion 137 are connected to each other via the arm portion 136. The lens barrel portion 137 emits image light emitted from the main body portion 135 through the arm portion 136, toward a lens 138 of the glasses 134. This image light enters the human eyes through the lens 138. The wearer of the smart glasses 130a of FIG. 64B can visually recognize not only a surrounding situation but also various pieces of information emitted from the lens barrel portion 137 similarly to normal glasses.

Fourth Application Example

The image display device 1 according to the present disclosure is also applicable to a television device (hereinafter referred to as TV). In recent TVs, a frame tends to be as small as possible from the viewpoint of downsizing and design properties. Therefore, in a case where a camera to capture an image of a viewer is provided on a TV, it is desirable to arrange the camera so as to overlap the back surface side of a display panel 2 of the TV.

Figure 65:
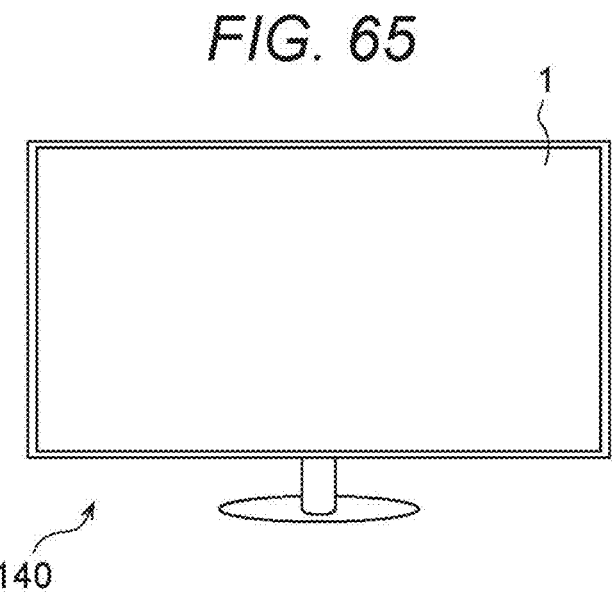
FIG. 65 is an external view of a TV as a fourth application example of the electronic device.

FIG. 65 is an external view of a TV 140 as a fourth application example of the electronic device 50. In the TV 140 of FIG. 65, the frame is minimized, and almost the entire region on the front side is a display area. The TV 140 may incorporate a sensor such as a camera to capture the image of the viewer.

Fifth Application Example

Figure 66:
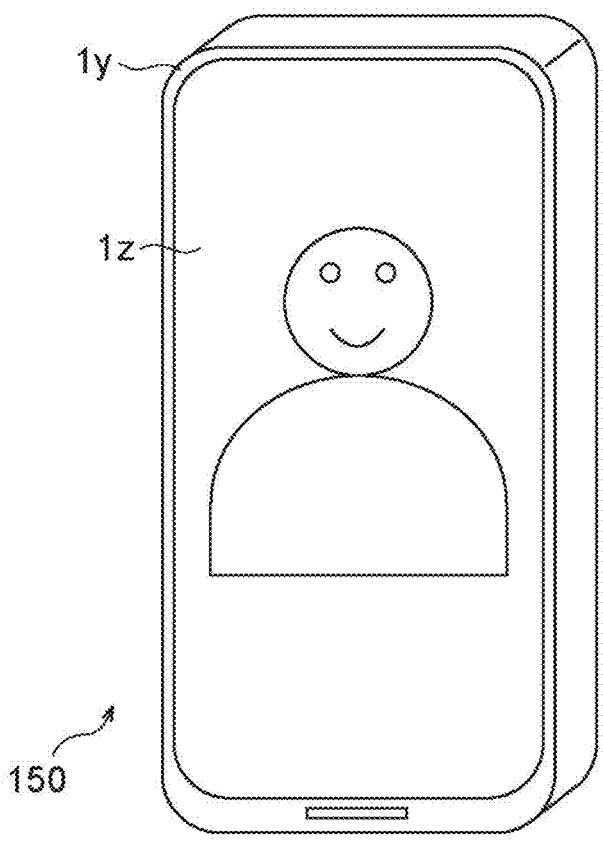
FIG. 66 is an external view of a smartphone as a fifth application example of the electronic device.

The image display device 1 according to the present disclosure is also applicable to a smartphone and a mobile phone. FIG. 66 is an external view of a smartphone 150 as a fifth application example of the electronic device 50. In an example in FIG. 66, a display surface 1z extends to nearly the outer shape of the electronic device 50, and the width of a bezel 1y around the display surface 1z is set to several millimeters or less. In general, a front camera is often mounted on the bezel 1y, but in FIG. 66, as indicated by a broken line, an image sensor module serving as the front camera is arranged on, for example, the back surface side of a substantially central portion of the display surface 1z. As described above, by providing the front camera on the back surface side of the display surface 1z in this manner, the front camera no longer need to be arranged on the bezel 1y, and thus the width of the bezel 1y can be narrowed.

Note that the present technology may have the following configurations.

(1) A display drive circuit including a ramp wave voltage generation circuit that generates a ramp wave voltage whose voltage level changes with time, and a signal line voltage generation circuit that holds a voltage level of the ramp wave voltage at a timing corresponding to a signal level of a pixel signal and generates a signal line voltage, in which the ramp wave voltage generation circuit includes:

an amplifier that outputs the ramp wave voltage;

a load circuit arranged on a feedback path of the amplifier; and a current generation circuit that controls a current flowing through the load circuit according to the ramp wave voltage and a reference voltage.

(2) The display drive circuit according to (1) further including a comparator that compares the ramp wave voltage with the reference voltage, and a holding unit that holds a comparison result signal of the comparator, in which the current generation circuit controls a current flowing through the load circuit on the basis of the comparison result signal.

(3) The display drive circuit according to (2) further including a first switch that switches whether or not to input the ramp wave voltage to the comparator, in which:

the ramp wave voltage generation circuit repeatedly generates the ramp wave voltage every first period;

the first switch inputs the ramp wave voltage to the comparator only during a second period in the first period for every first period; and the holding unit holds a comparison result signal of the comparator until the next second period is reached.

(4) The display drive circuit according to (2) or (3) further including a pulse generation circuit that generates a comparison pulse signal on the basis of a comparison result signal of the comparator, and a phase comparator that compares phases of the comparison pulse signal and a reference pulse signal to generate a phase comparison signal, in which the holding unit holds the phase comparison signal, and the current generation circuit controls a current flowing through the load circuit on the basis of the phase comparison signal.

(5) The display drive circuit according to (2) or (3) further including a pulse generation circuit that generates a comparison pulse signal on the basis of a comparison result signal of the comparator, and a counter that counts a pulse width of the comparison pulse signal with a reference clock of a predetermined frequency, in which the holding unit holds a count value of the counter, and the current generation circuit controls a current flowing through the load circuit according to the number of the reference clocks held in the holding unit.

(6) The display drive circuit according to (2) or (3) further including a successive approximation AD converter that converts a comparison result signal of the comparator into a digital signal, and a DA converter that converts the digital signal into an analog signal for current control of the current generation circuit.

(7) The display drive circuit according to any one of (2) to (6), in which the current generation circuit includes a charge pump that performs stepwise switching control of a current flowing through the load circuit on the basis of a comparison result signal of the comparator.

(8) The display drive circuit according to any one of (1) to (7), in which the ramp wave voltage generation circuit repeatedly generates the ramp wave voltage every first period, and a current from the current generation circuit is supplied to the load circuit only in a part of the first period in every first period.

(9) The display drive circuit according to (8) further including a second switch that is arranged between an output node of the current generation circuit and the feedback path and switches whether or not a current from the current generation circuit flows to the load circuit.

(10) The display drive circuit according to any one of (1) to (9), in which the amplifier includes a differential amplifier including a first input node to which the reference voltage is input, a second input node to which a feedback voltage is input via the load circuit, and an output node that outputs the ramp wave voltage at a voltage level according to a voltage difference between the reference voltage and the feedback voltage, and the load circuit is connected between the second input node and the output node.

(11) The display drive circuit according to (10) further including a third switch that is connected in parallel to the load circuit and switches whether to electrically short or shut off the second input node and the output node.

(12) The display drive circuit according to any one of (1) to 11, in which the ramp wave voltage generation circuit generates, for every first period, the ramp wave voltage whose voltage level decreases with time, the ramp wave voltage whose voltage level increases with time, the ramp wave voltage whose voltage level increases with time and then decreases, or the ramp wave voltage whose voltage level decreases with time and then increases.

(13) The display drive circuit according to any one of (1) to (12), in which the current generation circuit includes a variable current source that controls a current flowing through the load circuit on the basis of a control signal.

(14) The display drive circuit according to any one of (1) to (13), in which the load circuit includes at least one of a resistive element, a capacitor, and a diode.

(15) The display drive circuit according to any one of (1) to (14), in which the ramp wave voltage generation circuit generates the ramp wave voltage whose voltage level changes linearly or non-linearly with time.

(16) The display drive circuit according to any one of (1) to (15), in which the ramp wave voltage generation circuit generates the ramp wave voltage for every one horizontal line period or for every plurality of consecutive horizontal line periods of a display unit.

(17) The display drive circuit according to (16), in which the ramp wave voltage generation circuit generates the ramp wave voltage after performing offset correction of the amplifier.

(18) A display device including a display unit having a plurality of pixels arranged in a first direction and a second direction, and a plurality of signal lines arranged at predetermined intervals in the first direction and configured to supply a signal line voltage to two or more pixels arranged in the second direction, and a signal line drive circuit that drives the plurality of signal lines, in which:

the signal line drive circuit includes a ramp wave voltage generation circuit that generates a ramp wave voltage whose voltage level changes with time, and a signal line voltage generation circuit that holds a voltage level of the ramp wave voltage at a timing corresponding to a signal level of a pixel signal and generates a signal line voltage; and the ramp wave voltage generation circuit includes an amplifier that outputs the ramp wave voltage, a load circuit arranged on a feedback path of the amplifier, and a current generation circuit that controls a current flowing through the load circuit such that the ramp wave voltage matches a reference voltage.

(19) The display device according to (18), in which the ramp wave voltage generation circuit and the signal line voltage generation circuit are provided in units of two or more signal lines arranged in the first direction.

(20) The display device according to (18) or (19), in which the display unit includes a liquid crystal display unit or organic electro luminescence (EL).

Aspects of the present disclosure are not limited to the above-described individual embodiments, but include various modifications that can be conceived by those skilled in the art, and the effects of the present disclosure are not limited to the above-described contents. That is, various additions, modifications, and partial deletions are possible without departing from the conceptual idea and spirit of the present disclosure derived from the matters defined in the claims and equivalents thereof.

REFERENCE SIGNS LIST

1 Display device
2 Input/output interface unit
3 Gamma generation circuit
4 Power supply circuit
5 High-speed interface unit
6 Control circuit
7 Vertical logic circuit
8 Vertical analog circuit
9 Horizontal logic circuit
10 Horizontal analog circuit
11 Pixel array unit
13 Shift register
14 First latch
15 Second latch
16 Digital comparator
17 Synchronization counter
18 PWM generation circuit
19 Level shifter
20 Display drive circuit
21 Ramp drive circuit
21a First ramp drive circuit
21b Second ramp drive circuit
22 Signal line voltage generation circuit
23 PWM switch
23a Switch
23b Switch
24 Voltage comparator
25 Comparison result holding unit
26 Variable current source
27 Precharge switch
28 Sample (SMPL) switch
29 Wiring resistance
30 Pixel
30b Subpixel
30g Subpixel
30r Subpixel
31 Output buffer
31a First output buffer
31b Second output buffer
32 Current generation circuit
33 Current control circuit
34 SMPL switch
35 Variable current source
35a First variable current source
35b Second variable current source
36 Comparator
36a Differential amplifier
36b Resistive element
37 Holding unit
37a Capacitor
38 Bias circuit
41 Amplifier
42 Load circuit
42a Capacitor
42b Resistive element
42c Variable resistor
42d Diode
43 RAMPEN switch 43a First RAMPEN switch
43b Second RAMPEN switch
44 PRCG switch
51 Digital comparator
52 SR latch
53 Phase comparator
54a First current source
54b Second current source
55 Converter (DAC below)
56 Pulse counter
56 Counter
57 Arithmetic circuit
58 SARADC
59 Voltage follower circuit
61 Charge pump
62 Capacitor
63 DAC control counter
64 Current source
65 Switch
66 Current generation circuit
67 Current control circuit
68 Resistive element
69 Setting holding register
71 Display unit

The invention claimed is:
1. A display drive circuit, comprising:
a ramp wave voltage generation circuit configured to generate a ramp wave voltage whose voltage level changes with time; and
a signal line voltage generation circuit configured to: hold a voltage level of the ramp wave voltage at a time that corresponds to a signal level of a pixel signal; and generate a signal line voltage, wherein
the ramp wave voltage generation circuit includes
an amplifier configured to output the ramp wave voltage,
a load circuit on a feedback path of the amplifier, and
a current generation circuit configured to control a current flowing through the load circuit based on the ramp wave voltage and a reference voltage.
2. The display drive circuit according to claim 1, further comprising:
a comparator configured to compare the ramp wave voltage with the reference voltage; and
a holding unit configured to hold a comparison result signal of the comparator, wherein
the current generation circuit is further configured to control the current flowing through the load circuit based on the comparison result signal.
3. The display drive circuit according to claim 2, further comprising a first switch that switches whether or not to input the ramp wave voltage to the comparator, wherein
the ramp wave voltage generation circuit is further configured to repeatedly generate the ramp wave voltage every first period,
the first switch is further configured to input the ramp wave voltage to the comparator only during a second period in the first period of every first period, and
the holding unit is further configured to hold the comparison result signal of the comparator until the next second period is reached.
4. The display drive circuit according to claim 2, further comprising:
a pulse generation circuit configured to generate a comparison pulse signal based on the comparison result signal of the comparator; and a phase comparator configured to: compare phases of the comparison pulse signal and a reference pulse signal; and generate a phase comparison signal based on the compared phases, wherein the holding unit is further configured to hold the phase comparison signal, and the current generation circuit is further configured to control the current flowing through the load circuit based on the phase comparison signal.

5. The display drive circuit according to claim 2, further comprising:

a pulse generation circuit configured to generate a comparison pulse signal based on the comparison result signal of the comparator; and a counter configured to count a pulse width of the comparison pulse signal with a reference clock of a specific frequency, wherein the holding unit is further configured to hold a count value of the counter, and the current generation circuit is further configured to control the current flowing through the load circuit based on a number of a plurality of reference clocks in the holding unit.

6. The display drive circuit according to claim 2, further comprising:

a successive approximation AD converter configured to convert the comparison result signal of the comparator into a digital signal; and a DA converter configured to convert the digital signal into an analog signal for current control of the current generation circuit.

7. The display drive circuit according to claim 2, wherein the current generation circuit includes a charge pump that is configured to perform stepwise switching control of the current flowing through the load circuit based on the comparison result signal of the comparator.

8. The display drive circuit according to claim 1, wherein the ramp wave voltage generation circuit is further configured to repeatedly generate the ramp wave voltage every first period, and a current from the current generation circuit is supplied to the load circuit only in a part of the first period in every first period.

9. The display drive circuit according to claim 8 further comprising a second switch that is between an output node of the current generation circuit and the feedback path, wherein the second switch is configured to switch whether or not the current from the current generation circuit flows to the load circuit.

10. The display drive circuit according to claim 1, wherein the amplifier includes a differential amplifier that includes a first input node to which the reference voltage is input, a second input node to which a feedback voltage is input via the load circuit, and an output node configured to output the ramp wave voltage at the voltage level based on a voltage difference between the reference voltage and the feedback voltage, and the load circuit is connected between the second input node and the output node.

11. The display drive circuit according to claim 10, further comprising a third switch that is connected in parallel to the load circuit, wherein the third switch whether to electrically short or shut off the second input node and the output node.

12. The display drive circuit according to claim 1, wherein the ramp wave voltage generation circuit is further configured to generate, for every first period, at least one of the ramp wave voltage whose voltage level decreases with time, the ramp wave voltage whose voltage level increases with time, the ramp wave voltage whose voltage level increases with time and then decreases, or the ramp wave voltage whose voltage level decreases with time and then increases.

13. The display drive circuit according to claim 1, wherein the current generation circuit includes a variable current source that is configured to control the current flowing through the load circuit based on a control signal.

14. The display drive circuit according to claim 1, wherein the load circuit includes at least one of a resistive element, a capacitor, or a diode.

15. The display drive circuit according to claim 1, wherein the ramp wave voltage generation circuit is further configured to generate the ramp wave voltage, and a change in the voltage level of the ramp wave voltage is at least one of linear with time or non-linear with time.

16. The display drive circuit according to claim 1, wherein the ramp wave voltage generation circuit is further configured to generate the ramp wave voltage for at least one of everyone horizontal line period or every plurality of consecutive horizontal line periods of a display unit.

17. The display drive circuit according to claim 16, wherein the ramp wave voltage generation circuit is further configured to generate the ramp wave voltage after a performance of an offset correction of the amplifier.

18. A display device, comprising:

a display unit that includes a plurality of pixels in each of a first direction and a second direction, and a plurality of signal lines arranged at specific intervals in the first direction, wherein the plurality of signal lines is configured to supply a signal line voltage to at least two pixels in the second direction; and a signal line drive circuit configured to drive the plurality of signal lines, wherein the signal line drive circuit includes a ramp wave voltage generation circuit configured to generate a ramp wave voltage whose voltage level changes with time, and a signal line voltage generation circuit configured to hold a voltage level of the ramp wave voltage at a time that corresponds to a signal level of a pixel signal; and generate the signal line voltage, and the ramp wave voltage generation circuit includes an amplifier configured to output the ramp wave voltage, a load circuit on a feedback path of the amplifier, and a current generation circuit configured to control a current flowing through the load circuit according to the ramp wave voltage and a reference voltage.

19. The display device according to claim 18, wherein the ramp wave voltage generation circuit and the signal line voltage generation circuit are in units of at least two signal lines that are arranged in the first direction.

20. The display device according to claim 18, wherein the display unit includes at least one of a liquid crystal display unit or organic electro luminescence (EL).

* * * * *